(12) United States Patent
Funk et al.

(10) Patent No.: US 7,894,927 B2
(45) Date of Patent: Feb. 22, 2011

(54) USING MULTI-LAYER/MULTI-INPUT/MULTI-OUTPUT (MLMIMO) MODELS FOR METAL-GATE STRUCTURES

(75) Inventors: Merritt Funk, Austin, TX (US); Radha Sundararajan, Dripping Springs, TX (US); Asao Yamashita, Fishkill, NY (US); Daniel Prager, Hopewell Junction, NY (US); Hyung Joo Lee, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 406 days.

(21) Appl. No.: 12/186,619

(22) Filed: Aug. 6, 2008

(65) Prior Publication Data

US 2010/0036518 A1    Feb. 11, 2010

(51) Int. Cl.
*G06F 19/00* (2006.01)
*G06F 17/50* (2006.01)
*G06F 7/60* (2006.01)
*G06F 1/00* (2006.01)

(52) U.S. Cl. .................. 700/121; 716/19; 716/20; 703/2; 430/5

(58) Field of Classification Search ............... 700/110, 700/121; 703/2; 716/10, 19, 20; 430/5; 438/157
See application file for complete search history.

(56) References Cited

U.S. PATENT DOCUMENTS

| | | | |
|---|---|---|---|
| 6,928,636 B2 * | 8/2005 | Ohnuma | 716/21 |
| 7,005,330 B2 | 2/2006 | Yeo et al. | |
| 2003/0149955 A1 * | 8/2003 | Ohnuma | 716/19 |
| 2006/0037701 A1 | 2/2006 | Koshiishi et al. | |
| 2006/0085772 A1 * | 4/2006 | Zhang | 716/4 |
| 2007/0249103 A1 * | 10/2007 | Dao | 438/142 |
| 2008/0183312 A1 * | 7/2008 | Funk et al. | 700/45 |
| 2008/0295059 A1 * | 11/2008 | Choi | 716/19 |
| 2009/0144691 A1 * | 6/2009 | Rathsack et al. | 716/19 |

OTHER PUBLICATIONS

Hyung Lee et al., "Advanced Profile Control and the Impact of Sidewall Angle at Gate Etch for Critical Nodes", Metrology, Inspection, and Process Control for Microlithography XXII, edited by John A. Allgair, Christopher J. Raymond, Proc. of SPIE vol. 6922, pp. 69220T1-13, (2008), USA.

Jean-Pierre Corriou, "Process Control: Theory and Applications"; (2004) Springer-Verlag, New York, NY, 10013, USA; ISBN(1-85233-776-1).

(Continued)

*Primary Examiner*—Albert Decady
*Assistant Examiner*—Sivalingam Sivanesan

(57) ABSTRACT

The invention provides a method of processing a wafer using multilayer processing sequences and Multi-Layer/Multi-Input/Multi-Output (MLMIMO) models and libraries that can include one or more measurement procedures, one or more Poly-Etch (P-E) sequences, and one or more metal-gate etch sequences. The MLMIMO process control uses dynamically interacting behavioral modeling between multiple layers and/or multiple process steps. The multiple layers and/or the multiple process steps can be associated with the creation of lines, trenches, vias, spacers, contacts, and gate structures that can be created using isotropic and/or anisotropic etch processes.

32 Claims, 24 Drawing Sheets

OTHER PUBLICATIONS

Skogestad, S. & Postlethwaite I., "Multivariable Feedback Control: Analysis and Design"; (2nd edition), (2005) Wiley, Chichester, UK. (ISBN 0-470-01168-8).
U.S. Appl. No. 12/059,624, filed Mar. 31, 2008 for Funk et al.
U.S. Appl. No. 11/762,258, filed Jun. 13, 2007 for Yamashita et al.
U.S. Appl. No. 11/762,563, filed Jun. 13, 2007 for Yamashita et al.
K. Bernstein, et al.;"High-Performance CMOS Variability in the 65-nm Regime and Beyond"; IBM Journal of R&D; Aug. 2006.
U.S. Appl. No. 11/859,596, filed Sep. 21, 2007 for Yamashita et al.
U.S. Appl. No. 11/859,507, filed Sep. 21, 2007 for Yamashita et al.

* cited by examiner

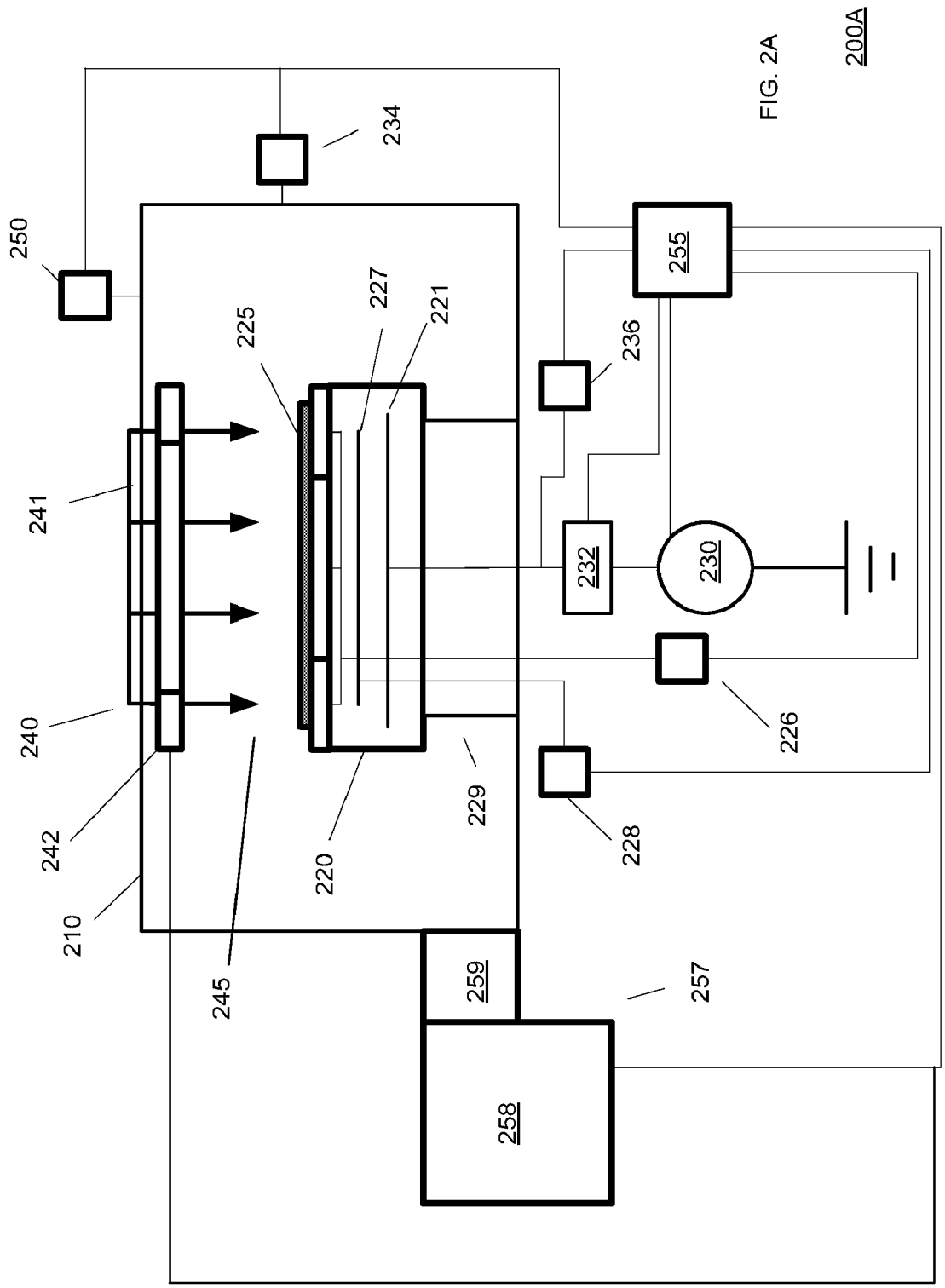

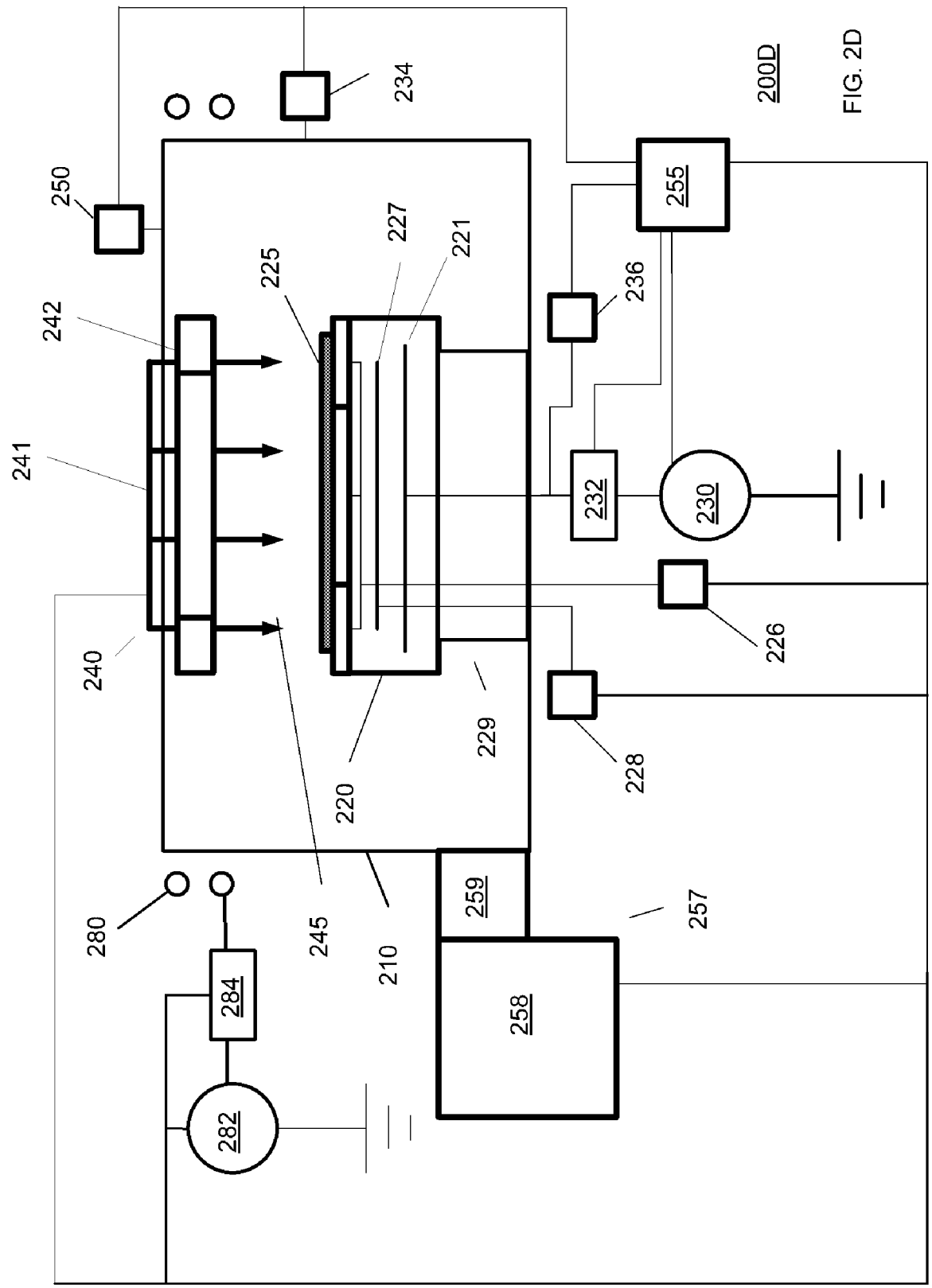

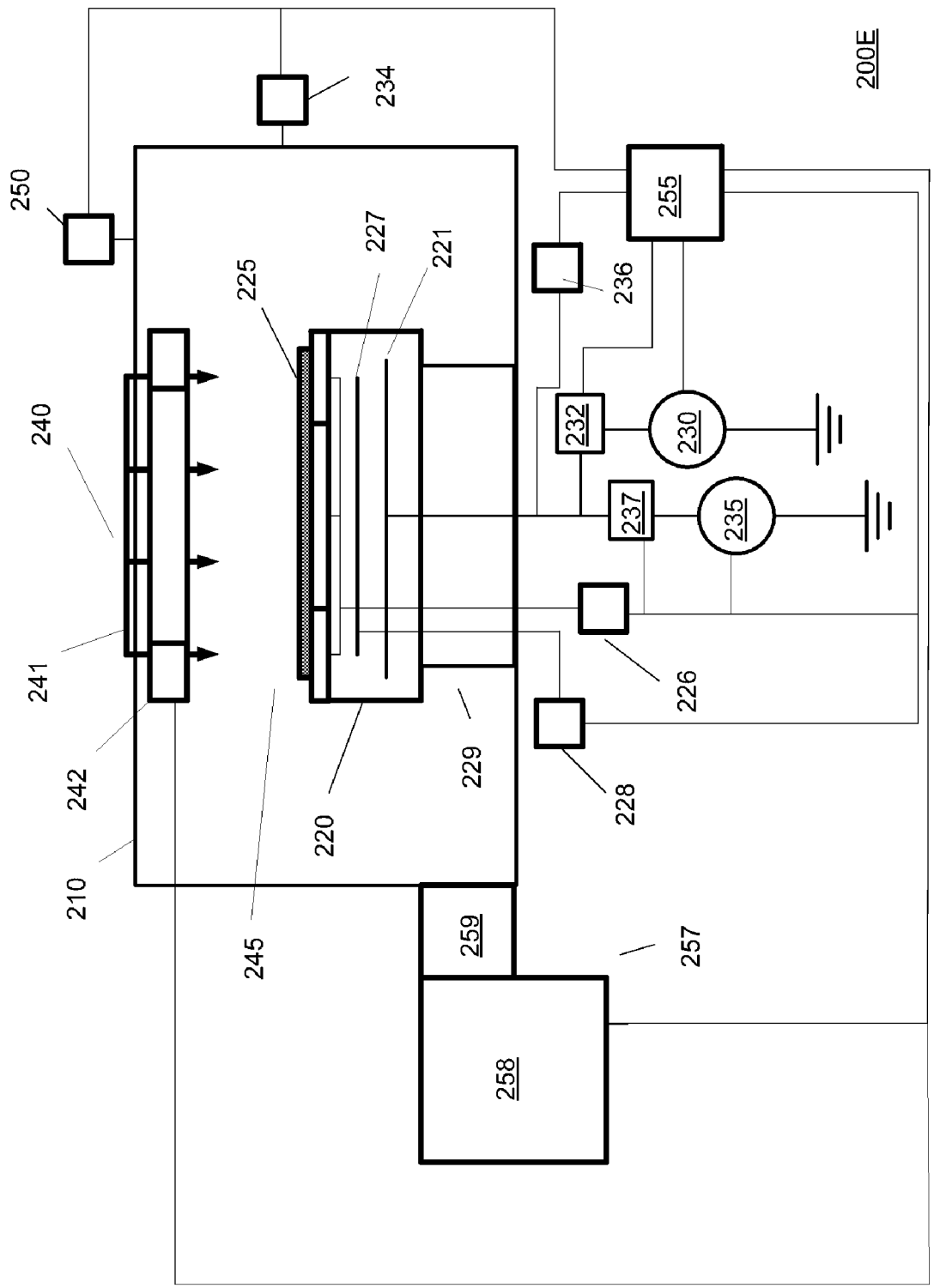

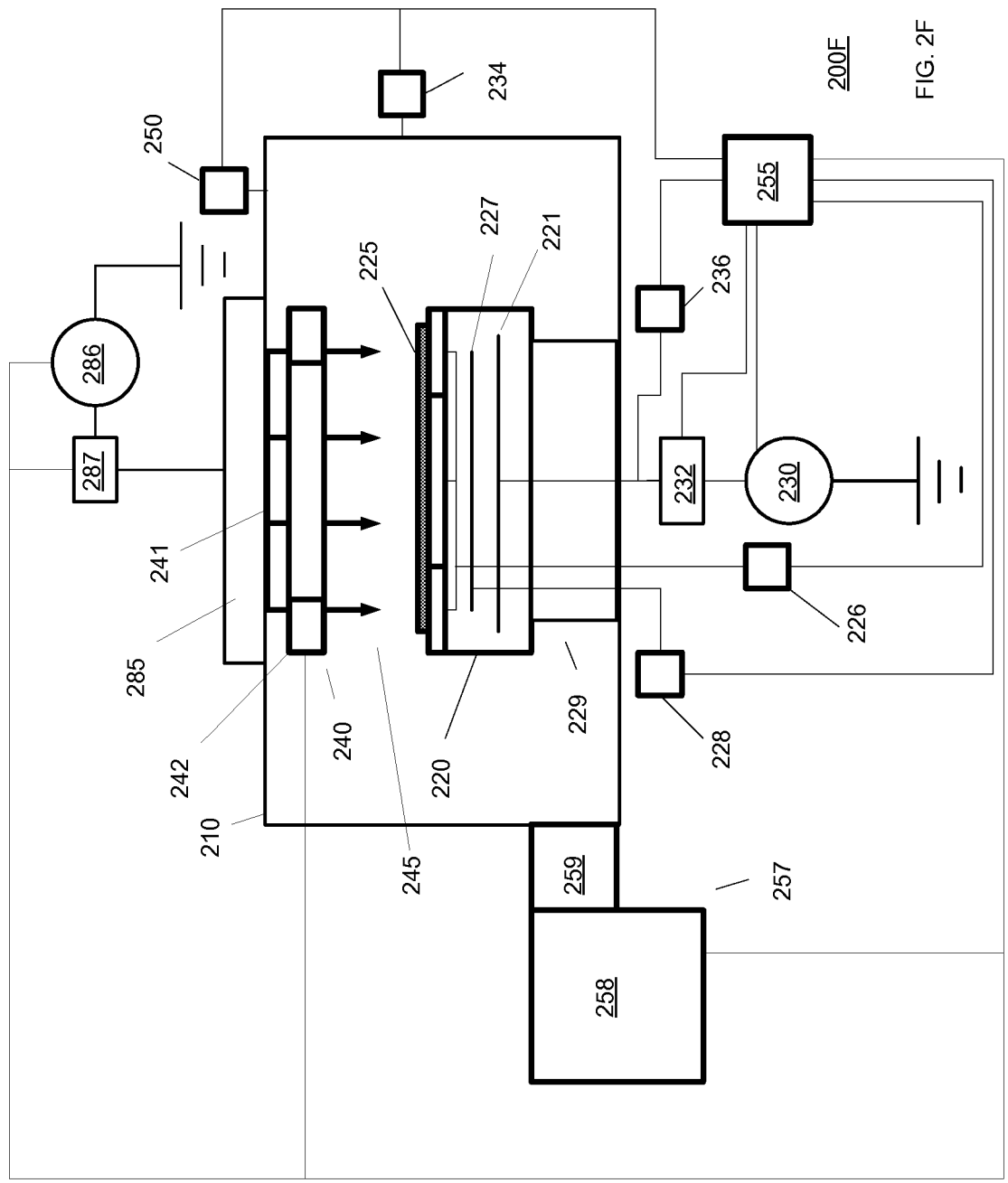

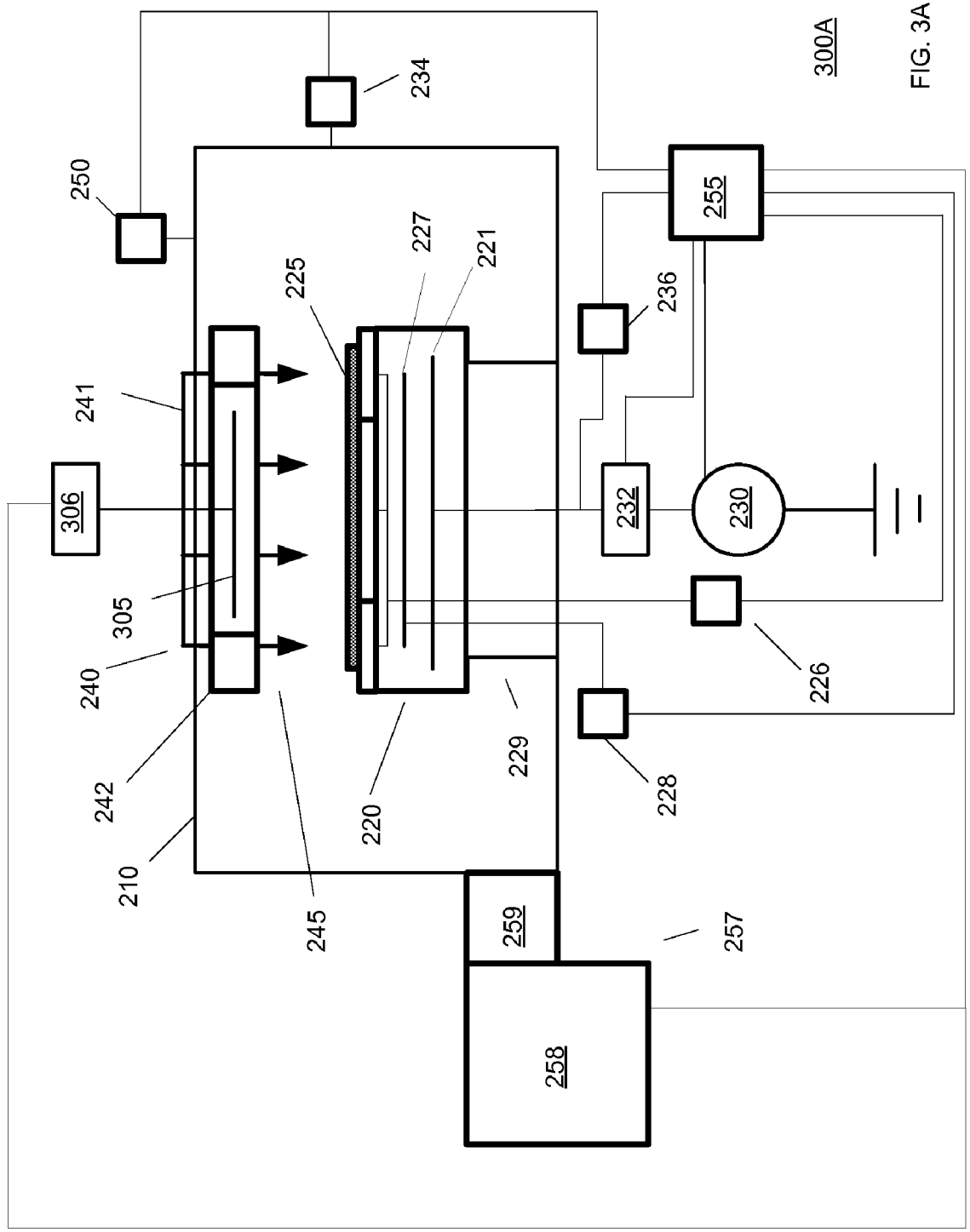

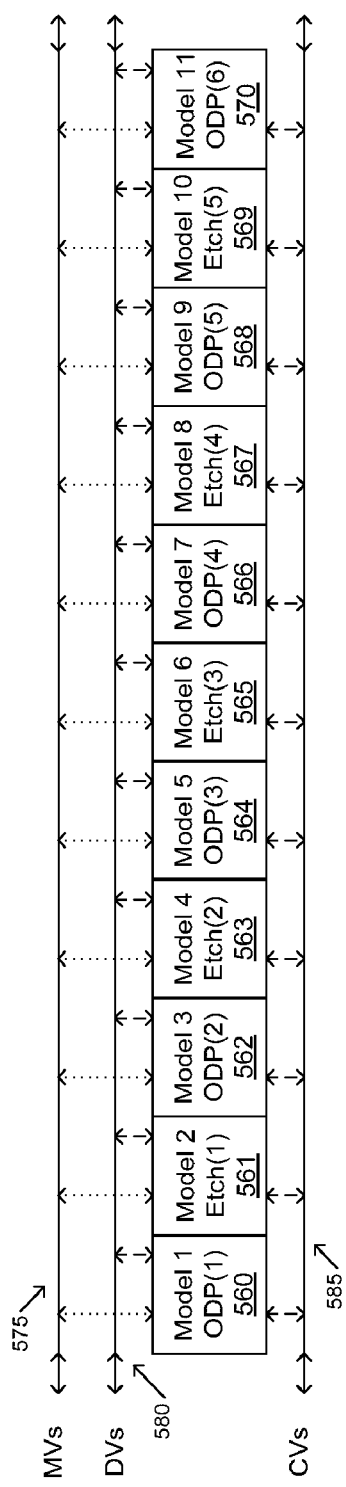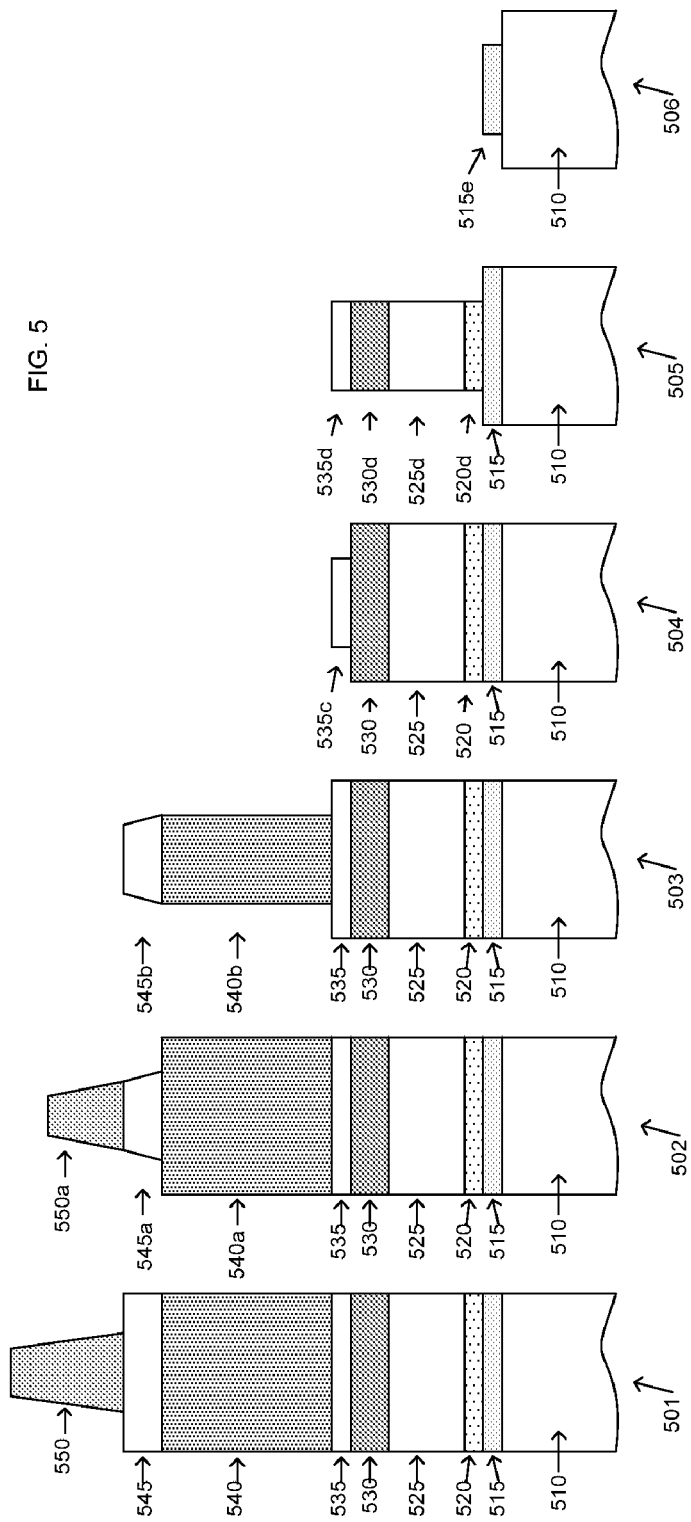
FIG. 5

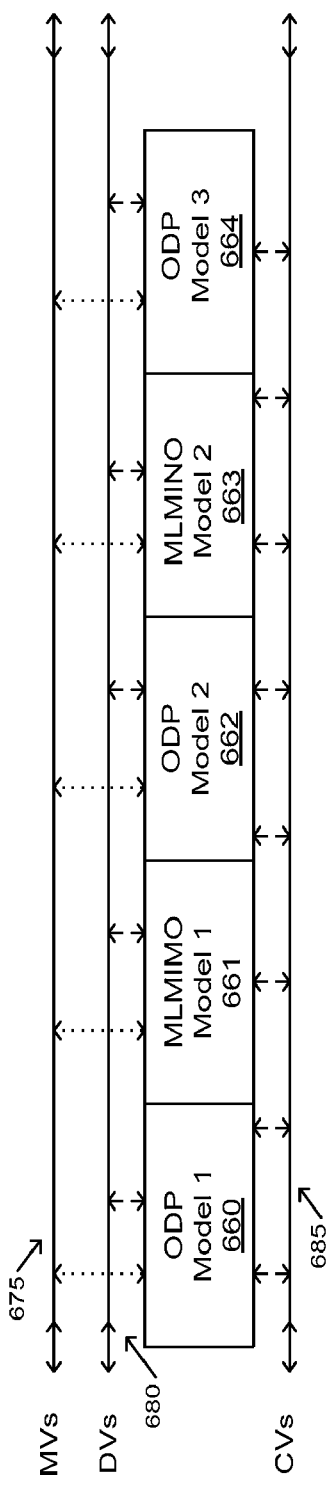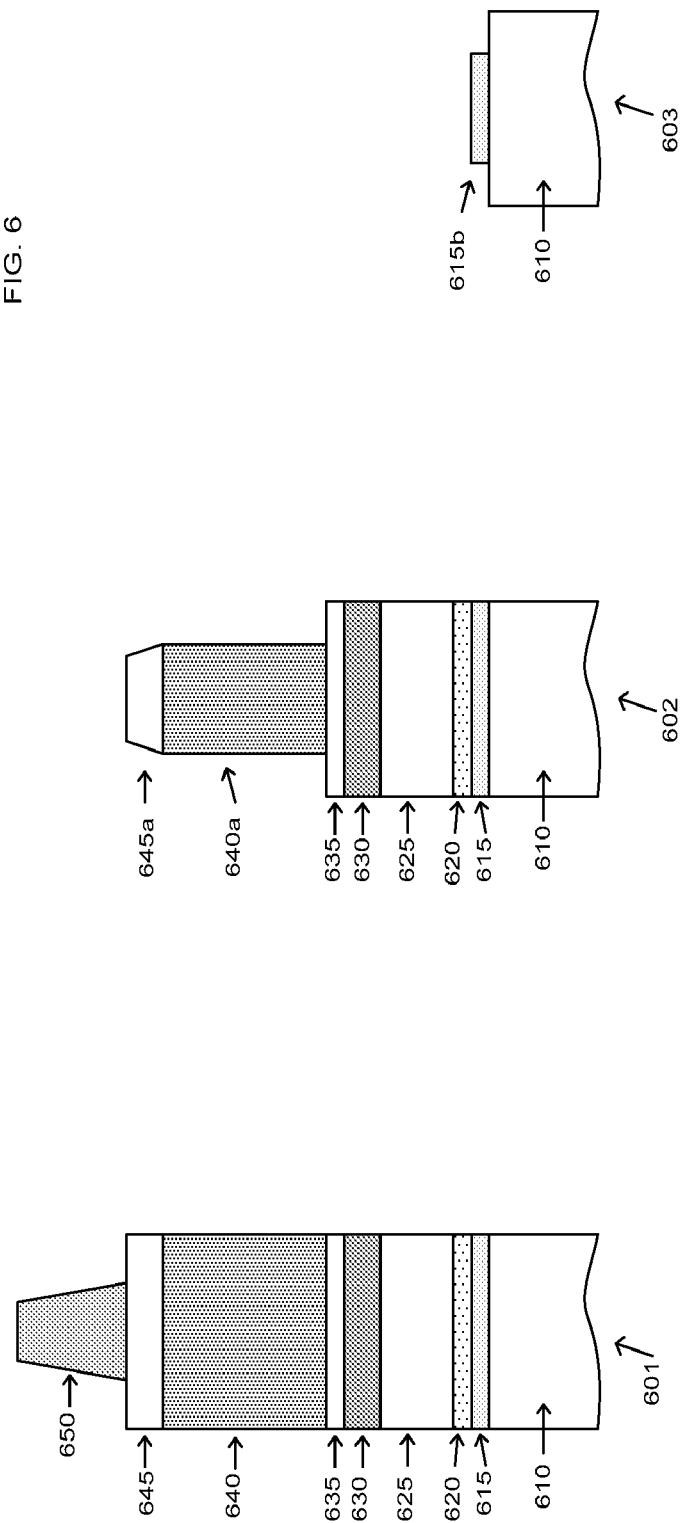
FIG. 6

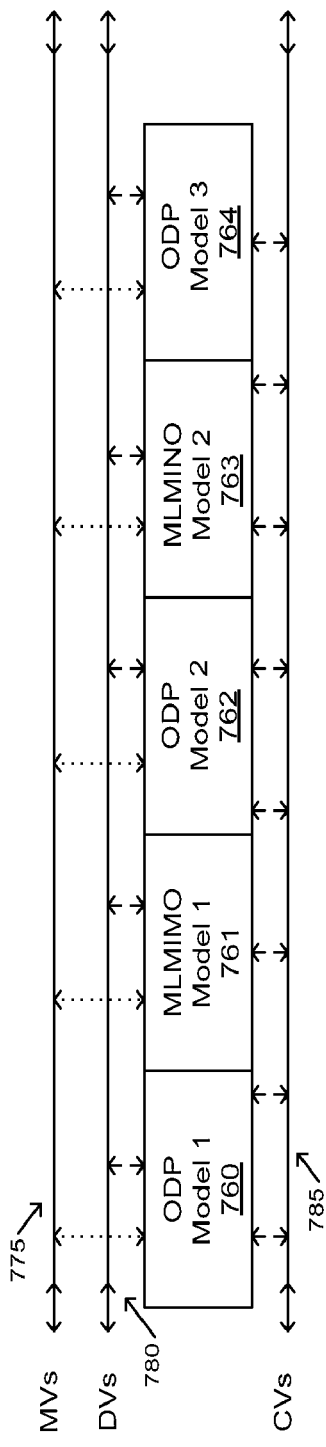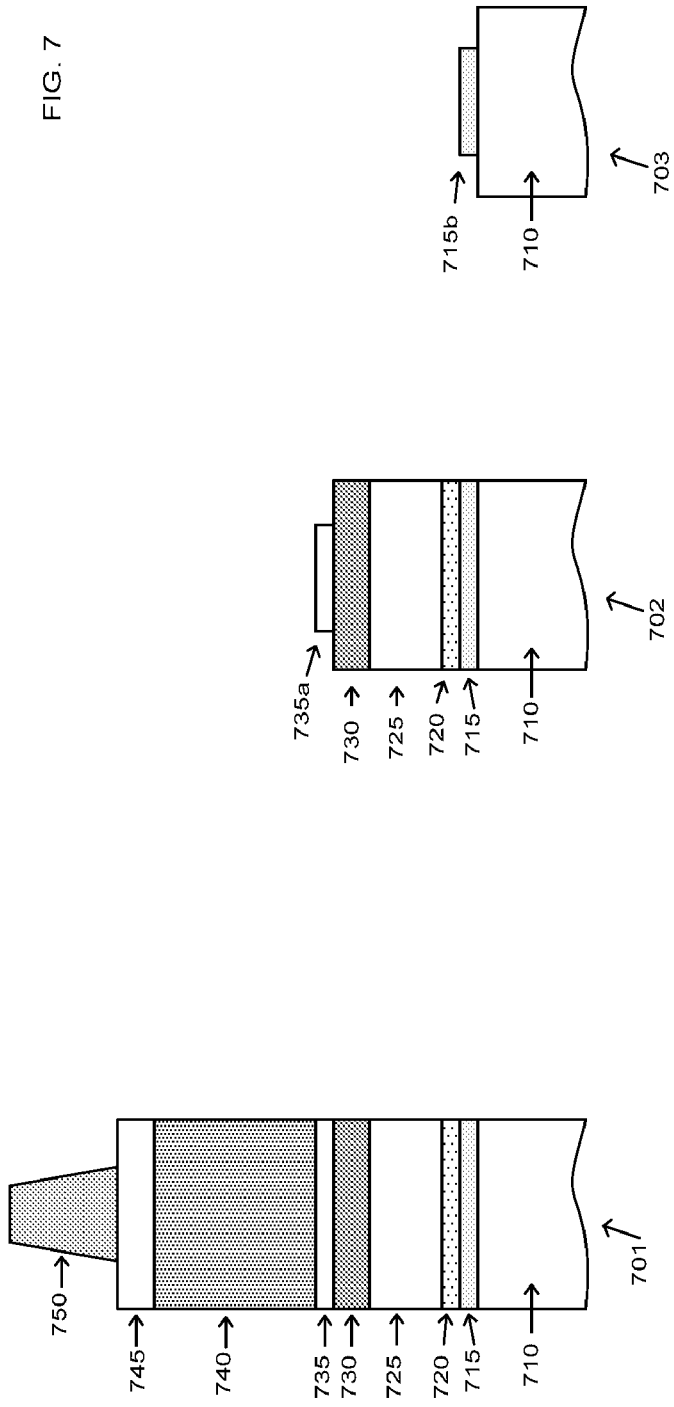
FIG. 7

1100

USING MULTI-LAYER/MULTI-INPUT/MULTI-OUTPUT (MLMIMO) MODELS FOR METAL-GATE STRUCTURES

BACKGROUND OF THE INVENTION

1. Field of the Invention

The present invention relates to wafer processing, and more particularly to apparatus and methods for creating metal-gate structures on a wafer in real-time using multi-layer-multi-step processing sequences and associated Multi-Layer/Multi-Input/Multi-Output (MLMIMO) models.

2. Description of the Related Art

Etch process behavior is inherently non-linear and interacting step-to-step (layers) or as process stacks are compiled (etch/cvd/implant). With the knowledge of the process interactions based on physical modeling of Tokyo Electron Limited (TEL) chambers and base processes and imperial data and measurements from process refinement and tuning the control of Critical Dimension (CD), Sidewall Angle (SWA), depths, film thicknesses, over etching, undercuts, surface cleaning and damage control can be recursively calculated and optimized using multi-input multi-output non-linear models. Current low cost products use a bulk silicon technology. As the transistor continues to shrink, the impact of the channel depth is becoming critical (ultra-shallow source/drain extensions). As the SOI film shrinks, smaller variations in the gate and/or spacer thickness and thickness of the Silicon on Insulator (SOI) film can affect the transistor's performance. When etch procedures are not controlled, the removal of the material near the gate affects the electrical performance.

Current high performance microprocessors use PD SOI (partially depleted Silicon-on-insulator film—giving a threshold voltage 0.2 volts). PD SOI films are around 50 nm while the gate and/or spacer reduction amount can be a large percentage (10%) of the total gate and/or spacer thickness. Future generations of SOI films are called FD SOI (fully depleted giving a threshold voltage 0.08 volts and a thickness of ~25 nm). Currently theses films are not in production due to limitations in thickness control uniformity and defects. Channel mobility degrades with decreasing SOI thickness. With thinner films, the control of the metal-gate structures becomes more critical.

SUMMARY OF THE INVENTION

The invention can provide apparatus and methods of creating metal-gate structures on a wafer in real-time using multi-layer-multi-step processing sequences and associated Multi-Layer/Multi-Input/Multi-Output (MLMIMO) models.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2G shows exemplary block diagrams of etching subsystems in accordance with embodiments of the invention;

FIGS. 3A-3G shows exemplary block diagrams of additional etching subsystems in accordance with embodiments of the invention;

FIG. 5 illustrates an exemplary view of a multi-step processing sequence for a creating a metal gate structure in accordance with embodiments of the invention;

FIG. 6 illustrates an exemplary view of a second multi-step modeling sequence for a creating a metal gate structure in accordance with embodiments of the invention;

FIG. 7 illustrates an exemplary view of a third multi-step modeling sequence for a creating a metal gate structure in accordance with embodiments of the invention;

DETAILED DESCRIPTION

Figure 1:
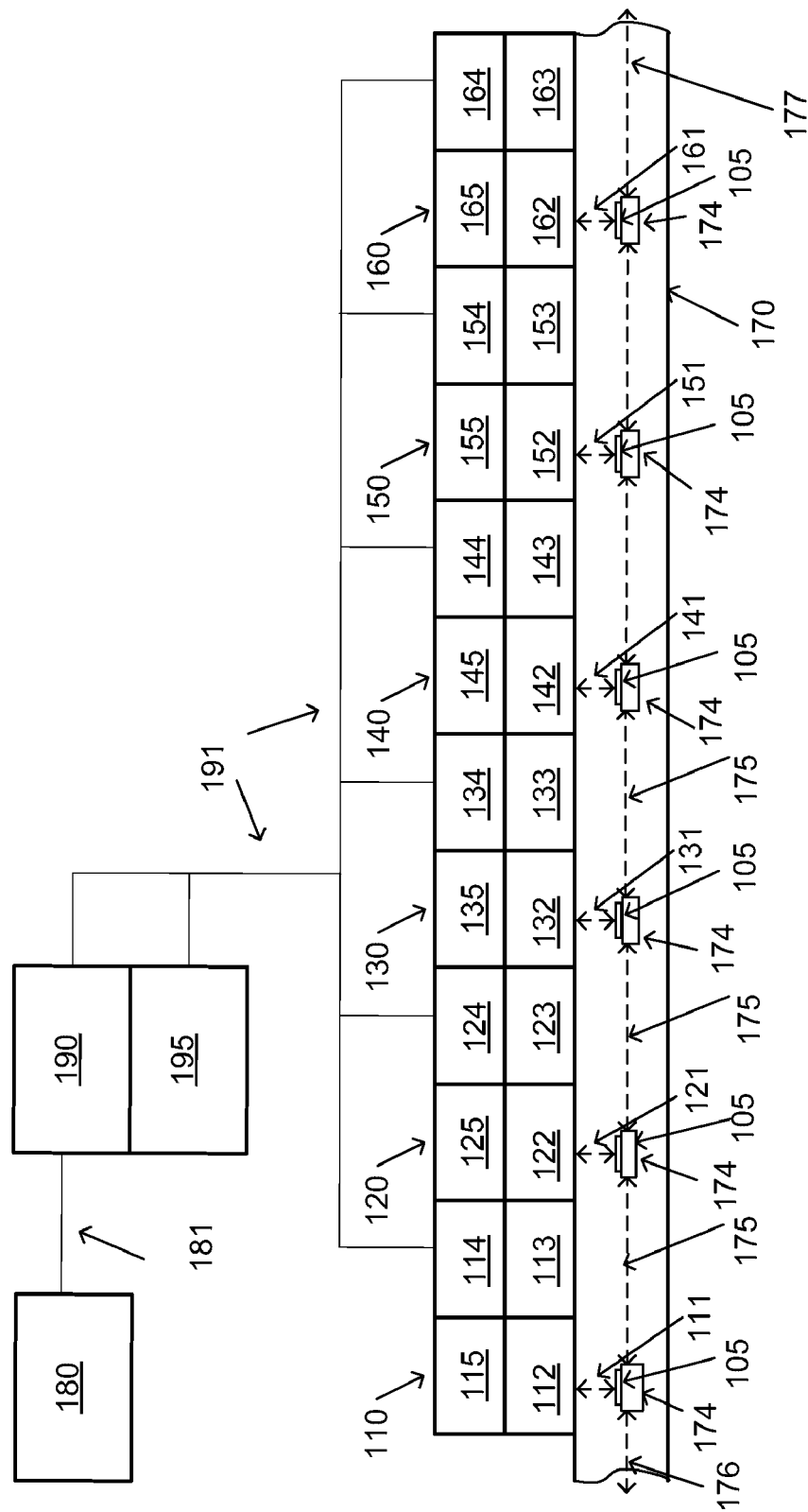
FIG. 1 shows an exemplary block diagram of a processing system in accordance with embodiments of the invention.

The Multi-Layer/Multi-Input/Multi-Output (MLMIMO) model can be subdivided into layers of a finite granularity based on the application need. Each layer can be a physical material, with layer separation denoted by material changes or dimensional layer boundaries. Layers can be combination of layers of layers, such as metal gate stack layers and subsequent spacer deposition and etching of the spacer layer covering the metal gate layers. Layers can be mapped to etch steps with time or EPD being used to separate the steps. Additionally a continuous real-time controller can run with real-time updates from a combination of metrology data, sensors, and etch models.

DOEs can be run to model the process gain of each potential control knob and the interactions of the inputs and outputs associated with each layer, and the interactions and gains of process control loops layer to layer. A method of determining interaction between each control knob and output can be used to evaluate and optimize the model stability such as Relative Gain Array. This information can also drive setup of individual feedback loops that are non-interacting.

MLMIMO modeling is used to calculate the optimum inputs for a set of goals (or targeted outputs). Constraints can be ranges of process parameters such as time, gas flows, and temperature by layer. During MLMIMO model development, a set of weightings can be applied to guide the optimizer to prioritize the outputs with most value to the current process calculations at a given time. Target weightings can be used where an equation is applied to the weighting calculation given a target and gain constants that effectively penalize as the optimizer moves away from target in a linear or non-linear way. Targets can be a center target or and limit target (above a given value—for example with SWA).

Feedback can take the form of multiple loops, one for each targeted output with a calculation of the feedback error based on the actual less predicted error. When using a MLMIMO model, each predicted output error can be calculated and matched with the feedback measurements to determine the real error. Feedback filtering methods such as EWMA or Kalman filters can be used to filter noise. Outputs from a controller associated with a multi-step sequence can include a goodness of fit value, and this GOF value can then be used as the input to a cascaded controller.

MLMIMO controllers can contain updates a different times as the processing steps are performed allowing the controller to make new updates based on past calculations, errors of calculations, changes in tool state or material state then incorporated into the most recent update.

In some multi-step sequences, when the resist parameters are measured, they can be used for feed forward, and can be weighted based on previous wafers feedback and chamber state information. At the beginning of a Lot, the MLMIMO model can be configured to use the best-known values for the patterned soft mask layer, and these can be weighted to the center of the previous lot's distribution. During the lot processing, the parameters for the Etch Control Layer (ECL) or the hard mask layers can be measured and filtered using a weighting method such as EWMA to smooth W2W variations and fed back to and translated to a resist SWA and used to update the current feed forward SWA value. The SWA pattern analysis function can group bimodal patterns so two threads can be managed to feedback and/or feed forward data. In one example, the SWA W2W variation is more commonly driven by scanner stage so two feed forward/feedback threads can be maintained to optimize performance. In a second example, the W2W CD variation from the lithography tool can be dominated by the hot plates, so a 2, 3, or 4 variation pattern can be observed. When IM measurements are made after the lithography processes, the pattern across the wafer can be established before wafer processing and the wafer CD and SWA patterns can be established before the wafers are sent to the etcher. When more than one processing threads are used, the thread number can be added as a context item for the wafer. In addition, when the scanner and/or track cell number, scanner module number, and hot plate number are available, they can also be used to group wafers and establish feed forward threads from the Lithography tool to the Etch Tool. Alternatively, other combinations of coater/developers may also be used.

When the wafers are sorted based on context groups, then the wafers can be processed based on their group or sequence. When processing order in the etch tool is the same as the processing order in the lithography tool, the current FB controller can be programmed to adjust for W2W for incoming drift inside the lithography tool and for drift inside the etch tool The invention provides apparatus and methods for processing wafers having a large number of semiconductor devices thereon and an even larger number of transistor gate and/or spacer structures. In various embodiments, apparatus and methods are provided for creating and/or using an MLMIMO evaluation library, for performing MLMIMO processing sequences that can include one or more measurement procedures, one or more deposition procedures, one or more Partial-Etch (Partial etch) procedures, one or more Full-Etch (Poly Etch) procedures, and/or for verifying MLMIMO models and associated processing sequences.

One or more periodic structures can be provided at various locations on a wafer and can be used to evaluate and/or verify MLMIMO models and associated processing sequences. Wafers can have wafer data associated with them, and the wafer data can include real-time and historical data. In addition, the wafer can have other data associated with them, and the other data can include gate structure data, the number of required sites, the number of visited sites, confidence data and/or risk data for one or more of the sites, site ranking data, transferring sequence data, or process-related data, or evaluation/verification-related data, or any combination thereof. The data associated with MLMIMO-related wafers can include transfer sequence data that can be used to establish when and where to transfer the wafers, and transfer sequences can be change using operational state data.

The MLMIMO model can be subdivided into layers of a finite granularity based on the application need. Each layer can be a physical material, with layer separation denoted by material changes or dimensional layer boundaries. Layers can be combination of layers of layers, such as a metal gate stack of layers and a subsequent spacer deposition and etching of the layer covering the metal gate layers.

Layers can be mapped to etch steps with time or End Point Data (EPD) being used to separate the steps. Additionally a continuous real-time controller can run with real-time updates from a combination of metrology data, sensors, and etch models.

An analytical device used in process control multivariable applications, based on the comparison of single-loop control to multivariable control; expressed as an array (for all possible input-output pairs) of the ratios of a measure of the single-loop behavior between an input-output variable pair, to a related measure of the behavior of the same input-output pair under some idealization of multivariable control MLMIMO modeling is used to calculate the optimum inputs for a set of goals (or targeted outputs). Constraints can be ranges of process parameters such as time, gas flows, and temperature by layer. With MLMIMO, a set of weightings can be applied to guide the optimizer to prioritize the outputs with most value to the current process calculations at a given time. Target weightings can be used where an equation is applied to the weighting calculation given a target and gain constants that effectively penalize as the optimizer moves away from target in a linear or non-linear way. Targets' can be a center target or and limit target (above a given value—for example with SWA).

Feedback can take the form of multiple loops, one for each targeted output with a calculation of the feedback error based on the actual less predicted error. With MLMIMO, each prediction output error needs to be calculated and matched with the feedback measurements to determine the real error. Feedback filtering methods such as Exponentially Weighted Moving Averages (EWMA) or Kalman filters can be used to filter noise. Outputs of a layer controller can include a goodness of fit and this GOF value can then be used as the input of a cascading layer controller.

The wafer can be partitioned into one or more upper edge regions, one or more center regions, and one or more lower edge regions.

Layer controllers can contain updates at different times as the processing steps are performed allowing for the controller to make new updates based on past calculations, errors of calculations, changes in tool state or material state then incorporated into the most recent update.

As feature sizes decrease below the 65 nm node, accurate processing and/or measurement data becomes more important and more difficult to obtain. MLMIMO models and associated processing sequences can be used to more accurately process and/or measure these ultra-small devices and features. The data from an MLMIMO procedure can be compared with the warning and/or control limits, when a run-rule is violated, an alarm can be generated indicating a processing problem, and correction procedures can be performed in real time.

FIG. 1 shows an exemplary block diagram of a processing system in accordance with embodiments of the invention. In the illustrated embodiment, processing system 100 comprises a lithography subsystem 110, a scanner subsystem 120, an etch subsystem 130, a deposition subsystem 140, an inspection subsystem 150, a metrology subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used in MLMIMO models and associated processing sequences.

The system controller 190 can be coupled to the lithography subsystem 110, the scanner subsystem 120, the etch subsystem 130, the deposition subsystem 140, the inspection subsystem 150, the metrology subsystem 160, and the transfer subsystem 170 using a data transfer subsystem 191. The system controller 190 can be coupled to the MES 180 using the data transfer subsystem 181. Alternatively, other configurations may be used. For example, the etch subsystem 130, the deposition subsystem 140, the metrology subsystem 160, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more wafers 105 can be transferred 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more wafers using a procedure and/or procedures. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to develop, measure, and/or inspect one or more of the patterned masking layers on one or more of the wafers.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the scanner subsystem 120, and one or more wafers 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more wafers 105 can be transferred 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, trimming, and cleaning procedures. Evaluation procedures and/or inspection procedures can be used to measure and/or inspect one or more surfaces and/or layers of the wafers. The etch subsystem 130 can be configured as described herein in FIGS. 2A-2G and FIGS. 3A-3G.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more wafers 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the wafers.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled 151 to the transfer subsystem 170. The transfer subsystem 170 can be coupled 151 to the inspection subsystem 150, and one or more wafers 105 can be transferred 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to the one or more of the processing elements 153, and/or to one or more of the evaluation elements 155.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled 161 to the transfer subsystem 170. The transfer subsystem 170 can be coupled 161 to the metrology subsystem 160, and one or more wafers 105 can be transferred 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165. The metrology subsystem 160 can comprise one or more processing elements 163 that can be used to perform real-time optical metrology procedures that can be used to measure target structures at one or more sites on a wafer using library-based or regression-based techniques. For example, the sites on wafer can include MLMIMO sites, target sites, overlay sites, alignment sites, measurement sites, verification sites, inspection sites, or damage-assessment sites, or any combination thereof. For example, one or more "golden wafers" or reference chips can be stored and used periodically to verify the performance of one or more of the processing elements 163, and/or one or more of the evaluation elements 165.

In some embodiments, the metrology subsystem 160 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology subsystem 160 can use polarizing reflectometry, spectroscopic ellipsometry, reflectometry, or other optical measurement techniques to measure accurate device profiles, accurate CDs, and multiple layer film thickness of a wafer. The integrated metrology process (iODP) can be executed as an integrated process in an integrated group of subsystems. In addition, the integrated process eliminates the need to break the wafer for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations.

The transfer subsystem 170 can comprise transfer elements 174 coupled to transfer tracks (175, 176, and 177) that can be used to receive wafers, transfer wafers, align wafers, store wafers, and/or delay wafers. For example, the transfer elements 174 can support two or more wafers. Alternatively, other transferring means may be used. The transfer subsystem 170 can load, transfer, store, and/or unload wafers based on a MLMIMO model, a MLMIMO-related processing sequence, a transfer sequence, operational states, the wafer and/or processing states, the processing time, the current time, the wafer data, the number of sites on the wafer, the type of sites on the wafers, the number of required sites, the number of completed sites, the number of remaining sites, or confidence data, or any combination thereof.

In some examples, transfer subsystem 170 can use loading data to determine where and when to transfer a wafer. In other examples, a transfer system can use MLMIMO modeling data to determine where and when to transfer a wafer. Alternatively, other procedures may be used. For example, when the first number of wafers is less than or equal to the first number of available processing elements, the first number of wafers can be transferred to the first number of available processing elements in the one or more of the subsystems using the transfer subsystem 170. When the first number of wafers is greater than the first number of available processing elements, some of the wafers can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing lithography-related procedures, scanner-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by MLMIMO-related processing sequences. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by MLMIMO-related procedures. For example, the operational state data for the processing elements can include availability data, matching data for the processing elements, expected processing times for some process steps and/or sites, yield data, confidence data and/or risk data for the processing elements, or confidence data and/or risk data for one or more MLMIMO-related procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time MLMIMO-related procedures. A controller can receive real-time data from a MLMIMO model to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the wafer and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when processing sequences are changed, when design rules are changed, or when layouts are changed, In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a MLMIMO-related error condition occurs. The MES 180 can also provide modeling data, processing sequence data, and/or wafer data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from MLMIMO modeling procedures can be used in subsequent procedures to optimize the process accuracy and precision. Data can be passed to MLMIMO-related procedures in real-time as real-time variable parameters, overriding current model values, and reducing DOE tables. Real-time data can be used with a library-based system, or regression-based system, or any combination thereof to optimize a MLMIMO-related procedure.

When a regression-based library creation procedure is used, measured MLMIMO model-related data can be compared to simulated MLMIMO model-related data. The simulated MLMIMO data can be iteratively generated, based on sets of process-related parameters, to obtain a convergence value for the set of process-related parameters that generates the closest match simulated MLMIMO model-related data compared to the measured MLMIMO model-related data. When a library-based process is used, a MLMIMO model-related library can be generated and/or enhanced using MLMIMO model-related procedures, recipes, profiles, and/or models. For example, a MLMIMO model-related library can comprise simulated and/or measured MLMIMO-related data and corresponding sets of processing sequence data. The regression-based and/or the library-based processes can be performed in real-time. An alternative procedure for generating data for a MLMIMO-related library can include using a machine learning system (MLS). For example, prior to generating the MLMIMO-related library data, the MLS can be trained using known input and output data, and the MLS may be trained with a subset of the MLMIMO-related library data.

MLMIMO models can include intervention and/or judgment rules that can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number and/or the type of data.

Unsuccessful procedures or processing sequences can report a failure when a limit is exceeded, and successful procedures can create warning messages when limits are being approached. Pre-specified failure actions for procedures errors can be stored in a database, and can be retrieved from the database when an error occurs. For example, MLMIMO-related procedures can reject the data at one or more of the sites for a wafer when a measurement procedure fails.

MLMIMO models can be used to create, modify, and/or evaluate isolated and/or nested structures at different times and/or sites. For example, gate stack dimensions and wafer thickness data can be different near isolated and/or nested structures, and gate stack dimensions and wafer thickness data can be different near open areas and/or trench array areas. A MLMIMO model can create optimized data for isolated and/or nested structures to update and/or optimize a process recipe and/or process time.

MLMIMO models can use end-point detection (EPD) data and process time data to improve the accuracy. When EPD data is used to stop an etching procedure, the EPD time data and the process rate data can be used to estimate the amount of etch and/or to estimate a thickness.

In various examples, MLMIMO model-related limits can be obtained by performing the MLMIMO model-related procedure in a "golden" processing chamber, can be historical data that is stored in a library, can be obtained by performing a verified deposition procedure, can be obtained from the MES 180, can be simulation data, and can be predicted data. Partial-Etch procedure limits can be obtained by performing the partial-etch procedure in a "golden" processing chamber, can be historical data that is stored in a library, can be obtained by performing a verified partial-etch procedure, can be obtained from the MES 180, can be simulation data, and can be predicted data. partial-etch procedure limits can be obtained by performing the COR-etch procedure in "golden" processing chambers, can be historical data that is stored in a library, can be obtained by performing a verified partial-etch procedure, can be obtained from the MES 180, can be simulation data, and can be predicted data.

FIGS. 2A-2G show exemplary block diagrams of etching subsystems in accordance with embodiments of the invention.

A first exemplary etching subsystem 200A is shown in FIG. 2A, and the illustrated etching subsystem 200A includes plasma processing chamber 210, wafer holder 220, upon which a wafer 225 to be processed is affixed, gas injection system 240, and pressure control system 257. For example, wafer holder 220 can be coupled to and insulated from plasma processing chamber 210 using base 229. Wafer 225 can be, for example, a semiconductor wafer, a work piece, or a liquid crystal display (LCD). For example, plasma-processing chamber 210 can be configured to facilitate the generation of plasma in processing region 245 adjacent a surface of wafer 225, where plasma is formed via collisions between heated electrons and an ionizable gas. An ionizable gas or mixture of gases is introduced via gas injection system 240, and process pressure is adjusted. Desirably, plasma is utilized to create materials specific to a predetermined material process, and to aid either the deposition of material to wafer 225 or the removal of material from the exposed surfaces of wafer 225. For example, controller 255 can be used to the control pressure control system 257 and the gas injection system 240.

Wafer 225 can be, for example, transferred into and out of plasma processing chamber 210 through a slot valve (not shown) and chamber feed-through (not shown) via robotic transfer system where it is received by wafer lift pins (not shown) housed within wafer holder 220 and mechanically translated by devices housed therein. After the wafer 225 is received from transfer system, it is lowered to an upper surface of wafer holder 220.

For example, wafer 225 can be affixed to the wafer holder 220 via an electrostatic clamping system (not shown). Furthermore, wafer holder 220 can further include temperature control elements 227 and temperature control system 228. Moreover, gas can be delivered to the backside of the wafer via a dual (center/edge) backside gas system 226 to improve the gas-gap thermal conductance between wafer 225 and wafer holder 220. A dual (center/edge) backside gas system can be utilized when additional temperature control of the wafer is required at elevated or reduced temperatures. For example, temperature control elements 227 can include cooling elements, resistive heating elements, or thermoelectric heaters/coolers.

As shown in FIG. 2A, wafer holder 220 includes a lower electrode 221 through which Radio Frequency (RF) power can be coupled to plasma in processing region 245. For example, lower electrode 221 can be electrically biased at an RF voltage via the transmission of RF power from RF generator 230 through impedance match network 232 to lower electrode 221. The RF bias can serve to heat electrons to form and maintain plasma. A typical frequency for the RF bias can range from 1 MHz to 100 MHz and is preferably 13.56 MHz.

Alternatively, RF power may be applied to the lower electrode 221 at multiple frequencies. Furthermore, impedance match network 232 serves to maximize the transfer of RF power to plasma in processing chamber 210 by minimizing the reflected power. Various match network topologies and automatic control methods can be utilized.

With continuing reference to FIG. 2A, process gas can be introduced to one or more areas of the processing region 245 through gas injection system 240. Process gas can, for example, include a mixture of gases such as argon, Tetrafluoromethane ($CF_4$) and Oxygen ($O_2$), or argon (Ar), $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, hydrogen bromide (HBr). Gas injection system 240 can be configured to reduce or minimize the introduction of contaminants to wafer 225 and can include a gas injection plenum 241, and a multi-orifice showerhead gas injection plate 242. For example, process gas can be supplied from a gas delivery system (not shown). Gas injection system 240 can provide different flow rates to different regions of the processing region 245. Alternatively, gas injection system 240 may provide different process gasses to different regions of the processing region 245.

For example, pressure control system 257 can include a turbo-molecular vacuum pump (TMP) 258 capable of a pumping speed up to 5000 liters per second (and greater) and a gate valve 259 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the process chamber 210. The pressure-measuring device can be, for example, a Type 628B Baratron absolute capacitance manometer commercially available from MKS Instruments, Inc. (Andover, Mass.).

As depicted in FIG. 2A, etching subsystem 200A can include one or more sensors 250 coupled to plasma processing chamber 210 to obtain performance data, and controller 255 coupled to the sensors 250 to receive performance data. The sensors 250 can include both sensors that are intrinsic to the plasma processing chamber 210 and sensors extrinsic to the plasma-processing chamber 210. Intrinsic sensors can include those sensors pertaining to the functionality of plasma processing chamber 210 such as the measurement of the Helium backside gas pressure, Helium backside flow, electrostatic clamping (ESC) voltage, ESC current, wafer holder 220 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., C1 and C2 positions), a focus ring thickness, RF hours, focus ring RF hours, and any statistic thereof. Alternatively, extrinsic sensors can include one or more optical devices 234 for monitoring the light emitted from the plasma in processing region 245 as shown in FIG. 2A, and/or one or more electrical measurement devices 236 for monitoring the electrical system of plasma processing chamber 210 as shown in FIG. 2A. The optical devices 234 can include an optical sensor that can be used as an End Point Detector (EPD) and can provide EPD data. For example, an Optical Emissions Spectroscopy (OES) sensor may be used.

The electrical measurement device 236 can include a current and/or voltage probe, a power meter, or spectrum analyzer. For example, electrical measurement devices 236 can include a RF Impedance analyzer. Furthermore, the measurement of an electrical signal, such as a time trace of voltage or current, permits the transformation of the signal into frequency domain using discrete Fourier series representation (assuming a periodic signal). Thereafter, the Fourier spectrum (or for a time varying signal, the frequency spectrum) can be monitored and analyzed to characterize the state of a plasma. In alternate embodiments, electrical measurement device 236 can include a broadband RF antenna useful for measuring a radiated RF field external to plasma processing chamber 210.

Controller 255 includes a microprocessor, memory, and a digital I/O port (potentially including D/A and/or A/D converters) capable of generating control voltages sufficient to communicate and activate inputs to etching subsystem as well as monitor outputs from etching subsystem. As shown in FIG. 2A, controller 255 can be coupled to and exchange information with first RF generator 230, impedance match network 232, gas injection system 240, pressure control system 257, backside gas delivery system 226, temperature control system 228, optical device 234, electrical measurement device 236, and sensors 250. A program stored in the memory is utilized to interact with the aforementioned components of an etching subsystem 200A according to a stored process recipe.

In the exemplary embodiment shown in FIG. 2B, the etching subsystem 200B can be similar to the embodiment of FIG. 2A and further comprise either a stationary, or mechanically or electrically rotating magnetic field system 260, in order to potentially increase plasma density and/or improve plasma processing uniformity, in addition to those components described with reference to FIG. 2A. Moreover, controller 255 can be coupled to magnetic field system 260 in order to regulate the speed of rotation and field strength. The design and implementation of a rotating magnetic field is well known to those skilled in the art.

Figure 2B:
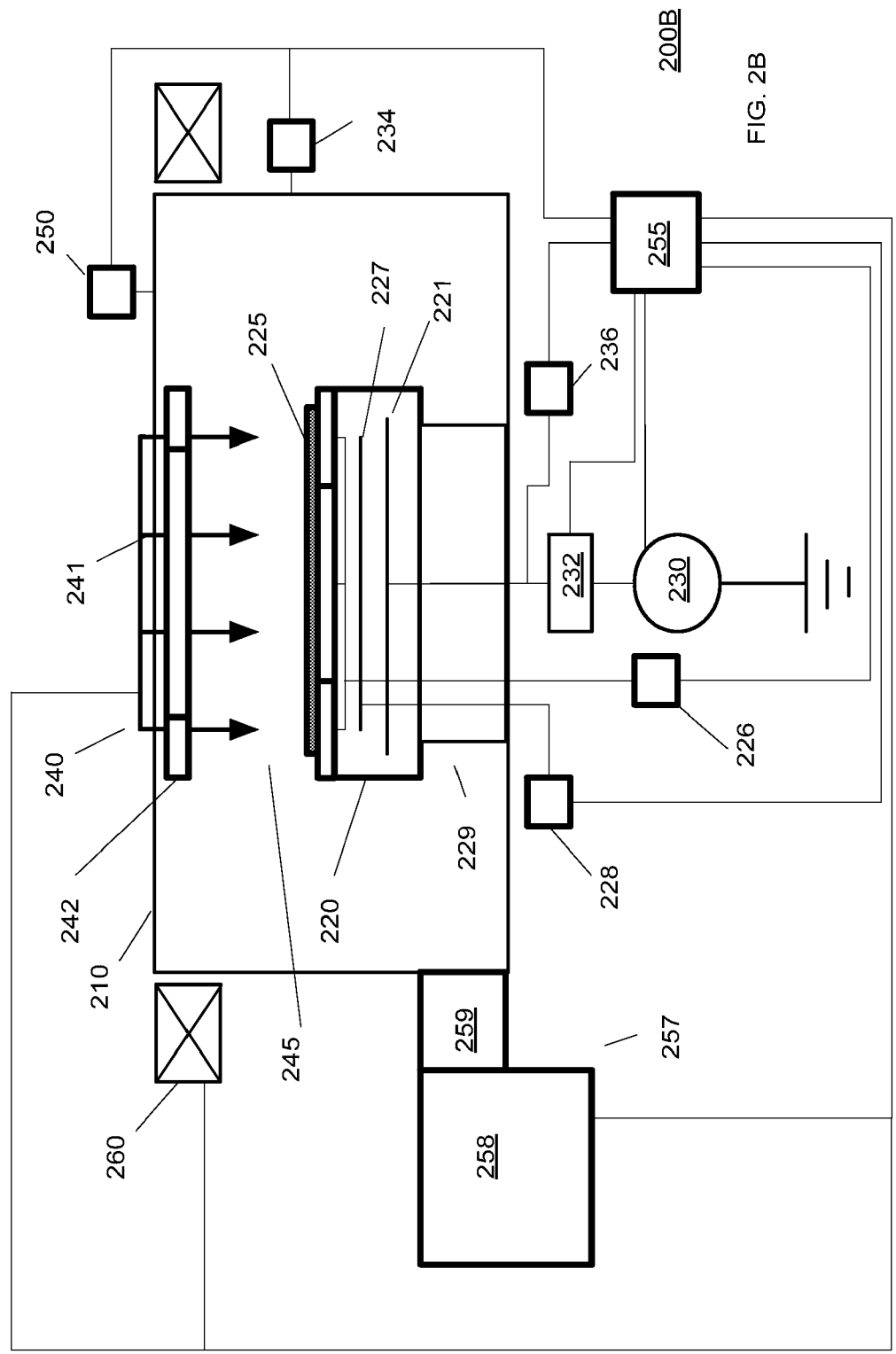
Figure 2C:
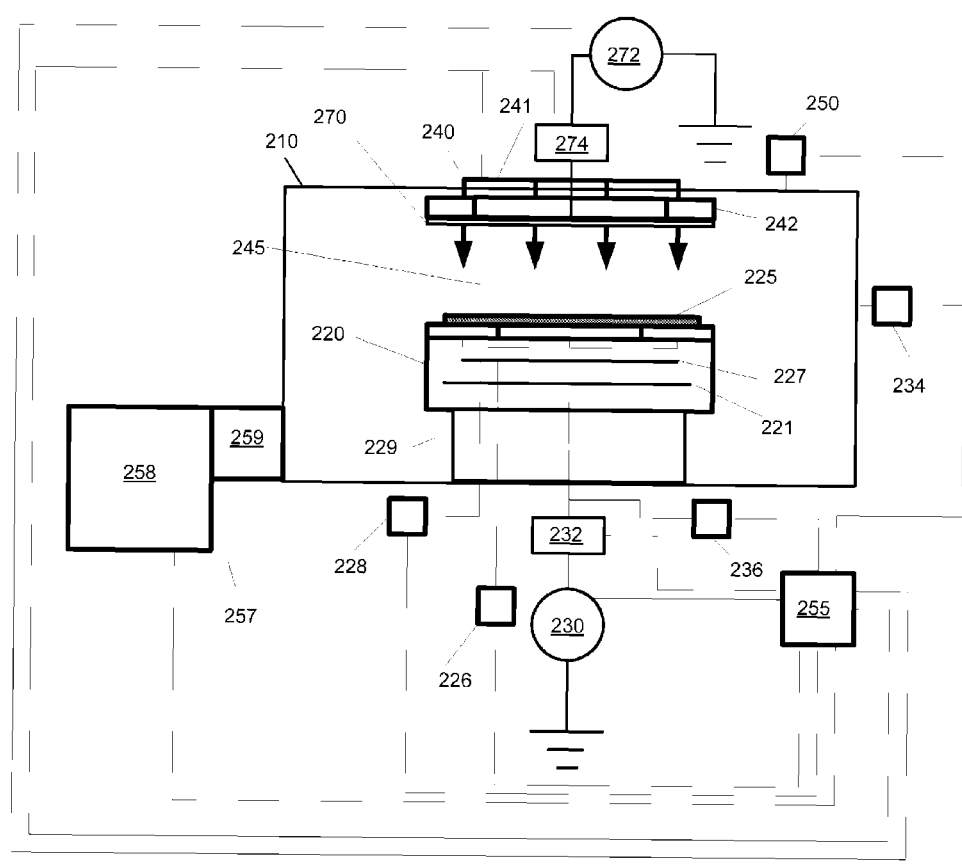

In the embodiment shown in FIG. 2C, the etching subsystem 200C can be similar to the embodiment of FIG. 2A or FIG. 2B, and can further comprise an upper electrode 270 to which RF power can be coupled from RF generator 272 through optional impedance match network 274. A frequency for the application of RF power to the upper electrode can range from about 0.1 MHz to about 200 MHz. Additionally, a frequency for the application of power to the lower electrode 221 can range from about 0.1 MHz to about 100 MHz. Moreover, controller 255 can be coupled to RF generator 272 and impedance match network 274 in order to control the application of RF power to upper electrode 270. The design and implementation of an upper electrode is well known to those skilled in the art. The upper electrode 270 and the gas injection system 240 can be coupled to each other as shown.

In the embodiment shown in FIG. 2D, the etching subsystem 200D can be similar to the embodiments of FIGS. 2A and 2B, and can further comprise an inductive coil 280 to which RF power can be coupled via RF generator 282 through optional impedance match network 284. RF power is inductively coupled from inductive coil 280 through a dielectric window (not shown) to plasma processing region 245. A frequency for the application of RF power to the inductive coil 280 can range from about 10 MHz to about 100 MHz. Similarly, a frequency for the application of power to the lower electrode 221 can range from about 0.1 MHz to about 100 MHz. In addition, a slotted Faraday shield (not shown) can be employed to reduce capacitive coupling between the inductive coil 280 and plasma. Moreover, controller 255 can be coupled to RF generator 282 and impedance match network 284 in order to control the application of power to inductive coil 280.

In an alternate embodiment (not shown), a "spiral" coil or "pancake" coil configuration may be used for the inductive coil. The design and implementation of an inductively coupled plasma (ICP) source, or transformer coupled plasma (TCP) source, is well known to those skilled in the art.

In the embodiment shown in FIG. 2E, the etching subsystem 200E can, for example, be similar to the embodiments of FIGS. 2A, 2B, 2C, and 2D, and can further comprise a second RF generator 235 configured to couple RF power to wafer holder 220 through another optional impedance match network 237. A typical frequency for the application of RF power to wafer holder 220 can range from about 0.1 MHz to about 200 MHz for either the first RF generator 230 or the second RF generator 235 or both. The RF frequency for the second RF generator 235 can be relatively greater than the RF frequency for the first RF generator 230. Furthermore, the RF power to the wafer holder 220 from the first RF generator 230 can be amplitude modulated, the RF power to the wafer holder 220 from the second RF generator 235 can be amplitude modulated, or both RF powers can be amplitude modulated. Desirably, the RF power at the higher RF frequency is amplitude modulated. Moreover, controller 255 can be coupled to the second RF generator 235 and impedance match network 237 in order to control the application of RF power to wafer holder 220. The design and implementation of an RF system for a wafer holder is well known to those skilled in the art.

In the embodiment shown in FIG. 2F, the etching subsystem 200F can be similar to the embodiments of FIGS. 2A and 2E, and can further comprise a surface wave plasma (SWP) source 285. The SWP source 285 can comprise a slot antenna, such as a radial line slot antenna (RLSA), to which microwave power is coupled via microwave generator 286 through optional impedance match network 287.

Figure 2G:
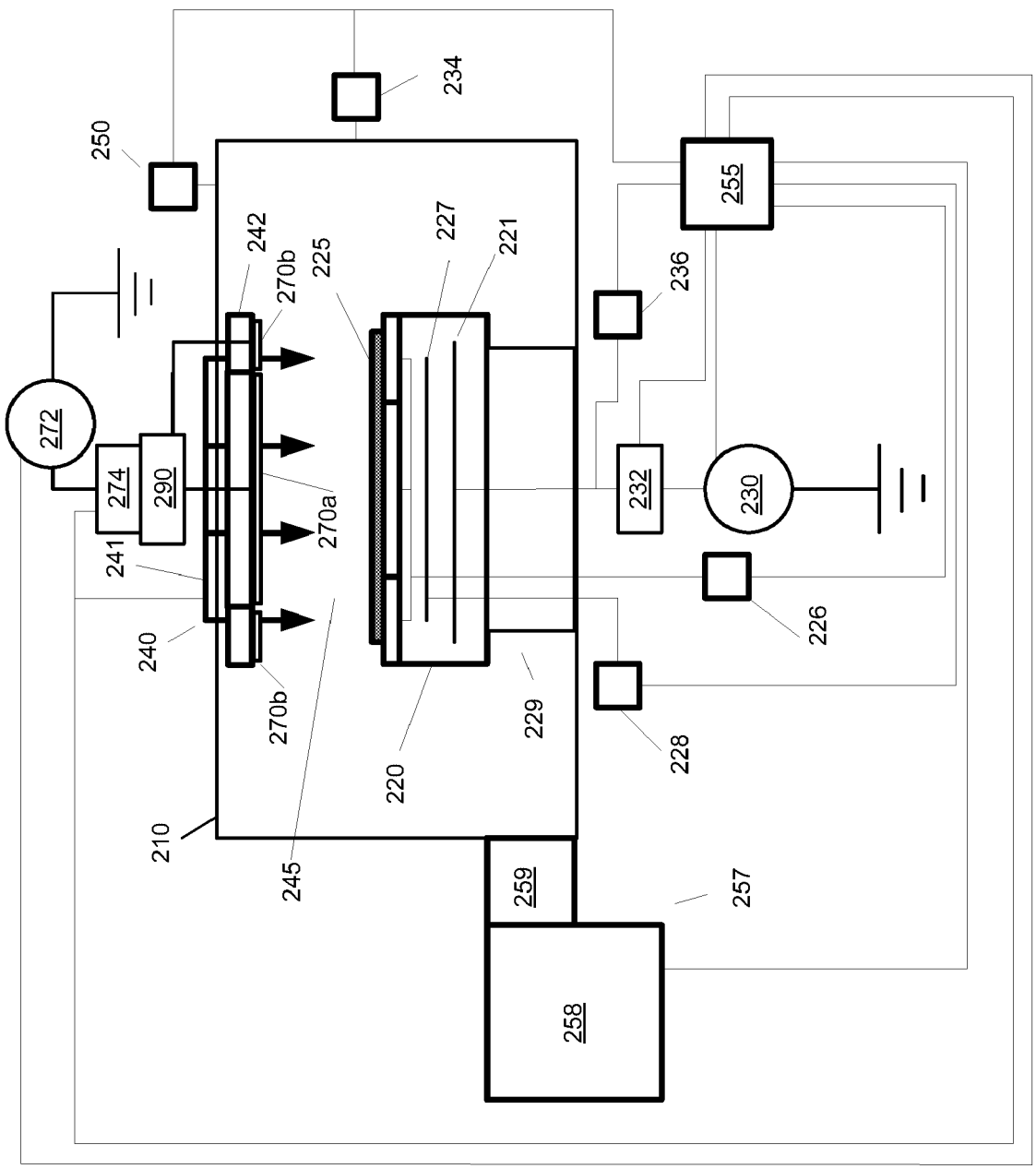
Figure 3B:
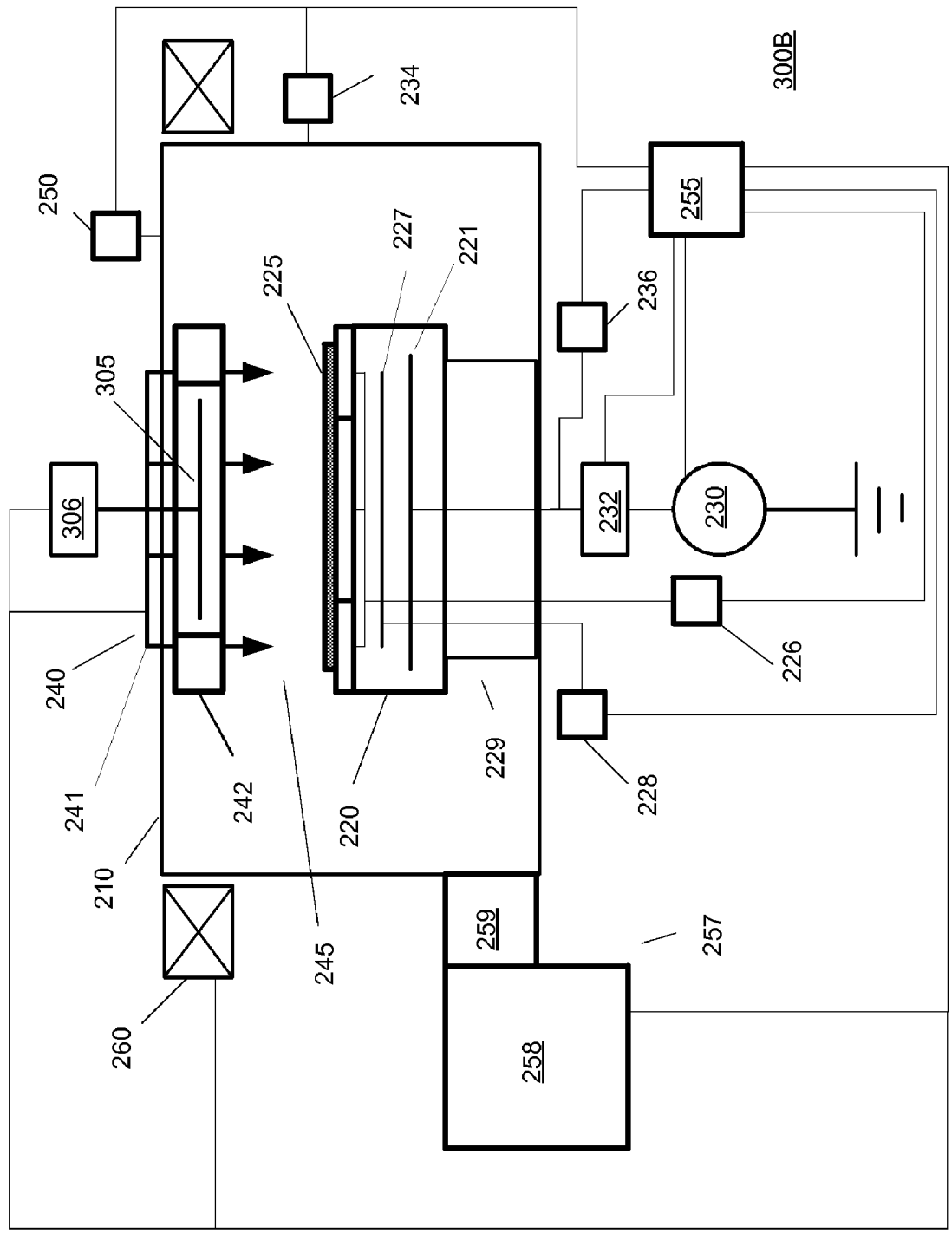
Figure 3C:
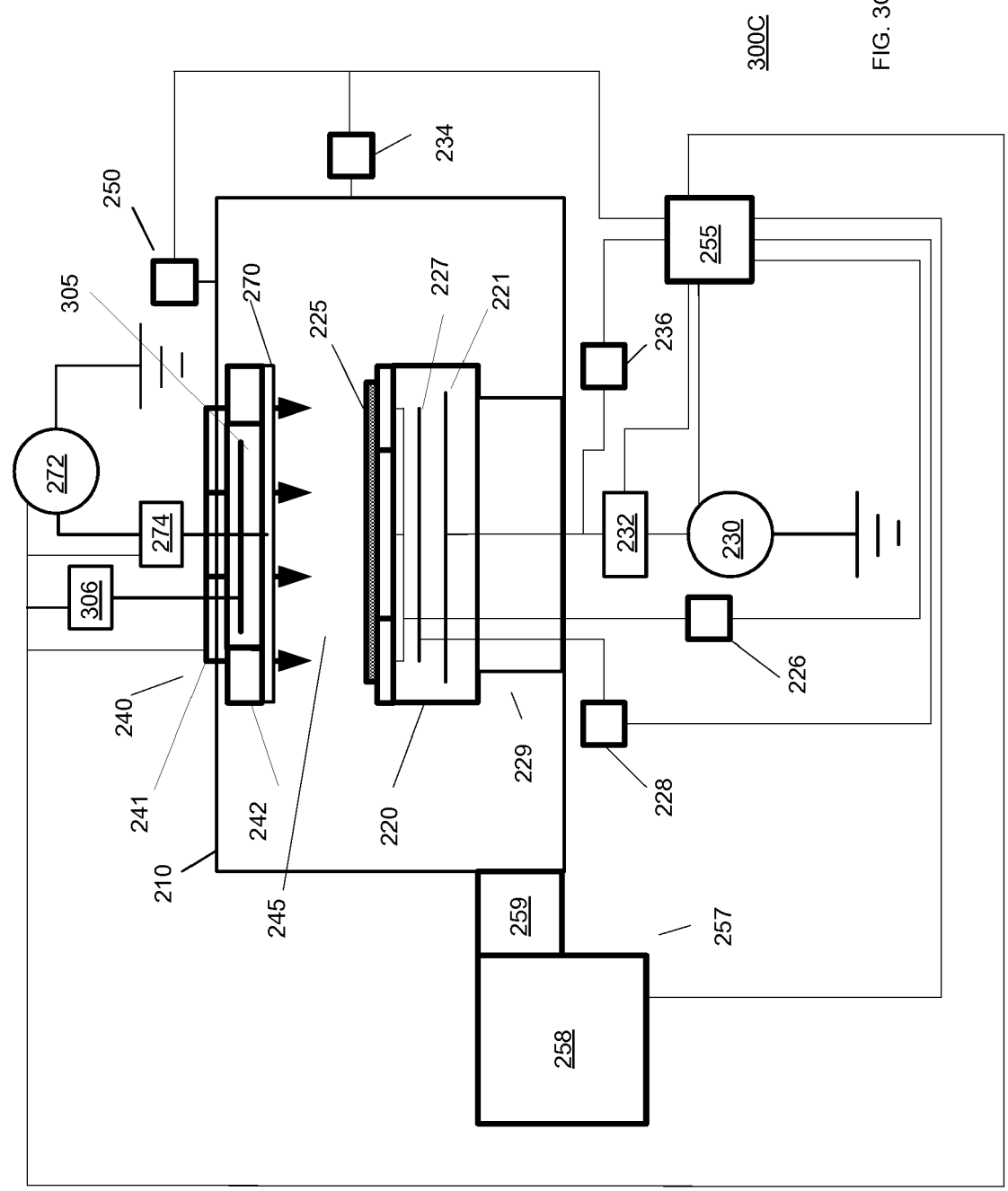
Figure 3D:
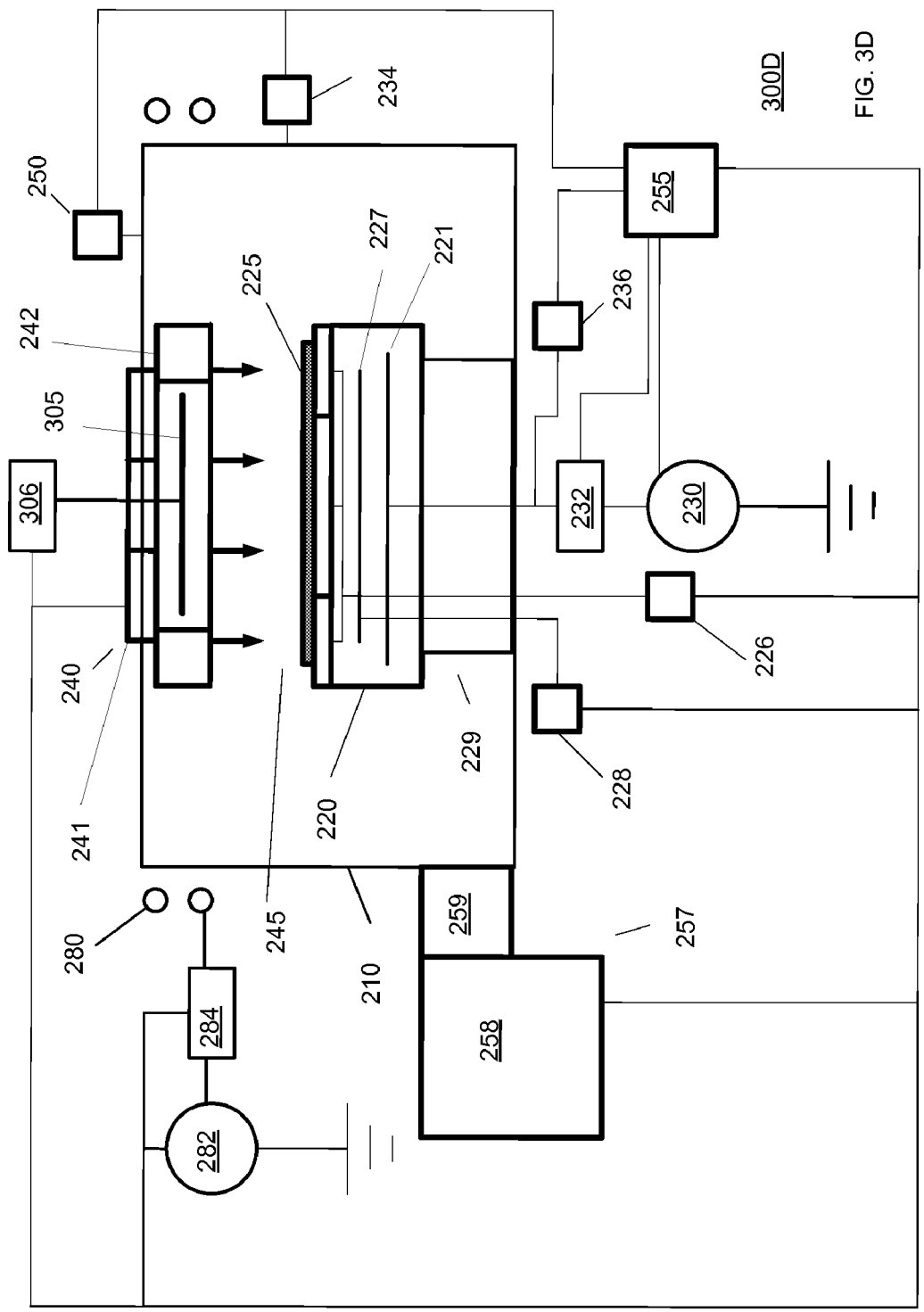
Figure 3E:
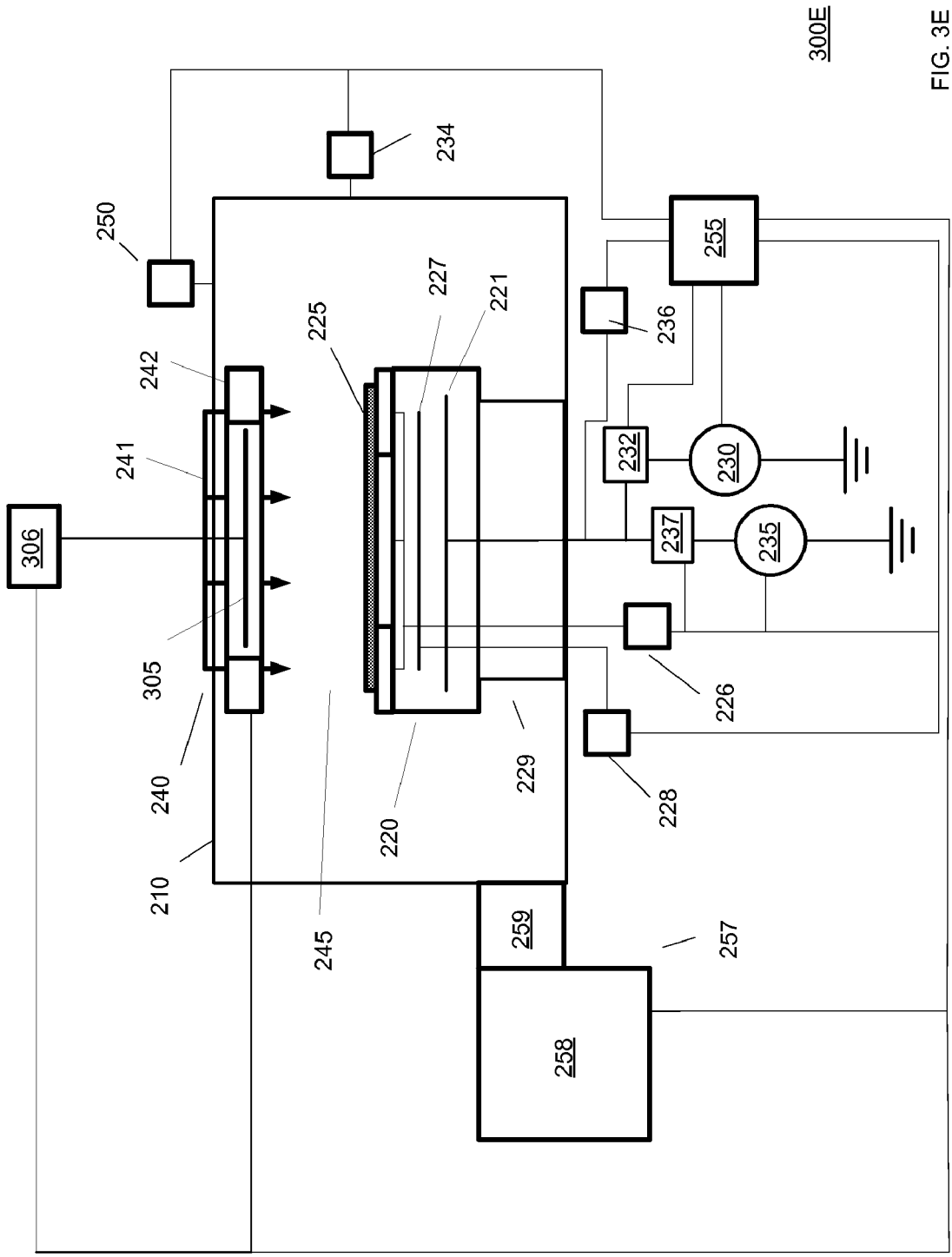
Figure 3F:
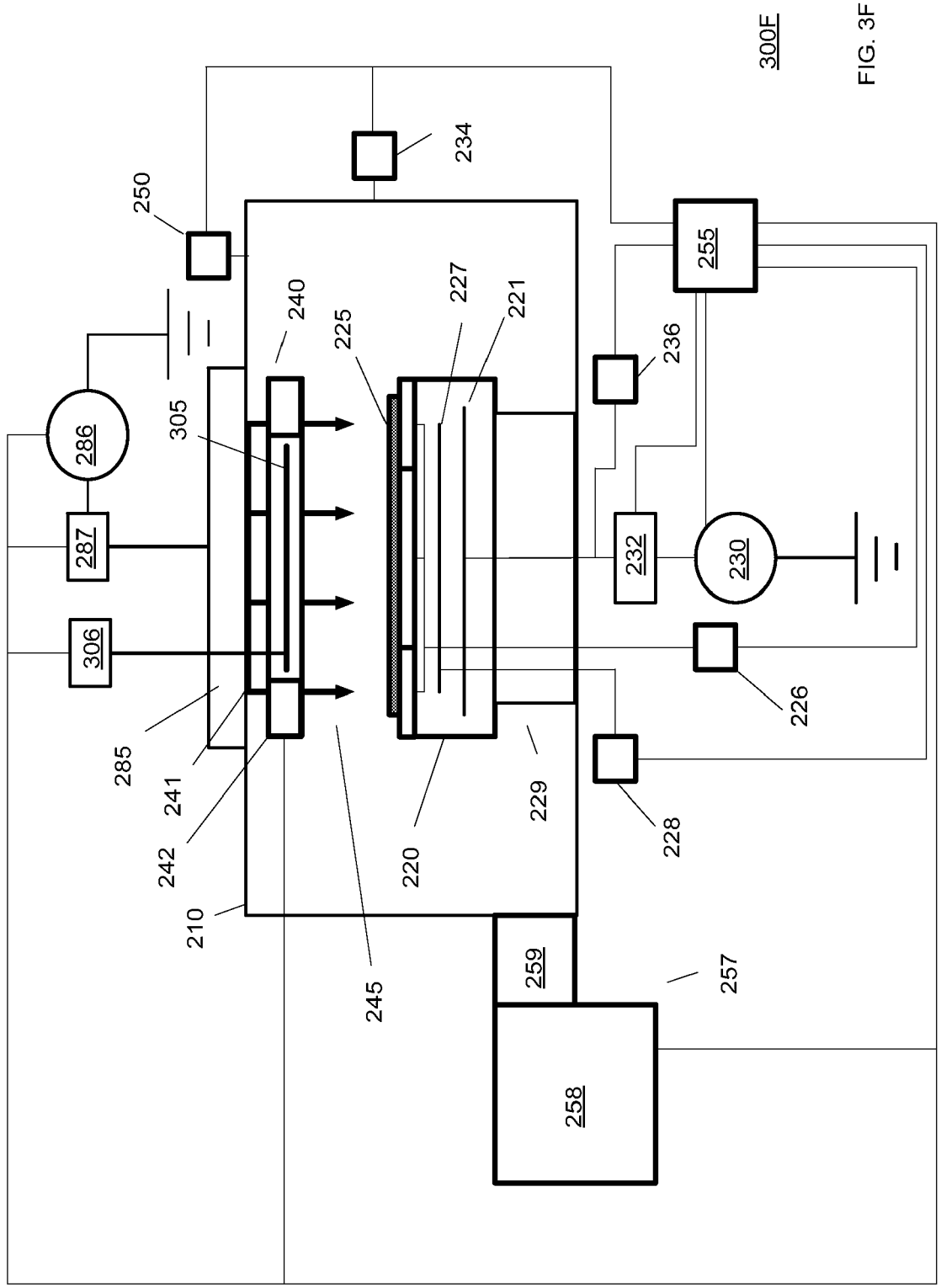
Figure 3G:
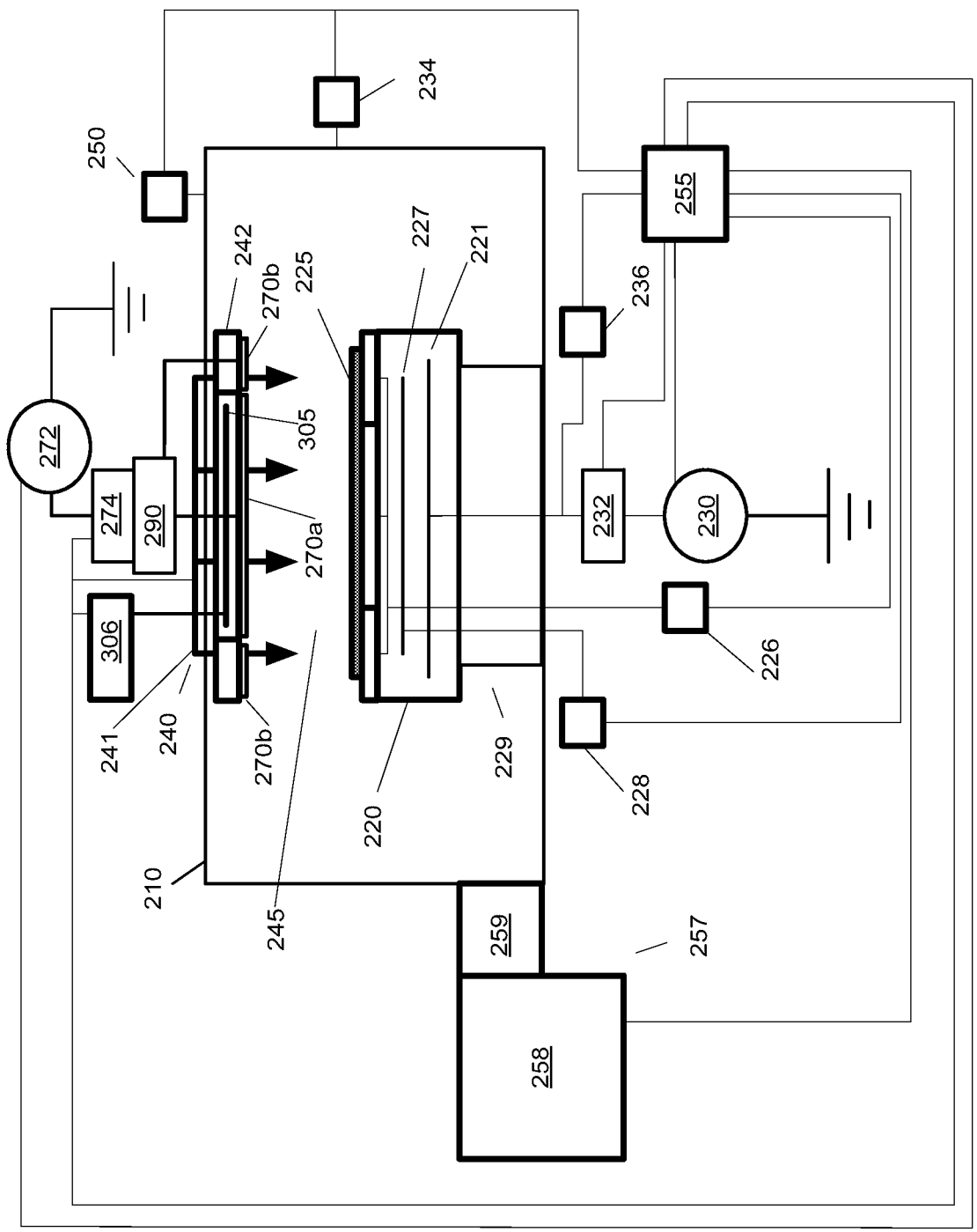

In the embodiment shown in FIG. 2G, the etching subsystem 200G can be similar to the embodiment of FIG. 2C, and can further comprise a split upper electrode (270a, 270b) to which RF power can be coupled from RF generator 272 through an impedance match network 274 and a power splitter 290. A frequency for the application of RF power to the split upper electrode (270a, 270b) can range from about 0.1 MHz to about 200 MHz. Additionally, a frequency for the application of power to the lower electrode 221 can range from about 0.1 MHz to about 100 MHz. Moreover, controller 255 can be coupled to RF generator 272 and impedance match network 274 in order to control the application of RF power to upper electrode 270. The power splitter and the split upper electrode can be designed and configured to provide different RF power levels to the center and the edge of the processing region 245 to facilitate the generation and control of a plasma in processing region 245 adjacent a surface of wafer 225. The split upper electrode (270a, 270b) and the gas injection system 240 can be coupled to each other as shown, or other configurations may be used.

FIGS. 3A-3G show additional embodiments for etching subsystems in accordance with embodiments of the invention. FIGS. 3A-3G illustrate exemplary etching subsystems 300A-300G that are similar to the exemplary etching subsystems 200A-200G shown in FIGS. 2A-2G, but etching subsystems 300A-300G include at least one DC electrode 305 and at least one DC source 306.

During patterned etching, a dry plasma etching process is often utilized, and the plasma is formed from a process gas by coupling electromagnetic (EM) energy, such as radio frequency (RF) power, to the process gas in order to heat electrons and cause subsequent ionization and dissociation of the atomic and/or molecular composition of the process gas. In addition, negative, high voltage direct current (DC) electrical power can be coupled to the plasma processing system in order to create an energetic (ballistic) electron beam that strikes the wafer surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as U.S. patent application No. 2006/0037701A1; the entire contents of which are herein incorporated by reference in their entirety. In general, the ballistic electron beam can be implemented within various types of plasma processing system, as shown in FIGS. 3A-3G.

The DC electrode 305 may comprise a silicon-containing material and/or a doped silicon-containing material. The DC source 306 can include a variable DC power supply. Additionally, the DC source 306 can include a bipolar DC power supply. The DC source 306 can further include a system configured to perform at least one of monitoring, adjusting, or controlling the polarity, current, voltage, and/or on/off state of the DC source 306. Once plasma is formed, the DC source 306 facilitates the formation of a ballistic electron beam. An electrical filter may be utilized to de-couple RF power from the DC source 306.

For example, the DC voltage applied to DC electrode 305 by DC source 306 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage.

In alternate embodiments, a Chemical Oxide Removal (COR) subsystem (not shown) can be used to remove or trim oxidized poly-Si material. In addition, the COR subsystem may be used to remove or trim an oxide masking layer. For example, a COR subsystem can comprise a chemical treatment module (not shown) for chemically treating exposed surface layers, such as oxide surface layers, on a wafer, whereby adsorption of the process chemistry on the exposed surfaces affects chemical alteration of the surface layers. Additionally, the COR subsystem can comprise thermal treatment module (not shown) for thermally treating the wafer, whereby the wafer temperature is elevated in order to desorb (or evaporate) the chemically altered exposed surface layers on the wafer.

Figure 4:
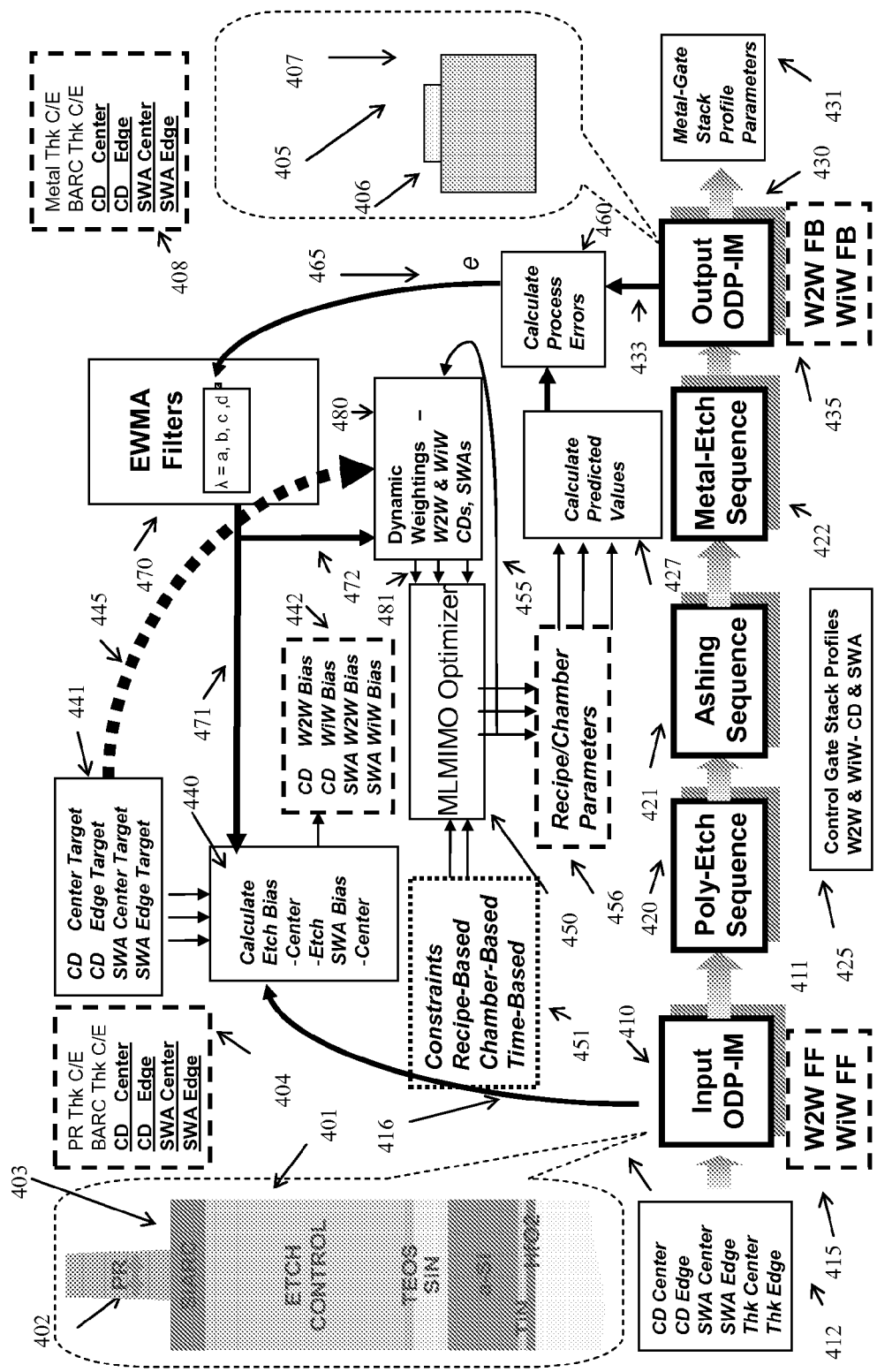
FIG. 4 shows a simplified block diagram of an exemplary Multi-Layer/Multi-Input/Multi-Output (MLMIMO) model optimization and control methodology in accordance with embodiments of the invention.

FIG. 4 shows a simplified block diagram of an exemplary Multi-Layer/Multi-Input/Multi-Output (MLMIMO) model optimization and control methodology in accordance with embodiments of the invention. In the illustrated MLMMIMO model methodology, exemplary images of a portion of a first patterned gate stack 401 and a post-processed gate stack 405 is shown. The soft-mask layer of the first patterned gate stack 401 can include one or more soft-mask feature CDs 402 and one or more soft-mask feature sidewall angles (SWAs) 403. The first patterned gate stack 401 can be characterized using a first set of parameters 404 that can include center and edge profile data items, center and edge thickness (Thick C/E) data items, CD center data items, CD edge data items, SWA center data items, and SWA edge data items. Alternatively, a different set of parameters may be used. The post-processed gate stack 405 can include one or more CDs 406 and one or more SWAs 407. The post-processed gate stack 405 can be characterized using a second set of parameters 408 that can include center and edge metal gate data items, center and edge hard-mask data items, center and edge data items for one or more silicon-containing layers, SWA center data items, and SWA edge data items. Alternatively, a different set of parameters may be used.

In the illustrated methodology, a first integrated metrology (IM) tool (First ODP-IM) controller/model 410 can be coupled to one or more poly-etch (P-E) tool controllers/models 420. One or more of the P-E controller/models 420 can be coupled to one or more cleaning/ashing tool controllers/models 421. One or more of the cleaning/ashing tool controllers/models 421 can be coupled to one or more metal-gate etch (MGE) tool controllers/models 422. One or more of the metal-gate etch (MGE) tool controllers/models 422 can be coupled to one or more output metrology tool (Second ODP-IM) controllers/models 430.

The first metrology tool (First ODP-IM) controller/model 410 can receive data 412 and can provide feed forward data (411, 415). The second metrology tool (Second ODP-IM) controller/model 430 can send data 431 and can provide feed back data 435. In some examples, wafer-to-wafer feed-forward data (W2W FF) 415 can be associated with the First ODP-IM controller/model 410, and wafer-to-wafer feedback data (W2W FB) 435 can be associated with the Second ODP-IM controller/models 430. In addition, one or more of the controller/models (420, 421, and 422) can be used 425 to control gate stack profiles on a wafer-to-wafer (W2W) basis and to control gate stack profiles on a Within-Wafer (WiW) basis.

Data items 416 can be sent to a first calculation element 440 that can be used to calculate the gate stack bias at the center of the wafer and at the edge of the wafer. The first calculation element 440 can be used to calculate the bias at the center of the wafer and at the edge of the wafer. A first set of target parameters 441 can be provided to the first calculation element 440, and a first set of filter outputs 471 can be provided to the first calculation element 440. Output data items 442 from the first calculation element 440 can be provided to one or more MLMIMO model Optimizers 450.

One or more of the MLMIMO model Optimizers 450 can be provided with one or more constraint parameters 451 that can include tool limits, recipe limits, and/or time limits. In the example shown, the constraint parameters 451 can include step-based wafer temperature limits or process gas limits. One or more of the MLMIMO model Optimizers 450 can determine one or more sets of recipe/chamber parameters 456 that can be sent to one or more of the tool controller/models (420, 421, and 422).

One or more of the tool controller/models (420, 421, and 422) can be used to calculate predicted data items 427 that can include one or more predicted etch biases, one or more predicted SWA biases, one or more predicted step times for one or more etch recipes, and one or more predicted process gas flows for one or more etch recipes.

One or more of the Second ODP-IM controller/models 430 can provide one or more actual outputs 433 to one or more comparison elements 460, and one or more of the actual outputs 433 can be compared to one of more of the predicted data items 427. One or more of the error values 465 from one or more of the comparison elements 460 can be provided to one or more of the EWMA filters 470

One or more of the EWMA filters 470 can provide one or more first filtered outputs 471 to the first calculation element 440, and one or more of the EWMA filters 470 can provide one or more second filtered outputs 472 to one or more of the weighting controller/models 480. Each of the EWMA filters 470 can filter and provide feedback data for a single parameter or error value. Alternatively, each of the EWMA filters 470 can filter and provide feedback data for a multiple parameters or error values. One or more of the weighting controller/models 480 can receive one or more target data items 445 and one or more feedback data items 455 from one or more of the MLMIMO model Optimizers 450. In addition, one or more of the weighting controller/models 480 can provide one or more dynamically varying weighting inputs 481 to one or more of the MLMIMO model Optimizers 450. The concept of using dynamic weightings based on the feedback error is to force the optimizer to prioritize the weightings (rebalance) with a goal of better control of the most important CVs—automation of a manual tuning of a control system in runtime.

In some embodiments, the manipulated variables and/or the disturbance variables used for control can include a calculated value that can be dynamically modeled and updated during the runtime processing by the following method: 1) The modeling procedure can start with a basic model relationship that "pairs" OES sensor data to a controlled variable (CV). For example, the amount of Atomic O or F can be calculated by using trace gas data from the OES, and the amount of Atomic O or F that is consumed can be used to predict a CD or a SWA. This could be a feedback update loop, or a real-time adjustment during an etch step. 2) After a wet clean is performed, the first patterned gate stacks processed during conditioning or production would be used to calculate and update this trace gas model. 3) The RGA method can be used at run-time with production patterned wafers to evaluate when to use the sensor data vs. CV feedback in place of just calculating a value, The RGA matrix for the given CV value would be re-evaluated to determine if the value of the sensor based MV is stronger than the litho incoming CV for use as a real-time CV value. 4) In addition, center to edge sensor detection using OES signal—The rate of change can also be used as an example commonly understood to adjust the over etch recipe settings to improve the uniformity (correct for the non-uniformity of the previous etch steps, x by adjusting the over-etch steps center to edge knobs, such as O2 flow, temp, top power, pressure. IM CV would be the film thickness of incoming wafers to separate incoming—say BARC thickness from etch rate of the current chamber center to edge.

In some embodiments, the control variables associated with various features created by the poly-etch (P-E) sequence or the metal-gate-etch (MGE) sequence can be center CD and SWA values, middle CD and SWA values, edge CD and SWA values, and extreme edge CD and SWA values, and this can require a total of eight IM measurements at four or more sites on the wafer. The pre- and post-IM measurements can be performed using dynamic sampling.

In other embodiments, the manipulated variables can include back-side gas flows to one or more zones in the wafer holder, and the back-side gas flows can be dynamically controlled during processing to provide dynamic backside gas temperature control for improved within-wafer process uniformity by adjusting wafer areas that are non-radial in nature based on incoming CV requirements.

In still other embodiments, the manipulated variables can include flow rates for edge gas injection flow rates. This approach could also be used to reduce the starvation problem at the wafer edge, and make the edge starvation a controllable variable based on the incoming signature and chamber state.

In some MLMIMO models, the interaction terms can be updated between lots during a offline triggered calculation update procedure. For example, the cross term calculation update can be triggered by checking the sensitivity of the current system to changes in the cross terms, and by running a set of pre-defined delta offsets to see if adjusting the cross terms would have improved the average control. RGA could also be used in this calculation, and the trigger events can be used to perform adaptive feedback updates for the MLMIMO model. For example, adaptive feedback can be used when copying a MLMIMO model from chamber to chamber and allowing the MLMIMO model to adapt to the new chamber behavior. Another use arises when a new product is release and the old product equation can be used to start the model, then after so many wafers the model update is triggered and a new model is adjusted, and the resulting model can then be used and monitored for performance.

FIG. 5 illustrates an exemplary view of a multi-step processing sequence for a creating a metal gate structure in accordance with embodiments of the invention. In the illustrated embodiment, six exemplary gate stacks (501-506) are shown, but this is not required for the invention. Alternatively, a different number of gates stacks with different configurations may be used.

In some embodiments, the multi-layer metal-gate stacks (501, 502, 503, 504, 505, and 506, FIG. 5) can be created using a Poly-Etch (PE) processing sequence and a metal-gate etch (MGE) processing sequence. For example, the P-E processing sequence can include an Si-ARC layer etching procedure, an etch-control layer (ECL) etching procedure, a TEOS layer etching procedure, a TEOS Over-Etch (OE) etching procedure, and an Ashing procedure. In addition, the metal-gate etch (MGE) processing sequence can include a "Break-Through" (BT) etching procedure, a main etch (ME) etching procedure, an Over-Etch (OE) etching procedure, a Titanium-Nitride (TiN) etching procedure, and a HK etching procedure.

A first gate stack 501 is shown that includes a wafer layer 510, a metal gate layer 515, a third hard mask layer 520, a first silicon-containing layer 525, a second silicon-containing layer 530, a second hard mask layer 535, a gate-width control layer 540, a first hard mask layer 545, and a pattern of soft mask features 550. For example, the wafer layer 510 can include a semiconductor material; the metal gate layer 515 can include $HfO_2$; the third hard mask layer 520 can include TiN: the first silicon-containing layer 525 can include amorphous silicon (a-Si): the second silicon-containing layer 530 can include SiN; the second hard mask layer 535 can include Tetraethyl Orthosilicate, (TEOS) $[Si(OC_2H_5)_4]$; the gate-width control layer 540 can include ODL; the first hard mask layer 545 can include Si-ARC material, and the soft mask features 550 can include photoresist material.

The first MLMS processing sequence can be modeled using models (560-570), and the models (560-570) can exchange Measured Variable (MV) data using transfer means 575, can exchange Disturbance Variable (DV) data using transfer means 580, and can exchange Controlled Variable (CV) data using transfer means 585. The models (560-570) can receive, process, and/or send MV data, DV data, and CV data associated with the etching procedures described herein.

The first model 560 can be a first integrated metrology (IM) model for the first gate stack 501, and can include a first ODP model. The first model 560 can be used to determine profile data for the soft-mask (photoresist) features 550.

A second gate stack 502 is shown that includes a wafer layer 510, a metal gate layer 515, a third hard mask layer 520, a first silicon-containing layer 525, a second silicon-containing layer 530, a second hard mask layer 535, a gate-width control layer 540, first hard mask features 545a, and the etched soft mask features 550a. For example, the wafer layer 510 can include a semiconductor material; the metal gate layer 515 can include HfO2; the third hard mask layer 520 can include TiN: the first silicon-containing layer 525 can include amorphous silicon (a-Si): the second silicon-containing layer 530 can include SiN; the second hard mask layer 535 can include TEOS; the gate-width control layer 540 can include etch control material; the first hard mask features 545a can include etched Si-ARC material, and the etched soft mask features 550a can include etched photoresist material. During a first etch procedure, the pattern of soft mask features 550 can be used to create a pattern of first hard mask features 545a.

The patterned wafers having the first gate stacks 501 thereon can be etched using a first etch procedure to create patterned wafers having the second gate stacks 502 thereon. In some embodiments, an Si-ARC layer etching procedure can be used. Alternatively, other etching procedures may be used. One or more first etch models 561 can be created for the first etch procedure.

During the Si-ARC layer etching procedure, the chamber pressure can range from approximately 12 mT to approximately 18 mT; the top power can vary from approximately 450 watts to approximately 550 watts; the lower power can vary from approximately 90 watts to approximately 110 watts; the ESC voltage can be set at approximately 2500 V; the Tetrafluoromethane ($CF_4$) flow rate can vary between approximately 60 sccm and approximately 100 sccm; the Carbon Hydro-Triflouride ($CHF_3$) flow rate can vary between approximately 40 sccm and approximately 60 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 60 seconds to approximately 90 seconds.

The third model 562 can be a second integrated metrology (IM) model for the second gate stack 502, and can include a second ODP model. The second ODP model 562 can be used to determine profile data for the etched photoresist features 550a and the first hard mask features 545a.

A third gate stack 503 is shown that includes a wafer layer 510, a metal gate layer 515, a third hard mask layer 520, a first silicon-containing layer 525, a second silicon-containing layer 530, a second hard mask layer 535, gate-width control features 540b, and etched first hard mask features 545b. For example, the wafer layer 510 can include a semiconductor material; the metal gate layer 515 can include HfO2; the third hard mask layer 520 can include TiN: the first silicon-containing layer 525 can include amorphous silicon (a-Si): the second silicon-containing layer 530 can include SiN; the second hard mask layer 535 can include TEOS; the gate-width control features 540b can include etched ODL; and the etched first hard mask features 545b can include etched Si-ARC material. During a second etch procedure, the pattern of etched first hard mask features 545b can be used to create a pattern of etched gate-width control features 540b.

The patterned wafers having the second gate stacks 502 thereon can be etched using a second etch procedure to create patterned wafers having the third gate stacks 503 thereon. In some embodiments, an etch-control layer (ECL) etching procedure can be used. Alternatively, other etching procedures may be used. One or more second etch models 563 can be created for the second etch procedure.

During the etch-control layer (ECL) etching procedure, the chamber pressure can range from approximately 15 mT to approximately 25 mT; the top power can vary from approximately 450 watts to approximately 550 watts; the lower power can vary from approximately 90 watts to approximately 110 watts; the ESC voltage can be set at approximately 2500 V; the $O_2$ flow rate can vary between approximately 30 sccm and approximately 50 sccm; the $CO_2$ flow rate can vary between approximately 70 sccm and approximately 90 sccm; the HBr flow rate can vary between approximately 25 sccm and approximately 35 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the temperature at the center of the wafer holder can vary from approximately 12 degrees Celsius to approximately 20 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 90 seconds to approximately 130 seconds.

The fifth model 564 can be a third integrated metrology (IM) model for the third gate stack 503, and can include a third ODP model. The third ODP model 564 can be used to determine profile data for the gate-width control features 540b, and etched first hard mask features 545b.

A fourth gate stack 504 is shown that includes a wafer layer 510, a metal gate layer 515, third hard mask layer 520, first silicon-containing layer 525, second silicon-containing layer 530, and second hard mask features 535c. For example, the wafer layer 510 can include a semiconductor material; the metal gate layer 515 can include $HfO_2$; the third hard mask layer 520 can include TiN: the first silicon-containing layer 525 can include amorphous silicon (a-Si): the second silicon-containing layer 530 can include SiN; the second hard mask features 535c can include TEOS material. During a third etch procedure, the pattern of gate-width control layer features 540b can be used to create the second hard mask features 535c.

The seventh model 566 can be a fourth integrated metrology (IM) model for the fourth gate stack 504, and can include a fourth ODP model. The fourth ODP model 566 can be used to determine profile data for the second hard mask features 535c.

The patterned wafers having the third gate stacks 503 thereon can be etched using a third etch sequence to create patterned wafers having the fourth gate stacks 504 thereon. In some embodiments, a TEOS etch sequence can be used that can include a TEOS layer etching procedure, a TEOS OE etching procedure, and an ashing procedure. Alternatively, other etching, ashing, or cleaning procedures may be used. One or more third etch models 565 can be created for the TEOS etch sequence.

During the TEOS layer etching procedure, the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 50 seconds to approximately 90 seconds.

During the TEOS OE etching procedure, the chamber pressure can range from approximately 35 mT to approximately 45 mT; the top power can vary from approximately 550 watts to approximately 650 watts; the lower power can vary from approximately 90 watts to approximately 110 watts; the ESC voltage can be set at approximately 2500 V; the $CF_4$ flow rate can vary between approximately 40 sccm and approximately 60 sccm; the $CHF_3$ flow rate can vary between approximately 40 sccm and approximately 60 sccm; the $O_2$ flow rate can vary between approximately 3 sccm and approximately 7 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 30 degrees Celsius to approximately 50 degrees Celsius; the temperature at the center of the wafer holder can vary from approximately 25 degrees Celsius to approximately 35 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 5 seconds to approximately 10 seconds.

During the Ashing procedure, the chamber pressure can range from approximately 125 mT to approximately 175 mT; the top power can vary from approximately 350 watts to approximately 450 watts; the lower power can vary from approximately 20 watts to approximately 30 watts; the ESC voltage can be set at approximately 2500 V; the $O_2$ flow rate can vary between approximately 430 sccm and approximately 470 sccm; the top chamber temperature can vary from approximately 30 degrees Celsius to approximately 90 degrees Celsius; the chamber wall temperature can vary from approximately 50 degrees Celsius to approximately 70 degrees Celsius; the bottom chamber temperature can vary from approximately 70 degrees Celsius to approximately 80 degrees Celsius; the temperature at the center of the wafer holder can vary from approximately 70 degrees Celsius to approximately 80 degrees Celsius; the temperature at the edge of the wafer holder can vary from approximately 8 degrees Celsius to approximately 12 degrees Celsius; the center backside pressure for the wafer holder can vary from approximately 15 Torr to approximately 25 Torr; the edge backside pressure for the wafer holder can vary from approximately 27 Torr to approximately 33 Torr; and the processing time can vary from approximately 150 seconds to approximately 210 seconds.

A fifth gate stack 505 is shown that includes a wafer layer 510, a metal gate layer 515, etched third hard mask layer features 520d, etched first silicon-containing layer features 525d, etched second silicon-containing layer features 530d, and etched second hard mask layer features 535d. For example, the wafer layer 510 can include a semiconductor material; the metal gate layer 515 can include $HfO_2$; the etched third hard mask layer features 520d can include TiN: the etched first silicon-containing layer features 525d can include amorphous silicon (a-Si): the etched second silicon-containing layer features 530d can include SiN; and the etched second hard mask layer features 535d can include TEOS. During a fourth etch procedure a cleaning procedure can be performed and the remaining gate-width control layer material 540c can be removed.

The patterned wafers having the fourth gate stacks 504 thereon can be etched using a fourth etch sequence to create patterned wafers having the fifth gate stacks 505 thereon. In some embodiments, a first hard-mask etch sequence can be used that can include a "break-through (BT) etching procedure, a Main-Etch (ME) etching procedure, an Over-Etch (OE) etching procedure, and a Titanium-Nitride (TiN) etching procedure. Alternatively, other etching, ashing, or cleaning procedures may be used. One or more fourth etch models 567 can be created for the first hard-mask etch sequence.

During the BT etching procedure, the chamber pressure can range from approximately 8 mT to approximately 12 mT; the top power can vary from approximately 600 watts to approximately 700 watts; the lower power can vary from approximately 175 watts to approximately 200 watts; the ESC voltage can be set at approximately 2500 V; the $CF_4$ flow rate can vary between approximately 120 sccm and approximately 150 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the wafer holder temperature can vary from approximately 60 degrees Celsius to approximately 70 degrees Celsius; the center backside pressure for the wafer holder can vary from approximately 8 Torr to approximately 12 Torr; the edge backside pressure for the wafer holder can vary from approximately 8 Torr to approximately 12 Torr; and the processing time can vary from approximately 5 seconds to approximately 15 seconds.

During the ME etching procedure, the chamber pressure can range from approximately 8 mT to approximately 12 mT; the top power can vary from approximately 120 watts to approximately 150 watts; the ESC voltage can be set at approximately 2500 V; the $O_2$ flow rate can vary between approximately 2 sccm and approximately 6 sccm; the HBr flow rate can vary between approximately 220 sccm and approximately 280 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 10 degrees Celsius to approximately 30 degrees Celsius; the wafer holder temperature can vary from approximately 60 degrees Celsius to approximately 70 degrees Celsius; the center backside pressure for the wafer holder can vary from approximately 8 Torr to approximately 12 Torr; the edge backside pressure for the wafer holder can vary from approximately 8 Torr to approximately 12 Torr; and the processing time can vary from approximately 50 seconds to approximately 70 seconds.

During the OE etching procedure, the chamber pressure can range from approximately 8 mT to approximately 12 mT; the top power can vary from approximately 120 watts to approximately 150 watts; the lower power can vary from approximately 20 watts to approximately 40 watts; the ESC voltage can be set at approximately 2500 V; the $O_2$ flow rate can vary between approximately 2 sccm and approximately 6 sccm; the HBr flow rate can vary between approximately 220 sccm and approximately 280 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 60 degrees Celsius to approximately 80 degrees Celsius; the wafer holder temperature can vary from approximately 60 degrees Celsius to approximately 70 degrees Celsius; the center backside pressure for the wafer holder can vary from approximately 8 Torr to approximately 12 Torr; the edge backside pressure for the wafer holder can vary from approximately 8 Torr to approximately 12 Torr; and the processing time can vary from approximately 20 seconds to approximately 30 seconds.

During the TiN etching procedure, the chamber pressure can range from approximately 8 mT to approximately 12 mT; the top power can vary from approximately 180 watts to approximately 220 watts; the lower power can vary from approximately 40 watts to approximately 60 watts; the ESC voltage can be set at approximately 2500 V; the chlorine ($Cl_2$) flow rate can vary between approximately 12 sccm and approximately 18 sccm; the Ar flow rate can vary between approximately 180 sccm and approximately 220 sccm; the top chamber temperature can vary from approximately 70 degrees Celsius to approximately 90 degrees Celsius; the chamber wall temperature can vary from approximately 50 degrees Celsius to approximately 70 degrees Celsius; the bottom chamber temperature can vary from approximately 60 degrees Celsius to approximately 80 degrees Celsius; the wafer holder temperature can vary from approximately 60 degrees Celsius to approximately 70 degrees Celsius; the center backside pressure for the wafer holder can vary from approximately 8 Torr to approximately 12 Torr; the edge backside pressure for the wafer holder can vary from approximately 8 Torr to approximately 12 Torr; and the processing time can vary from approximately 50 seconds to approximately 80 seconds.

The ninth model 568 can be a fifth integrated metrology (IM) model for the fifth gate stack 505, and can include a fifth ODP model. The fifth ODP model 568 can be used to determine profile data for the cleaned third hard mask features 520d, the cleaned first silicon-containing layer features 525d, the cleaned second silicon-containing layer features 530d, the cleaned second hard mask features 535d.

A sixth gate stack 506 is shown that includes a wafer layer 510 and metal gate layer features 515e. During a fifth etch procedure, the first third mask layer features 520d, the first silicon-containing layer features 525d, the second silicon-containing layer features 530d, and the second hard mask layer features 535d can be etched to create a pattern of metal gate layer features 515e.

The patterned wafers having the fifth gate stacks 505 thereon can be etched using a fifth etch sequence to create patterned wafers having the sixth gate stacks 506 thereon. In some embodiments, a second hard-mask etch sequence can be used that can include a metal layer (HK) etching procedure. Alternatively, other etching, ashing, or cleaning procedures may be used. One or more fifth etch models 569 can be created for the second hard-mask etch sequence.

During the HK etching procedure, the HK chamber pressure can range from approximately 8 mT to approximately 12 mT; the top power can vary from approximately 550 watts to approximately 650 watts; the ESC voltage can be set at approximately 500 V; the Boron Trichloride (BCl₃) flow rate can vary between approximately 120 sccm and approximately 180 sccm; the top chamber temperature can vary from approximately 70 degrees Celsius to approximately 90 degrees Celsius; the chamber wall temperature can vary from approximately 40 degrees Celsius to approximately 60 degrees Celsius; the bottom chamber temperature can vary from approximately 60 degrees Celsius to approximately 80 degrees Celsius; and the processing time can vary from approximately 30 seconds to approximately 40 seconds.

The eleventh model 570 can be a sixth integrated metrology (IM) model for the sixth gate stack 506, and can include a sixth ODP model. The sixth ODP model 570 can be used to determine profile data for the metal gate layer features 515e.

During process development, Design of Experiment (DOE) techniques can be used to examine the preliminary set of models (560-570) and to develop a reduced set of MLMIMO models.

FIG. 6 illustrates an exemplary view of a second multi-step processing sequence for a creating a metal gate structure in accordance with embodiments of the invention. In the illustrated embodiment, three exemplary gate stacks (601-603) are shown, but this is not required for the invention. Alternatively, a different number of gates stacks, a different number of models, and different configurations may be used.

In some embodiments, the multi-layer metal-gate stacks (601, 602, and 603, FIG. 6) can be created using a first Multi-Layer-Multi-Step (MLMS) processing sequence and a second Multi-Layer-Multi-Step (MLMS) processing sequence. For example, the first MLMS processing sequence can include a Si-ARC layer etching procedure, as described above, and an etch-control layer (ECL) etching procedure, as described above. In addition, the second MLMS processing sequence can include a TEOS layer etching procedure, as described above, a TEOS Over-Etch (OE) etching procedure, as described above, an Ashing procedure, a "Break-Through" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

A first gate stack 601 is shown that includes a wafer layer 610, a metal gate layer 615, a third hard mask layer 620, a first silicon-containing layer 625, a second silicon-containing layer 630, a second hard mask layer 635, a gate-width control layer 640, a first hard mask layer 645, and a pattern of soft mask features 650. For example, the wafer layer 610 can include a semiconductor material; the metal gate layer 615 can include HfO₂; the third hard mask layer 620 can include TiN: the first silicon-containing layer 625 can include amorphous silicon (a-Si): the second silicon-containing layer 630 can include SiN; the second hard mask layer 635 can include TEOS; the gate-width control layer 640 can include ODL; the first hard mask layer 645 can include Si-ARC material, and the soft mask features 650 can include photoresist material.

The first ODP model 660 can be established for the first gate stack 601, and the first ODP model 660 can be used to determine profile data for the photoresist features 650 and other layer-related data. The first ODP model 660 can provide DV data to the MLMIMO Model 661.

The patterned wafers having the first gate stacks 601 thereon can be etched using first MLMS processing sequence to create patterned wafers having the second gate stacks 602 thereon. For example, the first MLMS processing sequence can include an Si-ARC layer etching procedure, as described above, and an etch-control layer (ECL) etching procedure, as described above.

The first MLMS processing sequence can be modeled using a MLMIMO Model 661, and the MLMIMO Model 661 can exchange Measured Variable (MV) data using transfer means 675, can exchange Disturbance Variable (DV) data using transfer means 680, and can exchange Controlled Variable (CV) data using transfer means 685. MLMIMO Model 661 can include MV data, DV data, and CV data associated with the Si-ARC layer etching procedure, and with the etch-control layer (ECL) etching procedure, as described above. The models (660-664) can receive, process, create, and/or send MV data, DV data, and CV data associated with the procedures described herein.

A second gate stack 602 is shown that includes a wafer layer 610, a metal gate layer 615, a third hard mask layer 620, a first silicon-containing layer 625, a second silicon-containing layer 630, a second hard mask layer 635, etched gate-width control features 640a, and etched first hard mask features 645a. For example, the wafer layer 610 can include a semiconductor material; the metal gate layer 615 can include HfO2; the third hard mask layer 620 can include TiN: the first silicon-containing layer 625 can include amorphous silicon (a-Si): the second silicon-containing layer 630 can include SiN; the second hard mask layer 635 can include TEOS; the gate-width control features 640a can include etched ECL material; and the etched first hard mask features 645a can include etched Si-ARC material. During a first MLMS processing sequence, the pattern of soft mask feature 650 can be used to create the pattern of etched first hard mask features 645a and the pattern of etched gate-width control features 640a.

The second ODP model 662 can be established for the second gate stack 602, and the second ODP model 662 can be used to determine profile data for the gate-width control features 640a, the etched first hard mask features 645a, and other layer-related data.

The patterned wafers having the second gate stacks 602 thereon can be etched using a second MLMS processing sequence to create patterned wafers having the third gate stacks 603 thereon. For example, the second MLMS processing sequence can include a TEOS layer etching procedure, as described above, a TEOS Over-Etch (OE) etching procedure, as described above, an Ashing procedure, a "Break-Through" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

The second MLMS processing sequence can be modeled using a second MLMIMO Model 663, and the MLMIMO Model 663 can exchange Measured Variable (MV) data using transfer means 675, can exchange Disturbance Variable (DV) data using transfer means 680, and can exchange Controlled Variable (CV) data using transfer means 685. MLMIMO Model 663 can include MV data, DV data, and CV data associated with the TEOS layer etching procedure, as described above, a TEOS Over-Etch (OE) etching procedure, as described above, an Ashing procedure, a "Break-Through" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

A third gate stack 603 is shown that includes a wafer layer 610 and a pattern of metal gate layer features 615b. For example, the wafer layer 610 can include a semiconductor material; the metal gate layer features 615b can include HfO₂. During a second MLMS processing sequence, the pattern of etched first hard mask features 645a and the pattern of etched gate-width control features 640a can be used to create the pattern of metal gate layer features 615b.

The third ODP model 664 can be established for the third gate stack 603, and the third ODP model 664 can be used to determine profile data for the metal gate layer features 615b and other layer-related data.

During MLMIMO model development, manipulated variables (MVs) can be established and can be fed forward and/or fed back using various paths 675; disturbance variables (DVs) can be established and can be fed forward and/or fed back using various paths 680; and controlled variables (CVs) can be established and can be fed forward and/or fed back using various paths 685. In addition, the number of feed forward and feed back paths (675, 680, and 685) actually used in the MLMIMO model can be optimized. DOE techniques can be used to examine the this set of models (660-664) and to develop a reduced set of feed forward and feed back paths/variables. One or more of the three exemplary gate stacks (601-603) and one or more of the models (660-664) can be used during model development and DOE procedures. Recipe data and/or process data for one or more of the three exemplary gate stacks (601-603) and modeling data for one or more of the models (660-664) can be stored in libraries and used during MLMIMO modeling procedures. In addition, the first and second, MLMS processing sequences can be performed using one or more of the etch subsystems described herein in FIGS. 2A-2G and FIGS. 3A-3G.

FIG. 7 illustrates an exemplary view of a third multi-step modeling sequence for a creating a metal gate structure in accordance with embodiments of the invention. In other embodiments, the multi-layer metal-gate structures (701, 702, and 703, FIG. 7) can be created using a first Multi-Layer-Multi-Step (MLMS) processing sequence and a second Multi-Layer-Multi-Step (MLMS) processing sequence. For example, the first MLMS processing sequence can include a Si-ARC layer etching procedure, as described above, an etch-control layer (ECL) etching procedure, as described above, a TEOS layer etching procedure, as described above, a TEOS Over-Etch (OE) etching procedure, as described above, an Ashing procedure as described above. In addition, the second MLMS processing sequence can include, a "Break-Through" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

A first gate stack 701 is shown that includes a wafer layer 710, a metal gate layer 715, a third hard mask layer 720, a first silicon-containing layer 725, a second silicon-containing layer 730, a second hard mask layer 735, a gate-width control layer 740, a first hard mask layer 745, and a pattern of soft mask features 750. For example, the wafer layer 710 can include a semiconductor material; the metal gate layer 715 can include $HfO_2$; the third hard mask layer 720 can include TiN: the first silicon-containing layer 725 can include amorphous silicon (a-Si): the second silicon-containing layer 730 can include SiN; the second hard mask layer 735 can include TEOS; the gate-width control layer 740 can include Etch Control material; the first hard mask layer 745 can include Si-Arc material, and the soft mask features 750 can include photoresist material.

The first ODP model 760 can be established for the first gate stack 701, and the first ODP model 760 can be used to determine profile data for the photoresist features 750 and other layer-related data.

The patterned wafers having the first gate stacks 701 thereon can be processed using first MLMS processing sequence to create patterned wafers having the second gate stacks 702 thereon. For example, the first MLMS processing sequence can include a Si-ARC layer etching procedure, as described above, an etch-control layer (ECL) etching procedure, as described above, a TEOS layer etching procedure, as described above, a TEOS Over-Etch (OE) etching procedure, as described above, an Ashing procedure, as described above.

The third MLMS processing sequence can be modeled using models (760-764), and the models (760-764) can exchange Measured Variable (MV) data using transfer means 775, can exchange Disturbance Variable (DV) data using transfer means 780, and can exchange Controlled Variable (CV) data using transfer means 785. The models (760-764) can receive, create, process, and/or send MV data, DV data, and CV data associated with the procedures described herein.

A second gate stack 702 is shown that includes a wafer layer 710, a metal gate layer 715, a third hard mask layer 720, a first silicon-containing layer 725, a second silicon-containing layer 730, a etched second hard mask features 735a. For example, the wafer layer 710 can include a semiconductor material; the metal gate layer 715 can include $HfO_2$; the third hard mask layer 720 can include TiN: the first silicon-containing layer 725 can include amorphous silicon (a-Si): the second silicon-containing layer 730 can include SiN; and the second hard mask features 735a can include TEOS. During a first MLMS processing sequence, the pattern of soft mask feature 750 can be used to create the pattern of etched hard mask features 735a.

The second ODP model 762 can be established for the second gate stack 702, and the second ODP model 762 can be used to determine profile data for the etched hard mask features 735a and other layer-related data.

The patterned wafers having the second gate stacks 702 thereon can be etched using a second MLMS processing sequence to create patterned wafers having the third gate stacks 703 thereon. For example, the second MLMS processing sequence can include a "Break-Through" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

The second MLMS processing sequence can be modeled using a second MLMIMO Model 763, and the MLMIMO Model 763 can exchange Measured Variable (MV) data using transfer means 775, can exchange Disturbance Variable (DV) data using transfer means 780, and can exchange Controlled Variable (CV) data using transfer means 785. MLMIMO Model 763 can include MV data, DV data, and CV data associated with a "Break-Through" (BT) etching procedure, as described above, a main etch (ME) etching procedure, as described above, an Over-Etch (OE) etching procedure, as described above, a Titanium-Nitride (TiN) etching procedure, as described above, and a HK etching procedure, as described above.

The third ODP model 764 can be established for the third gate stack 703, and the third ODP model 764 can be used to determine profile data for, the etched metal gate features 715b, and other layer-related data.

During MLMIMO model development, manipulated variables (MVs) can be established and can be fed forward and/or fed back using various paths 775; disturbance variables (DVs) can be established and can be fed forward and/or fed back using various paths 780; and controlled variables (CVs) can be established and can be fed forward and/or fed back using various paths 785. In addition, DOE techniques can be used to examine the this set of models (760-764) and to develop an optimum set of MLMIMO models. One or more of the three exemplary gate stacks (701-703) and one or more of the models (760-764) can be used during model development and DOE procedures. Recipe data and/or process data for one or more of the three exemplary gate stacks (701-703) and modeling data for one or more of the models (760-764) can be stored in libraries and used during MLMIMO modeling procedures. In addition, the first and second, MLMS processing sequences can be performed using one or more of the etch subsystems described herein in FIGS. 2A-2G and FIGS. 3A-3G.

Figure 8:
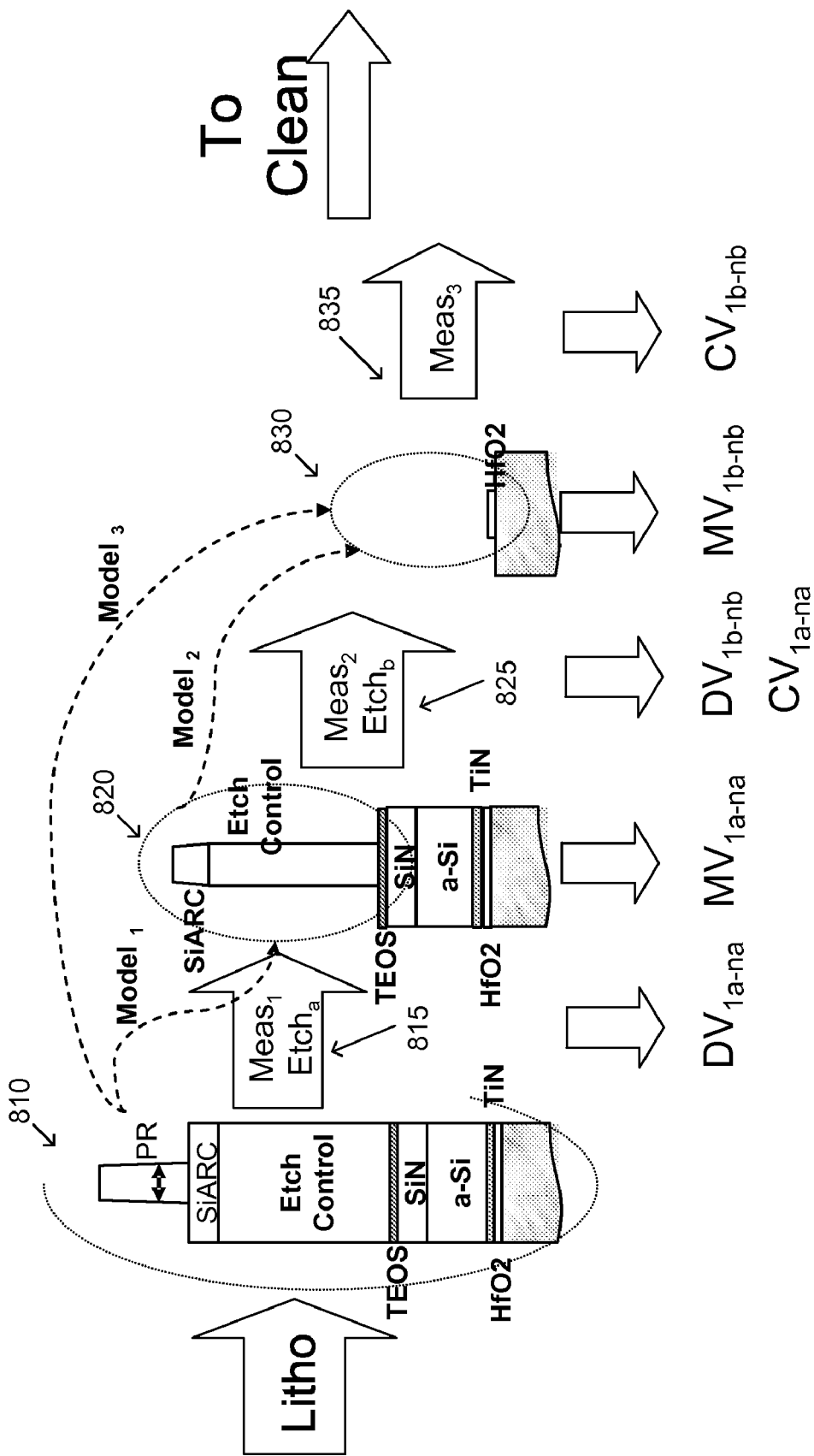
FIG. 8 shows an exemplary schematic view of a Multi-Layer/Multi-Input/Multi-Output (MLMIMO) model in accordance with embodiments of the invention.

FIG. 8 shows an exemplary schematic view of a Multi-Layer/Multi-Input/Multi-Output (MLMIMO) model in accordance with embodiments of the invention. The exemplary schematic view 800 includes a first gate stack 810, a second gate stack 820, and a third gate stack 830. A first processing sequence 815 that can be used to create the second gate stack 820 from the first gate stack 810; a second processing sequence 825 that can be used to create the third gate stack 830 from the second gate stack 820; and a third processing sequence 835 that can be used to measure the third gate stack 830.

The first processing sequence 815 can include a first measurement procedure (Meas$_1$) and a first etch procedure Etch$_a$; the second processing sequence 825 can include a second measurement procedure (Meas$_2$) and a second etch procedure Etch$_b$; and the third processing sequence 835 can include a third measurement procedure (Meas$_3$).

The first model, can be used to model the first processing sequence 815 and can include a first set of disturbance variables $DV_{1a\text{-}na}$, a first set of manipulated variables $MV_{1a\text{-}na}$, and a first set of controlled variables $CV_{1a\text{-}na}$. The second model$_2$ can be used to model the second processing sequence 825 and can include a second set of disturbance variables $DV_{1b\text{-}nb}$, a second set of manipulated variables $MV_{1b\text{-}nb}$, and a second set of controlled variables $CV_{1b\text{-}nb}$.

Figure 9:
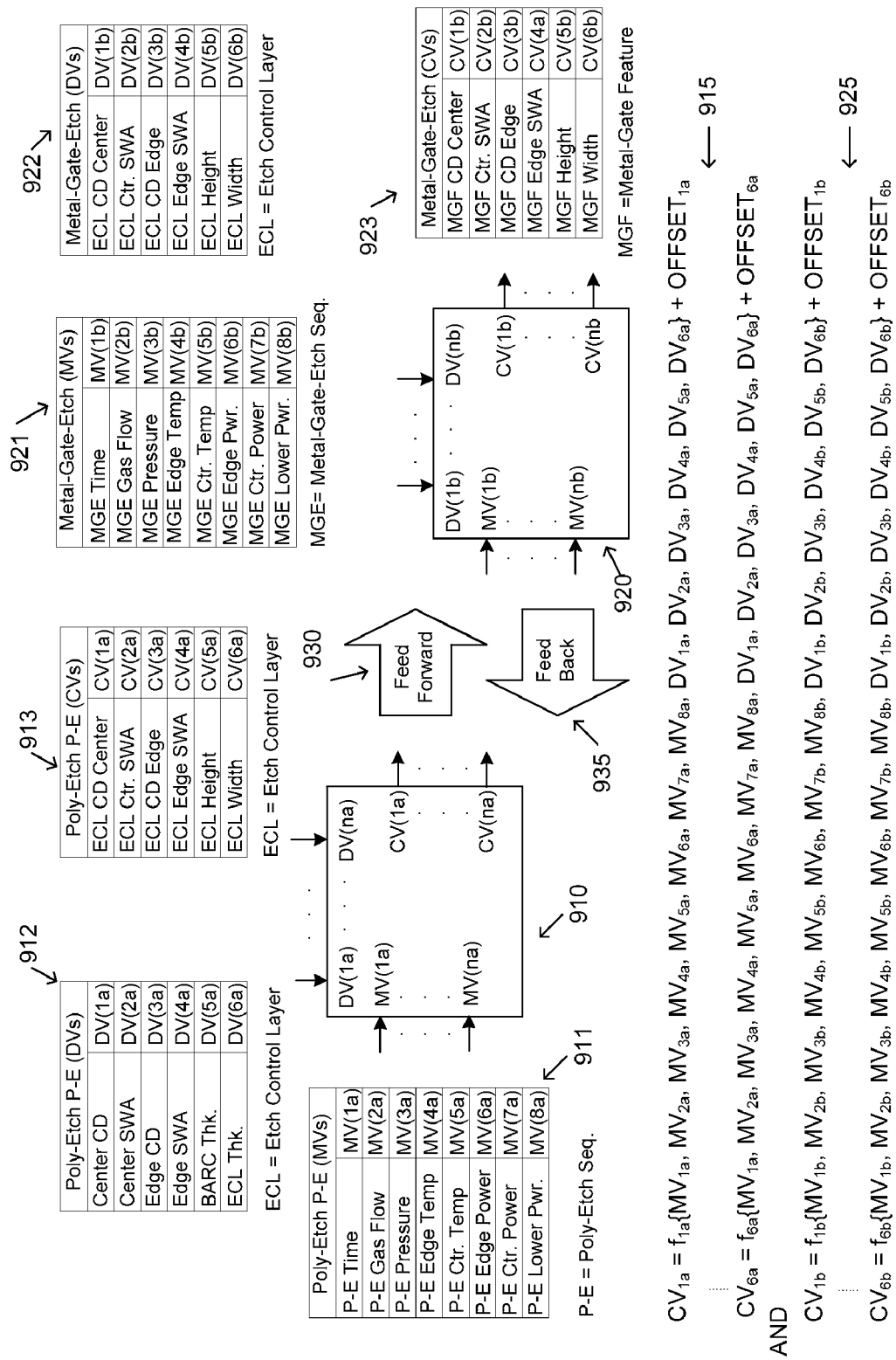
FIG. 9 illustrates exemplary block diagram for a two-part Multi-Layer/Multi-Input/Multi-Output (MLMIMO) model in accordance with embodiments of the invention.

FIG. 9 illustrates exemplary block diagram for a two-part Multi-Layer/Multi-Input/Multi-Output (MLMIMO) model in accordance with embodiments of the invention.

A first generalized model 910 is shown that can be associated with a poly-etch (P-E) sequence and that includes a first set of MVs(1a-na), a first set of DVs(1a-na), and a first set of CVs(1a-na). A first set of exemplary MVs 911 is shown that includes eight manipulated variables {(MV(1a)-MV(8a)) that can be associated with the model 910. Alternatively, a different number of different manipulated variables may be associated with the first model 910. A first set of exemplary DVs 912 is shown that includes six disturbance variables {(DV(1a)-DV(6a)) that can be associated with the model 910. Alternatively, a different number of different disturbance variables may be associated with the first model 910. A first set of exemplary CVs 913 is shown that includes six controlled variables {(CV(1a)-CV(6a)) that can be associated with the model 910. Alternatively, a different number of different controlled variables may be associated with the first model 910. In addition, a first set of exemplary equations 915 is shown that can be associated with the model 910. Alternatively, other equations may be associated with the first model 910.

A second generalized model 920 is shown that can be associated with a metal-gate-etch (MGE) sequence and that includes a second set of MVs(1b-nb), a second set of DVs (1b-nb), and a second set of CVs(1b-nb). A second set of exemplary MVs 921 is shown that includes eight manipulated variables {(MV(1b)-MV(8b)) that can be associated with the second model 920. Alternatively, a different number of different manipulated variables may be associated with the second model 920. A second set of exemplary DVs 922 is shown that includes six disturbance variables {(DV(1b)-DV(6b)) that can be associated with the second model 920. Alternatively, a different number of different disturbance variables may be associated with the second model 920. A second set of exemplary CVs 923 is shown that includes six controlled variables {(CV(1b)-CV(6b)) that can be associated with the second model 920. Alternatively, a different number of different controlled variables may be associated with the second model 920. In addition, a second set of exemplary equations 925 is shown that can be associated with the second model 920. Alternatively, other equations may be associated with the second model 920.

One or more of the variables (911, 912, or 913) associated with the first model 910 can be fed forward 930 to the second model 920, and one or more of the variables (921, 922, or 923) associated with the second model 920 can be fed back 935 to the first model 910.

Figure 10:
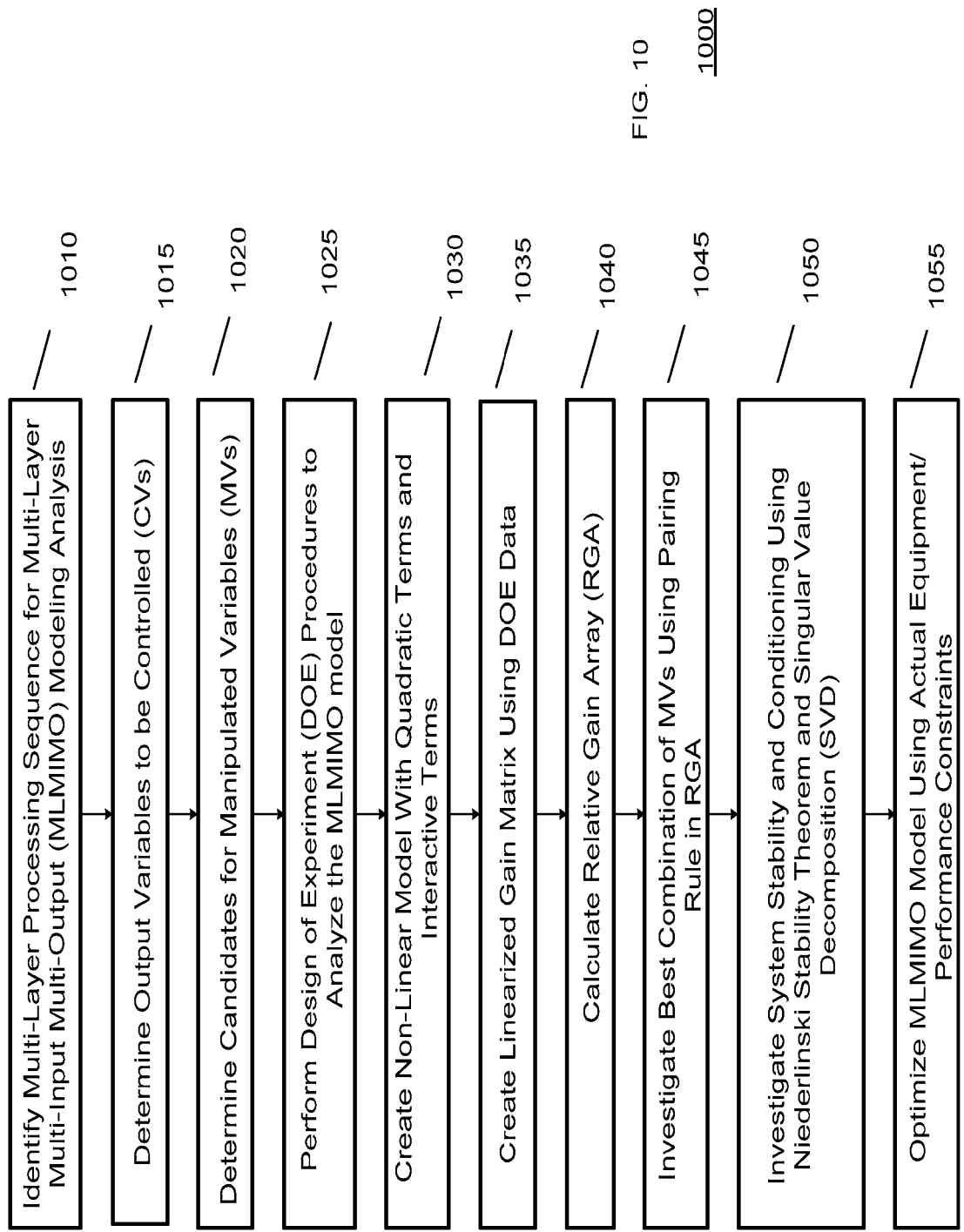
FIG. 10 illustrates an exemplary flow diagram for a procedure for developing a Multi-Layer/Multi-Input/Multi-Output (MLMIMO) model in accordance with embodiments of the invention.

FIG. 10 illustrates an exemplary flow diagram for a procedure for developing a Multi-Layer/Multi-Input/Multi-Output (MLMIMO) model in accordance with embodiments of the invention. In the illustrated embodiment, a procedure 1000 is shown having a number of steps. Alternatively, a different number of alternate steps may be used.

In 1010, one or more multi-layer processing sequences can be identified as candidates for a Multi-Layer/Multi-Input/Multi/Output modeling analysis procedure. In some examples, one or more MLMIMO models can be established to create one or more multi-layer metal-gate structures (601, 602, and 603, FIG. 6) and (701, 702, and 703, FIG. 7).

In 1015, a first set of controlled outputs variables (CVs) and the ranges associated with the CVs can be determined. One or more of the CVs can be specified by an end user or a customer. The CVs can include one or more critical dimensions (CDs) and/or one or more side wall angles associated with one or more of the multi-layer metal-gate structures (601, 602, and 603, FIG. 6) and (701, 702, and 703, FIG. 7). In some example, the multi-layer metal-gate structures (601, 602, and 603, FIG. 6) and (701, 702, and 703, FIG. 7) can be created using a Poly-Etch (PE) processing sequence and a metal-gate etch (MGE) processing sequence. For example, a metal-gate etch (MGE) sequence can be performed to create one or more metal-gate features in the gate stack, and different metal-gate etch sequences can be performed for pFET devices, nFET devices, Tri-gate devices, and FinFET devices.

In 1020, a first set of candidates can be determined for the manipulated variables (MVs) associated with the MLMIMO using one or more candidate recipes. The MVs can include WiW manipulated variables (WiW-MVs), and the WiW-MVs can include "fast" MVs that can be controlled while a wafer is being processed. The MVs can include W2W manipulated variables (W2W-MVs), and the W2W-MVs can include "slow" MVs that can be controlled when a wafer lot is being processed. The ranges for the MVs can be examined for each step in a candidate recipe.

When a two-zone wafer holder with a fast response time is used, the center temperature and the edge temperature for the wafer holder can be used as (WiW-MVs) and can be changed on a step by step basis. When a RF source with a fast response time is used with a split upper electrode and power splitter, the center RF power and the edge RF power for the plasma can be used as (WiW-MVs) and can be changed on a step by step basis. When a low temperature chiller (−10 C) is used, there can be a larger temperature delta center to edge. In addition, pressure, time, and gas flows can be used as MVs.

The disturbance variables (DVs) can include resist CD and SWA at the center and edge, the etch control layer CD and SWA at the center and edge, the layer thicknesses at the center and edge, the chemical and etch rate properties of the different layers, the maintenance events on chamber, the chamber-to-chamber data, and IM-to-IM data.

In 1025, Design of Experiment (DOE) procedures can be performed to analyze the MLMIMO model. Using physical analysis and engineering experience, DOE procedures can be performed to establish statistical models that can connect MVs with each CV. When the number of experiments increases, a more accurate model can be obtained, but at the expense of additional materials and time. Therefore, cost and availability can limit the number of DOE wafers. In order to reduce them as much as possible but also prevent inaccuracy, a well designed DOE is of key importance. The most critical factor for such a DOE is the format of the predicted model. One or more model types can be selected, ranges can be provided for the CVs and/or MVs, and statistical software, such as JMP® (a statistical software from the SAS Institute) can be used to establish one or more of the DOE tables). The DOE data can be used to establish a candidate MVs, CVs, and DVs that can be associated with a first poly-etch (P-E) sequence, and a metal-gate etch (MGE) sequence. In other analysis procedures, other MVs, DVs, and CVs can be used. In some embodiments, the chamber state data for the etching chambers and the IM chambers can be used as manipulated variables, Alternatively, the process modeling may assume that the chamber state is stable between wafers and/or lots.

In some embodiments, the PE processing sequence can include an Si-ARC layer etching procedure, an etch-control layer (ECL) etching procedure, a TEOS layer etching procedure, a TEOS Over-Etch (OE) etching procedure, and an Ashing procedure. In addition, the metal-gate etch (MGE) processing sequence can include a "Break-Through" (BT) etching procedure, a main etch (ME) etching procedure, an Over-Etch (OE) etching procedure, a Titanium-Nitride (TiN) etching procedure, and a HK etching procedure. DOE data can be obtained for the P-E processing sequence and for the metal-gate etch (MGE) processing sequences.

In 1030, after performing the P-E sequences and the metal-gate etch sequences required to populate one or more DOE tables, nonlinear models with quadratic and interaction terms can be created by using a least squares technique and statistical software. In some models, terms can be deleted that have extremely small coefficients associated with them.

In 1035, one or more linear gain matrices (G) can be created using the DOE data. For example, $$\lambda ij = \frac{\left[\frac{\partial CV_i}{\partial MV_j}\right]_{MV_{k,k\neq j}}}{\left[\frac{\partial CV_i}{\partial MV_j}\right]_{CV_{k,k\neq j}}} = \frac{\text{Gain(open-loop)}}{\text{Gain(closed-loop)}}$$

for i=1, 2, . . . , n and j=1, 2, . . . , n. The symbol ($\partial CV_i/\partial MV_j)_{MV}$ denotes a partial derivative that is evaluated with all of the manipulated variables except $MV_j$ held constant, and this term is the open-loop gain between $CV_i$ and $MV_j$. In addition, the symbol ($\partial CV_i/\partial MV_j)_{CV}$ can be interpreted as a closed loop gain that indicates the effect of $MV_j$ and $CV_i$ when all of the control loops are closed.

When a non-square matrix is obtained, some of the MVs or CVs may be eliminated to create a square matrix. In addition, when there are more MV's than CVs, the non-square matrix can be analyzed using a non-square RGA (NRGA). For example, $$\text{NRGA} = G(x) \, (G^+)^T$$

and the pseudo-inverse, $G^+$, is used instead of the normal inverse, $G^{-1}$. NRGA provides several criteria for the selection of a square system, but their criteria are not always valid in some non-square systems, so all combinations of square pairing of subsystems might need considered. To compare one subsystem with others RGA pairing rules can be used as a metric. This creates sub combinations that can then be compared for best square matrix.

In 1040, one or more Relative Gain Arrays (RGA) can be calculated using one or more of the linear gain matrices (G). For example, when square matrices are used, $$\text{RGA} = G(x) \, (G^{-1})^T$$

where G is the gain matrix and $G^{-1}$ is the inverse gain matrix.

In 1045, pairing rules in the RGA can be used to investigate the best combinations of MVs and CVs. RGA analysis can be used for measured model parameter selection, and CV-MV pairs can be selected such that their sum is closest to one. In addition, paring on negative elements can be avoided. In addition, the RGA analysis can be used to determine a number of candidate models and to identify the best case solution. When there are more CVs than MVs, RGA analysis can be used for selecting the most controllable CV (sensitivity analysis of CVs to MVs).

In 1050, the system stability and conditioning can be determined. For example, the Niederlinski Stability Theorem states that a closed loop system resulting from diagonal pairing is unstable if:

$$NST = \frac{\det(G)}{\prod_{i=1}^{n} g_{ii}} < 0$$

where G is the gain matrix and $g_{ii}$ is the diagonal elements of the gain matrix. The condition of the gain matrix (G) can be determined using the following:

$$G = USV^T$$

where G, U, S, and V are matrices determined using singular value decomposition (SVD). In addition, a condition number (CN) can be determined using the ratio of the larger value to the smaller value in the S matrix. Additional information concerning the Niederlinski Theorem may be found in a book (ISBN 1852337761) entitled "Process Control: Theory and Applications" by Jean-Pierre Corriou which is incorporated herein in its entirety. For example, when CN is greater than fifty, the system is nearly singular and will have poor control performance.

In 1055, the MLMIMO model can be optimized using actual equipment and/or performance constraints. In some examples, the measurement locations can be examined and selected to optimize performance, the number of pre- and/or post measurement procedure can be established to optimize performance, the multi-chamber sequences can be examined to optimize throughput. The feedback can be optimized by tuning the EWMA filters. The time constants for the MVs can be determined, and their update frequency can be based on Lot-to-Lot (L2L), W2W, WiW, and process step values. In addition, process center points, CV center points, and MV center points can be examined to optimize performance. Historical data can be used to perform simulations.

The wafers can include one or more layers that can include semiconductor material, carbon material, dielectric material, glass material, ceramic material, metallic material, oxidized material, mask material, or planarization material, or a combination thereof.

In other embodiments, one or more wafers can be processed using a verified MLMIMO model and a verified processing sequence. When a verified MLMIMO model is used, one or more verified metal-gate structures can be created on a test wafer, and when the test wafer is examined, a test reference periodic structure can be used. During the examination, examination data can be obtained from the test reference periodic structure. A best estimate structure and associated best estimate data can be selected from the MLMIMO library that includes verified metal-gate structures and associated data. One or more differences can be calculated between the test reference periodic structure and the best estimate structure from the library, the differences can be compared to matching criteria, creation criteria, or product requirements, or any combination thereof. When matching criteria are used, the test reference periodic structure can be identified as a member of the MLMIMO library, and the test wafer can be identified as a reference "golden" wafer if the matching criteria are met or exceeded. When creation criteria are used, the test reference periodic structure can be identified as a new member of the MLMIMO library, and the test wafer can be identified as a verified reference wafer if the creation criteria are met. When product requirement data is used, the test reference periodic structure can be identified as a verified structure, and the test wafer can be identified as verified production wafer if one or more product requirements are met. Corrective actions can be applied if one or more of the criteria or product requirements are not met. MLMIMO-related confidence data and/or risk data can be established for the test reference structure using the test reference structure data and the best estimate structure data. For example, the MLMIMO evaluation library data can include goodness of fit (GOF) data, creation rules data, measurement data, inspection data, verification data, map data, confidence data, accuracy data, process data, or uniformity data, or any combination thereof.

When metal-gate-related structures are produced and/or examined, accuracy and/or tolerance limits can be used. When these limits are not correct, refinement procedures can be performed. Alternatively, other procedures can be performed, other sites can be used, or other wafers can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

Figure 11:
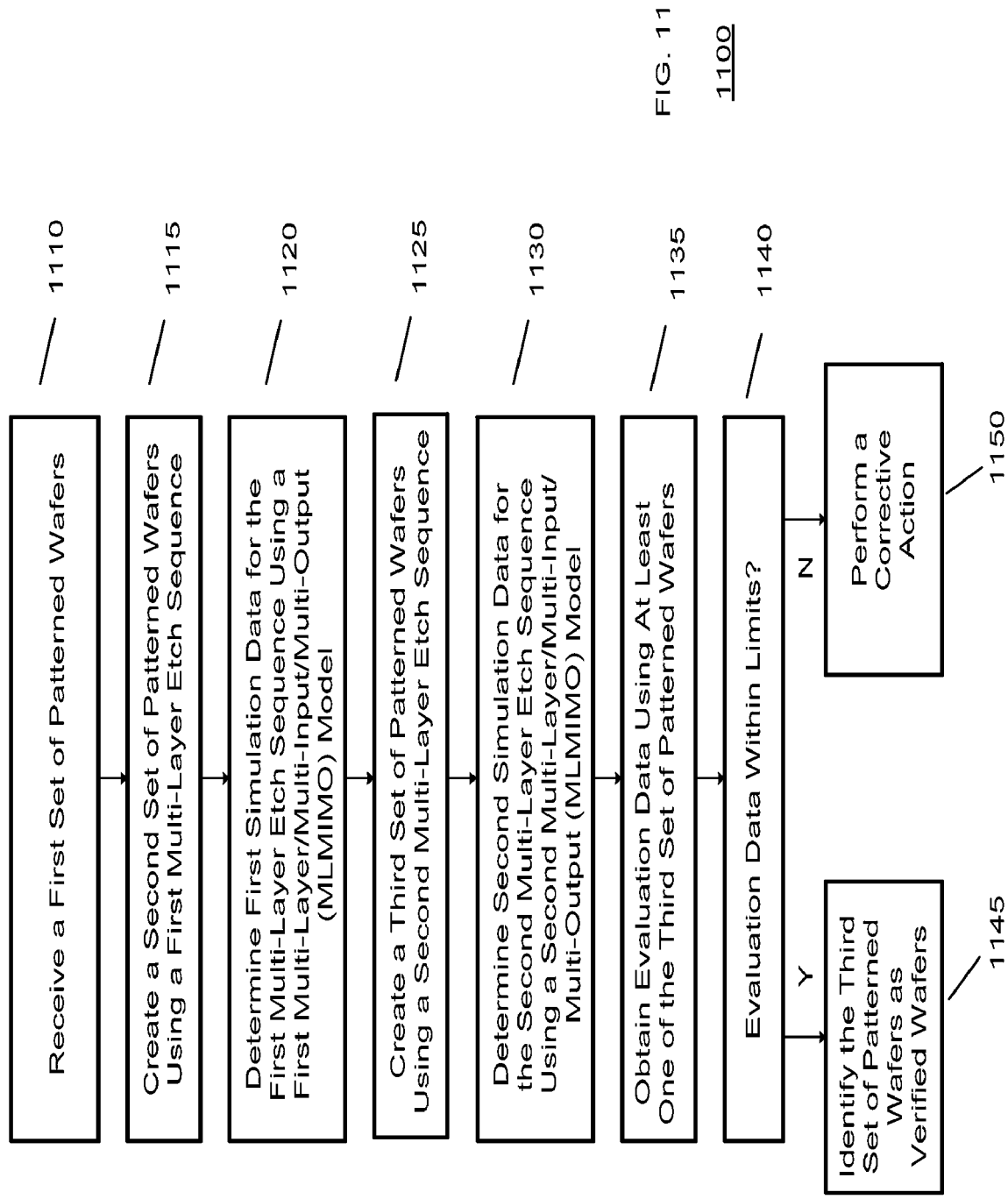
FIG. 11 illustrates a simplified flow diagram of a procedure for using a Multi-Layer/Multi-Input/Multi-Output (MLMIMO) model in accordance with embodiments of the invention.

FIG. 11 illustrates a simplified flow diagram of a procedure for using a Multi-Layer/Multi-Input/Multi-Output (MLMIMO) model in accordance with embodiments of the invention.

In 1110, a first set of patterned wafers and associated wafer data can be received by a processing system, and each patterned wafer can include a first patterned soft-mask layer and a plurality of additional layers. The first patterned soft-mask layer can include a plurality of gate-related soft-mask features and at least one first periodic evaluation structure. The wafer data can include real-time integrated metrology (IM) data for the at least one periodic structure in the first patterned soft-mask layer.

In 1115, a second set of patterned wafers can be created using a first multi-layer etch sequence, and the first multi-layer etch sequence can be configured to create a first intermediate pattern in a controlled masking layer by patterning a first set of the additional layers using the first patterned soft-mask layer.

In 1120, first simulation data can be determined for the first multi-layer etch sequence using a first Multi-Layer/Multi-Input/Multi-Output (MLMIMO) model for the first multi-layer etch sequence. The first MLMIMO model can include a first number ($N_a$) of first Controlled Variables ($CV_{1a}$, $CV_{2a}$, ... $CV_{Na}$), a first number ($M_a$) of first Manipulated Variables ($MV_{1a}$, $MV_{2a}$, ... $MV_{Ma}$), and a first number ($L_a$) of first Disturbance Variables ($DV_{1a}$, $DV_{2a}$, ... $DV_{La}$), where ($L_a$, $M_a$, and $N_a$) are integers greater than one.

In 1125, a third set of patterned wafers can be created using a second multi-layer etch sequence, and the second multi-layer etch sequence can be configured to create a first pattern of metal-gate structures by patterning a second set of the additional layers using the first intermediate pattern in the controlled masking layer.

In 1130, second simulation data can be created for the second multi-layer etch sequence using a second MLMIMO model for the second multi-layer etch sequence. The second MLMIMO model can include a second number ($N_b$) of second Controlled Variables ($CV_{1b}$, $CV_{2b}$, ... $CV_{Nb}$), a second number ($M_b$) of second Manipulated Variables ($MV_{1b}$, $MV_{2b}$, ... $MV_{Mb}$), and a second number ($L_b$) of second Disturbance Variables ($DV_{1b}$, $DV_{2b}$, ... $DV_{Lb}$), where ($L_b$, $M_b$, and $N_b$) are integers greater than one.

In 1135, evaluation data can be obtained for at least one of the third set of patterned wafers.

In 1140, a query can be performed to determine if the evaluation data is within one or more limits. When the evaluation data is within one or more of the limits, procedure 1100 can branch to 1145. When the evaluation data is not within one or more of the limits, procedure 1100 can branch to 1150.

In 1145, the third set of patterned wafers can be identified as verified wafers when the evaluation data is less than a first metal-gate limit.

In 1150, a corrective action can be performed when the evaluation data is not less than the first metal-gate limit.

Figure 12:
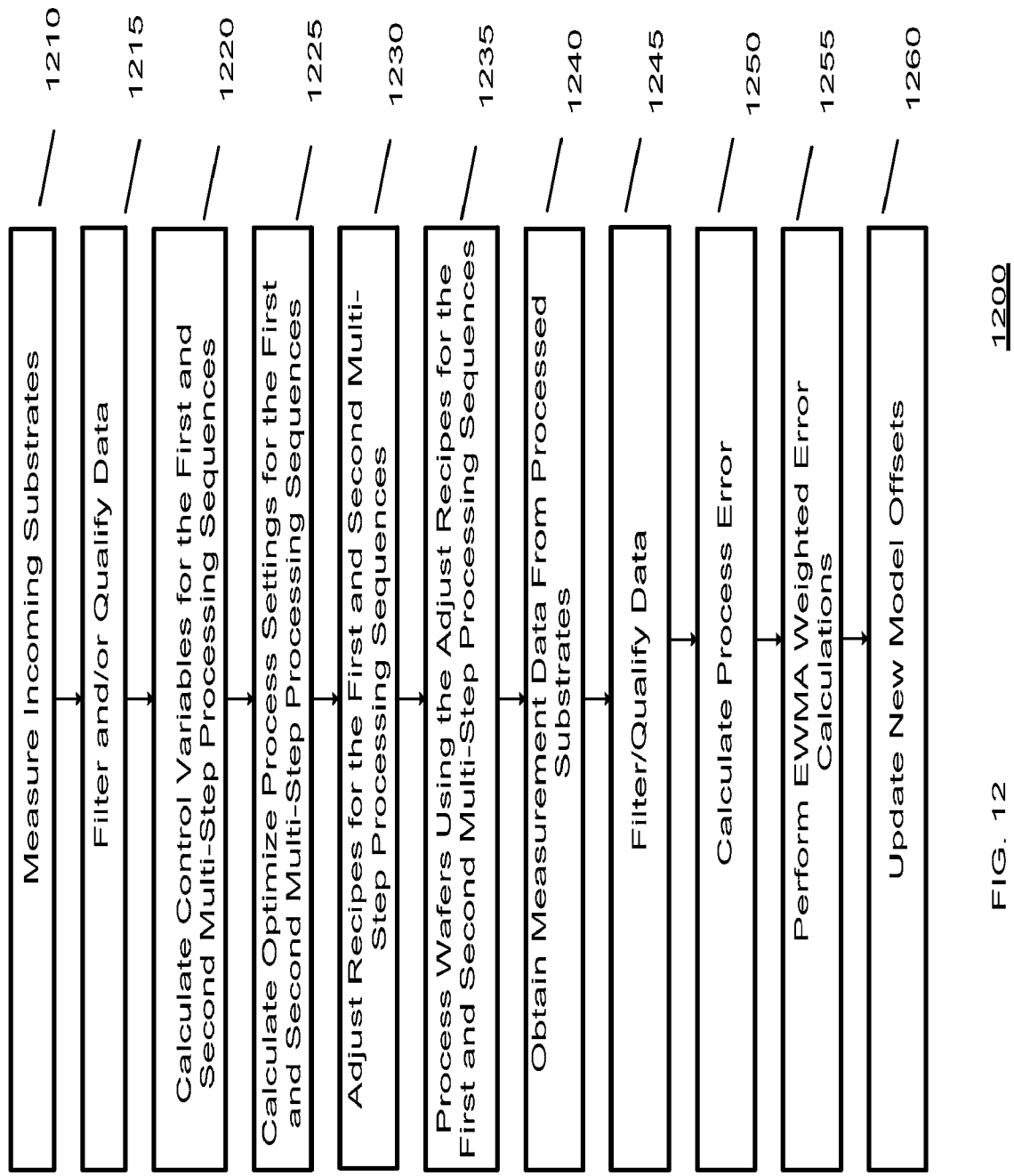
FIG. 12 illustrates a runtime flow diagram of a procedure for using a MLMIMO in accordance with embodiments of the invention.

FIG. 12 illustrates a runtime flow diagram of a procedure for using a MLMIMO in accordance with embodiments of the invention. When data is collected, a number of wafers can be used and candidate disturbance variables can be identified. During data collection, the variations associated with one or more CVs can be minimized, and the collected data can be used for a simulation. The simulation can execute the same sequence as the gate etch process used in production.

In 1210, one or more wafers can be measured in an integrated metrology chamber and values for a first number (I) of disturbance variables DV(I) can be obtained. In addition, other sensor data can be received and analyzed. The IM data can include CD and SWA data from multiple sites in a patterned masking layer on each incoming wafer. A second number (m) of manipulated variables MV(m) can be established.

In some embodiments, the incoming disturbance variables related to wafer state can be measured by using an IM tool, and the IM data can include profile data, CD data, SWA data, and BARC film thickness data at multiple sites across the wafer. For example, 8-10 center sites can be selected that can represent the center of the wafer, and 8-10 edge sites at the same radius can be selected that represent the edge radial signature and that can be optimum for etch control. The same number of sites can be selected for each area of the wafer to give the same weighting of accuracy to all areas. Grating density and transistor type should be selected to correlate to the most critical chip level performance metric (such as P or N channel transistor type) because each of the transistor structures can have some variations that can be related to the etch profile control needs.

The CD DV can be a critical DV and can have associated DVs that modify the measurement due to the mechanisms at work during the Poly-Etch (P-E) procedures. SWA can be a primary modifier that increases in sensitivity as the angle become less than ninety degrees. In addition, the middle CD can be used if it gives the most accurate correlation to the final CD. Middle CD performs the best in simple terms because it averages the variation of the top and bottom CD measurements.

A second modifier of CD can be the BARC thickness variation across the wafer and water-to-wafer. BARC thickness can affect CD if the thickness is non-uniform because during the BARC etch the resist is continuing to be etched. A thinner BARC can give a shorter etch time, and thicker BARC can give a longer etch time, and a longer etch time will result in a smaller CD. Therefore, BARC non-uniformity can directly result in increased center to edge CD variation that will need to be modeled for control during the partial and final etch.

The IM data can be obtained after a development procedure, and the IM data can be obtained using as IM unit in a Lithography subsystem, an IM unit in an Etch subsystem, or a standalone IM unit.

In addition, sensor and state data can be used for DVs indicating a predicted plasma chamber state. For example, when lots (wafers) are being processed without using conditioning wafers, the chamber state can be affected by drift. Variations that contribute to chamber state feed forward DV can include events such as chamber cleans, parts replacements, chemical changes, idle time, conditioning wafers, chamber pause, manual adjustments, wafer material changes, and product density changes.

In 1215, the received data can be filtered and/or qualified. For example, the measurement DVs can be filtered using a box and whisker algorithm that eliminates sites that do not statically appear to be of the same population, and the remaining site can be averaged to represent the physical area of the wafer.

In 1220, one or more of the CVs can be calculated and CDs, SWAs, uniformity values, and/or profile changes can be determined for the poly-etch sequence. In some examples, a third number ($N_a$) of control variables can be established using the following:

$$CV(N_a) = f_{Na}\{MV(1a), \ldots MV(Ma-1), MV(Ma), DV(1a), \ldots DV(La-1), DV(La)\} + \text{offset}_{Na}$$

where $L_a$, $M_a$, and $N_a$ are integers that are greater than two.

For example, when four CVs, six MVs, and four DVs have been identified, four non-linear models with higher order and interaction terms can be defined as:

$$CV(1a) = f_{1a}\{MV(1a), MV(2a), MV(3a), MV(4a), MV(5a), MV(6a), DV(1a), DV(2a), DV(3a), DV(4a)\} + \text{offset}_{1a}$$

$$CV(2a) = f_{2a}\{MV(1a), MV(2a), MV(3a), MV(4a), MV(5a), MV(6a), DV(1a), DV(2a), DV(3a), DV(4a)\} + \text{offset}_{2a}$$

$$CV(3a) = f_{3a}\{MV(1a), MV(2a), MV(3a), MV(4a), MV(5a), MV(6a), DV(1a), DV(2a), DV(3a), DV(4a)\} + \text{offset}_{3a}$$

$$CV(4a) = f_{4a}\{MV(1a), MV(2a), MV(3a), MV(4a), MV(5a), MV(6a), DV(1a), DV(2a), DV(3a), DV(4a)\} + \text{offset}_{4a}$$

In addition, optimized process settings can be calculated using a quadratic objective function, and target deviation CVs can be defined as:

$$t(N_a) = \{DV(La) - \text{target } CV(N_a)\}$$

when Na=4 and La=4 the following equations can be obtained:

$$t(1a) = \{DV(1a) - \text{target } CV(1a)\}$$

$$t(2a) = \{DV(2a) - \text{target } CV(2a)\}$$

$$t(3a) = \{DV(3a) - \text{target } CV(3a)\}$$

$$t(4a) = \{DV(4a) - \text{target } CV(4a)\}.$$

Using the models and the target terms, a first quadratic objective function that can be used for the nonlinear programming associated with the poly-etch sequence can be defined as:

$$\min_{\substack{MV(1a),MV(2a),\\MV(Ma-1),MV(Ma)}} \left\{ \begin{array}{l} \left(\dfrac{t(1a)-}{\dfrac{CV(1a)}{t(1a)}}\right)^2 w_{1a} + \left(\dfrac{t(2a)-}{\dfrac{CV(2a)}{t(2a)}}\right)^2 w_{2a} \ldots + \\ \left(\dfrac{t(Ma-1)-}{\dfrac{CV(Ma-1)}{t(Ma-1)}}\right)^2 w_{ja-1} + \left(\dfrac{t(Ma)-}{\dfrac{CV(Ma)}{t(Ma)}}\right)^2 w_{ja} \end{array} \right\} \quad \text{Eq. 1}$$

and when Na=4 the following simplified equation can be obtained $$\min_{\substack{MV(1a),MV(2a),\\MV(3a),MV(4a)}} \left\{ \begin{array}{l} \left(\dfrac{t(1a)-}{\dfrac{CV(1a)}{t(1a)}}\right)^2 w_{1a} + \left(\dfrac{t(2a)-}{\dfrac{CV(2a)}{t(2a)}}\right)^2 w_{2a} + \\ \left(\dfrac{t(3a)-}{\dfrac{CV(3a)}{t(3a)}}\right)^2 w_{3a} + \left(\dfrac{t(4a)-}{\dfrac{CV(4a)}{t(4a)}}\right)^2 w_{4a} \end{array} \right\} \quad \text{Eq. 1a}$$

and the $w_{ja}$ are weighting factors. In addition, the manipulated variables MV(la) can have upper and lower limits that can be included as inequality constraints and when (la=4) the following can be established:

$$a1 \leq MV(1a) \leq b1$$

$$c1 \leq MV(2a) \leq d1$$

$$e1 \leq MV(3a) \leq f1$$

$$g1 \leq MV(4a) \leq h1 \quad \text{Eq. 2}$$

where a1-h1 are constants that depend on the equipment constraints. The measured CD and SWA values can be used by the optimizer unit to calculate the MV, and the optimizer can determine the poly-etch recipe by minimizing Eq. (1a) with Eq. (2) using nonlinear programming. For example, the MATLAB optimization toolbox can be used for this simulation.

In addition, one or more of the CVs can be calculated, and CDs, SWAs, uniformity values, and/or profile changes can be determined for the metal-gate-etch sequence. In some examples, a third number (Nb) of control variables can be established using the following:

$$CV(Nb) = f_{Nb}\{MV(1b), \ldots MV(Mb-1), MV(Mb), DV(1b), \ldots DV(Lb-1), DV(Lb)\} + \text{offset}_{Nb}$$

where Lb, Mb, and Nb are integers that are greater than two.

For example, when four CVs, six MVs, and four DVs have been identified, four non-linear models with higher order and interaction terms can be defined as:

$$CV(1b) = f_{1b}\{MV(1b), MV(2b), MV(3b), MV(4b), MV(5b), MV(6b), DV(1b), DV(2b), DV(3b), DV(4b)\} + \text{offset}_{1b}$$

$$CV(2b) = f_{2b}\{MV(1b), MV(2b), MV(3b), MV(4b), MV(5b), MV(6b), DV(1b), DV(2b), DV(3b), DV(4b)\} + \text{offset}_{2b}$$

$$CV(3b) = f_{3b}\{MV(1b), MV(2b), MV(3b), MV(4b), MV(5b), MV(6b), DV(1b), DV(2b), DV(3b), DV(4b)\} + \text{offset}_{3b}$$

$$CV(4b) = f_{4b}\{MV(1b), MV(2b), MV(3b), MV(4b), MV(5b), MV(6b), DV(1b), DV(2b), DV(3b), DV(4b)\} + \text{offset}_{4b}$$

In 1225, optimized process settings can be calculated using a quadratic objective function, and target deviation CVs can be defined as:

$$t(Nb) = \{DV(Lb) - \text{target } CV(Nb)\}$$

when Nb=4 and Lb=4 the following equations can be obtained:

$$t(1b) = \{DV(1b) - \text{target } CV(1b)\}$$

$$t(2b) = \{DV(2b) - \text{target } CV(2b)\}$$

$$t(3b) = \{DV(3b) - \text{target } CV(3b)\}$$

$$t(4b) = \{DV(4b) - \text{target } CV(4b)\}.$$

Using the models and the target terms, a second quadratic objective function that can be used for the nonlinear programming associated with the metal-gate-etch sequence can be defined as:

$$\min_{\substack{MV(1b),MV(2b),\\MV(Mb-1),MV(Mb)}} \left\{ \left(\frac{t(1b) - CV(1b)}{t(1b)}\right)^2 w_{1b} + \left(\frac{t(2b) - CV(2b)}{t(2b)}\right)^2 w_{2b} \ldots + \left(\frac{t(Mb-1) - CV(Mb-1)}{t(Mb-1)}\right)^2 w_{jb-1} + \left(\frac{t(Mb) - CV(Mb)}{t(Mb)}\right)^2 w_{jb} \right\} \quad \text{Eq. 3}$$

and when Nb=4 the following simplified equation can be obtained $$\min_{\substack{MV(1b),MV(2b),\\MV(3b),MV(4b)}} \left\{ \left(\frac{t(1b) - CV(1b)}{t(1b)}\right)^2 w_{1b} + \left(\frac{t(2b) - CV(2b)}{t(2b)}\right)^2 w_{2b} + \left(\frac{t(3b) - CV(3b)}{t(3b)}\right)^2 w_{3b} + \left(\frac{t(4b) - CV(4b)}{t(4b)}\right)^2 w_{4b} \right\} \quad \text{Eq. 3a}$$

and the $w_{jb}$ are weighting factors. In addition, the manipulated variables MV(lb) can have upper and lower limits that can be included as inequality constraints and when (lb=4) the following can be established:

$$a2 \leq MV(1b) \leq b2$$

$$c2 \leq MV(2b) \leq d2$$

$$e2 \leq MV(3b) \leq f2$$

$$g2 \leq MV(4b) \leq h2 \quad \text{Eq. 4}$$

where a2-h2 are constants that depend on the equipment constraints. The measured CD and SWA values can be used by the optimizer unit to calculate the MV, and the optimizer can determine the metal-gate-etch recipe by minimizing Eq. (3a) with Eq. (4) using nonlinear programming. For example, the MATLAB optimization toolbox can be used for this simulation.

In 1230, process recipes can be defined for the poly-etch sequence and the metal-gate-etch sequence using one or more of the MVs established by the optimizer, and the process recipes can be adjusted using the new values for the MVs. Nonlinear optimization can be used to treat nonlinear relationships and constraints associated with etch processes to maximize performance of the poly-etch sequence and the metal-gate-etch sequence by adjusting the recipes after each run.

The IM data can be fed forward to the optimizer to calculate the value of manipulated variables (MV). The nonlinear model formulas associated with each controlled variable (CV) can be used with each CV target value. A quadratic objective function can utilize weighting factors to prioritize each CV term in the objective function, and an optimizer in the MLMIMO can be used to determine etch recipe by minimizing or maximizing the objective function with the constraints of MVs using nonlinear programming.

In 1235, one or more of the wafers can be processed using the adjusted recipes. For example, the adjusted recipes can include optimized MVs from the optimizer for the poly-etch sequence and the metal-gate-etch sequence.

In 1240, measurement data can be obtained for one or more of the processed wafers. For example, measurements can be made at one or more sites on the wafer. The output CVs can be measured using the IM tool after the poly-etch sequence is performed and/or after the metal-gate-etch sequence is performed.

In 1245, the data obtained from the poly-etch sequence and/or the metal-gate-etch sequence can be filtered and/or qualified.

In 1250, a process error can be calculated for the poly-etch sequence and the metal-gate-etch sequence. For example, errors (actual outputs minus model outputs) can be calculated for each CV.

In 1255, feedback data items can be calculated for the poly-etch sequence and the metal-gate-etch sequence. For example, errors can be used to update the MLMIMO model CVs offsets using an exponentially weighted moving average (EWMA) filter.

In 1260, new model offsets can be updated for the poly-etch sequence and/or the metal-gate-etch sequence. These offset values can be provided to the optimizer unit to be used for compensating the disturbance for next run. This offset is used until a new update comes out. This procedure can be performed until the final wafer is processed.

When send-ahead wafer are used, IM data can be obtained at intermediate points in the poly-etch sequence and the metal-gate-etch sequence. When new and/or additional measurement data, inspection data, and/or evaluation data is required, additional MLMIMO data can be obtained from one or more sites on the wafer. For example, measurement structures, such as periodic gratings, periodic arrays, and/or other periodic structures, on a wafer can be measured at one or more sites.

In a first alternate embodiment, the first multi-layer etch sequence can further include: a1) transferring a first patterned to a first multi-zone temperature-controlled wafer holder in a first etching chamber using a transfer subsystem coupled to the first etching chamber, wherein the transfer subsystem is configured to prevent an oxide layer from forming on the first patterned during the transferring; a2) performing a first etch procedure in the first multi-layer etch sequence wherein the first etch procedure is configured to create a first set of patterned layers using the first patterned soft-mask layer, the first set of patterned layers including an etched first hard mask layer having a plurality of first hard mask features, and an etched soft-mask layer having a plurality of etched soft mask features, wherein the first hard-mask layer comprises a silicone-containing anti-reflective coating (ARC) material; a3) performing a second etch procedure in the first multi-layer etch sequence wherein the second etch procedure is configured to create a first intermediate pattern in a second set of patterned layers using the etched first hard mask layer, the second set of patterned layers including a re-etched first hard mask layer having a plurality of etched first hard mask features, and an etched gate-width control layer having a plurality of gate-width control features, wherein the first intermediate pattern includes at least one second periodic evaluation structure, wherein the gate-width control layer comprises a modified photoresist material; a4) obtaining first evaluation data for the first patterned using the at least one second periodic evaluation structure.

In a second alternate embodiment, the first multi-layer etch sequence can further include: b1) transferring the first patterned to a second temperature-controlled wafer holder in a second etching chamber using the transfer subsystem coupled to the second etching chamber, wherein the transfer subsystem is configured to prevent an oxide layer from forming on the first patterned during the transferring, the first patterned being transferred after the first multi-layer etch sequence is identified as a verified multi-layer etch sequence; b2) performing a third etch procedure, wherein the third etch procedure is configured to create a second intermediate pattern in a third set of patterned layers using the re-etched first hard mask layer and/or the etched gate-width control layer, the third set of patterned layers including a re-etched gate-width control layer having a plurality of etched gate-width control features, an etched second hard-mask layer (titanium-nitride (TiN)) layer having a plurality of second hard mask features, an etched silicone-nitride (SiN) layer having a plurality of silicone-nitride (SiN) features, an etched amorphous silicone (a-Si) layer having a plurality of amorphous silicone (a-Si) features, and an etched second hard-mask (TEOS) layer having a plurality of second hard-mask features; b3) transferring the first patterned to a third temperature-controlled wafer holder in a first cleaning chamber using the transfer subsystem coupled to the first cleaning chamber, wherein the transfer subsystem is configured to prevent an oxide layer from forming on the first patterned during the transferring; b4) performing a first cleaning procedure in the second multi-layer etch sequence wherein a fourth set of patterned masking layers is created, wherein the fourth set of patterned masking layers comprises a cleaned second hard-mask (TEOS) layer having a plurality of cleaned second hard-mask features, a cleaned silicone-nitride (SiN) layer having a plurality of cleaned silicone-nitride (SiN) features, a cleaned amorphous silicone (a-Si) layer having a plurality of cleaned amorphous silicone (a-Si) features, a cleaned third hard-mask layer (titanium-nitride (TiN)) layer having a plurality of cleaned third hard mask features; b5) transferring the first patterned to a fourth temperature-controlled wafer holder in a fourth etching chamber using the transfer subsystem coupled to the fourth etching chamber, wherein the transfer subsystem is configured to prevent an oxide layer from forming on the first patterned during the transferring; b6) performing a fourth etch procedure in the second multi-layer etch sequence wherein the fourth etch procedure is configured to create a fourth intermediate pattern in a fourth set of patterned layers using the cleaned second hard-mask (TEOS) layer, the cleaned silicone-nitride (SiN) layer, the cleaned amorphous silicone (a-Si) layer, or the cleaned third hard-mask layer (titanium-nitride (TiN)) layer, or any combination thereof, the fourth set of patterned layers including a plurality of gate stacks, each gate stack comprising a metal-containing feature, a titanium-nitride (TiN) feature, an amorphous silicon feature, a silicone-nitride (SiN) feature and a TEOS feature; b7) obtaining additional evaluation data for the first patterned using at least one additional periodic evaluation structure, wherein the fourth intermediate pattern comprising the at least one additional periodic evaluation structure; b8) identifying the second multi-layer etch sequence as a second verified multi-layer etch sequence when the additional evaluation data is less than a first additional multi-etch limit; and b9) performing an additional corrective action when the additional evaluation data is not less than the first additional multi-etch limit.

In a third alternate embodiment, the second multi-layer etch sequence can include: c1) transferring a first patterned in the second set of patterned wafers to a second temperature-controlled wafer holder in a second etching chamber using the transfer subsystem coupled to the second etching chamber, wherein the transfer subsystem is configured to prevent an oxide layer from forming on the first patterned during the transferring, the second multi-layer etch sequence being performed after the first multi-layer etch sequence is verified, the third etch procedure in the second multi-layer etch sequence, wherein the second set of patterned wafers comprises a plurality of partially-etched wafers; c2) performing a third etch procedure in the second multi-layer etch sequence etching a second set of the additional layers on the first partially-etched wafer using a third etch procedure in the second multi-layer etch sequence, the third etch procedure creating a third set of patterned masking layers by using the intermediate pattern in the second set of masking layers, wherein the second set of the additional layers comprise a TEOS layer, a silicone-nitride (SiN) layer, an amorphous silicon layer and a titanium-nitride (TiN) layer; c3) transferring the first patterned to a third temperature-controlled wafer holder in a first cleaning chamber using the transfer subsystem coupled to the first cleaning chamber, wherein the transfer subsystem is configured to prevent an oxide layer from forming on the first patterned during the transferring; c4) performing a first cleaning procedure wherein a fourth set of patterned masking layers is created; c5) transferring the first patterned to a fourth temperature-controlled wafer holder in a fourth etching chamber using the transfer subsystem coupled to the fourth etching chamber, wherein the transfer subsystem is configured to prevent an oxide layer from forming on the first patterned during the transferring; c6) performing a fourth etch procedure in the second multi-layer etch sequence, wherein the fourth etch procedure is configured to create a fifth set of patterned masking layers using the fourth set of patterned masking layers, the fifth set of patterned masking layers including a plurality of gate stacks, each gate stack comprising a metal-containing feature, a titanium-nitride (TiN) feature, an amorphous silicon feature, a silicone-nitride (SiN) feature and a TEOS feature; c7) obtaining additional evaluation data for the first patterned using at least one additional periodic evaluation structure; c8) identifying the second multi-layer etch sequence as a second verified multi-layer etch sequence when the additional evaluation data is less than a first additional multi-etch limit; and c9) performing an additional corrective action when the additional evaluation data is not less than the first additional multi-etch limit.

In some embodiments, the historical and/or real-time data can include MLMIMO maps, wafer-related maps, process-related maps, damage-assessment maps, reference maps, measurement maps, prediction maps, risk maps, inspection maps, verification maps, evaluation maps, particle maps, and/or confidence map(s) for one or more wafers. In addition, some MLMIMO procedures may use wafer maps that can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof.

When wafer maps are created and/or modified, values may not be calculated and/or required for the entire wafer, and a wafer map may include data for one or more sites, one or more chip/dies, one or more different areas, and/or one or more differently shaped areas. For example, a processing chamber may have unique characteristics that may affect the quality of the processing results in certain areas of the wafer. In addition, a manufacturer may allow less accurate process and/or evaluation data for chips/dies in one or more regions of the wafer to maximize yield. When a value in a map is close to a limit, the confidence value may be lower than when the value in a map is not close to a limit. In addition, the accuracy values can be weighted for different chips/dies and/or different areas of the wafer. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a wafer. For example, values from another map may be used as weighting factors.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method for using a Multi-Layer/Multi-Input/Multi-Output (MLMIMO) model comprising:

receiving a first set of patterned wafers and associated wafer data, each patterned wafer having a first patterned soft-mask layer and a plurality of additional layers, the first patterned soft-mask layer including a plurality of metal-gate-related soft-mask features and at least one first periodic evaluation structure, the wafer data including real-time integrated metrology (IM) data for the at least one first periodic evaluation structure in the first patterned soft-mask layer;

establishing a first Multi-Layer-Multi-Step (MLMS) processing sequence, wherein the first MLMS processing sequence comprises a first set of Poly-Etch procedures and is configured to establish a first gate-width control pattern in a first set of the additional layers using the first patterned soft-mask layer;

creating a second set of patterned wafers using the first MLMS processing sequence;

creating first simulation data for the first MLMS processing sequence using a first Multi-Layer/Multi-Input/Multi-Output (MLMIMO) model for the first MLMS processing sequence, wherein the first MLMIMO model includes a first number ($N_a$) of first Controlled Variables ($CV_{1a}$, $CV_{2a}$, ... $CV_{Na}$), a first number ($M_a$) of first Manipulated Variables ($MV_{1a}$, $MV_{2a}$, ... $MV_{Ma}$), and a first number ($L_a$) of first Disturbance Variables ($DV_{1a}$, $DV_{2a}$, ... $DV_{La}$), wherein ($L_a$, $M_a$, and $N_a$) are integers greater than one;

establishing a second MLMS processing sequence, wherein the second MLMS processing sequence is configured to create a first controlled pattern of metal-gate structures by patterning a second set of the additional layers using the first gate-width control pattern;

creating a third set of patterned wafers using the second MLMS processing sequence;

creating second simulation data for the second MLMS processing sequence using a second MLMIMO model for the second MLMS processing sequence, wherein the second MLMIMO model includes a second number ($N_b$) of second Controlled Variables ($CV_{1b}$, $CV_{2b}$, ... $CV_{Nb}$), a second number ($M_b$) of second Manipulated Variables ($MV_{1b}$, $MV_{2b}$, ... $MV_{Mb}$), and a second number ($L_b$) of second Disturbance Variables ($DV_{1b}$, $DV_{2b}$, ... $DV_{Lb}$), wherein ($L_b$, $M_b$, and $N_b$) are integers greater than one;

obtaining evaluation data for at least one of the third set of patterned wafers;

identifying the third set of patterned wafers as verified wafers when the evaluation data is less than a first metal-gate limit; and performing a corrective action when the evaluation data is not less than the first metal-gate limit.

2. The method of claim 1, wherein a cleaning sequence is performed using the first set of patterned wafers, the second set of patterned wafers, or the third set of patterned wafers, or any combination thereof.

3. The method of claim 1, further comprising:

establishing the first number ($L_a$) of the first Disturbance Variables ($DV_{1a}$, $DV_{2a}$, ... $DV_{La}$) using the real-time IM data associated with the first set of patterned wafers or additional measurement data;

establishing the first number ($M_a$) of first Manipulated Variables ($MV_{1a}$, $MV_{2a}$, ... $MV_{Ma}$) using a first etching chamber, wherein the first set of ($MV_{1a}$, $MV_{2a}$, ... $MV_{Ma}$) includes one or more Within-Wafer Manipulated Variables (WiW-MVs) configured to change while a wafer is being processed, and one or more Wafer-to- Wafer- Manipulated Variables (W2W-MVs) configured to change after the wafer has been processed; and calculating the first number ($N_a$) of first Controlled Variables ($CV_{1a}, CV_{2a}, \ldots CV_{Na}$), wherein $$CV(N_a) = f_{Na}\{MV_{1a}, \ldots MV_{Ma-1}, MV_{MA}, DV_{1a}, \ldots DV_{La-1}, DV_{La}\} + OFFSET(N_a).$$

4. The method of claim 1, further comprising:

establishing the second number ($L_b$) of second Disturbance Variables ($DV_{1b}, DV_{2b}, \ldots DV_{Lb}$) using the real-time IM data associated with the second set of patterned wafers;

establishing the second number ($M_b$) of second Manipulated Variables ($MV_{1b}, MV_{2b}, \ldots MV_{Mb}$) using a second etching chamber, wherein the second set of second ($MV_{1b}, MV_{2b}, \ldots MV_{Mb}$) includes one or more Within-Wafer Manipulated Variables (WiW-MVs) configured to change while a wafer is being processed, and one or more Wafer-to-Wafer-Manipulated Variables (W2W-MVs) configured to change after the wafer has been processed; and calculating the second number ($N_b$) of second Controlled Variables ($CV_{1b}, CV_{2b}, \ldots CV_{Nb}$), wherein $$CV(N_b) = f_{Nb}\{MV_{1b}, \ldots MV_{Mb-1}, MV_{Mb}, DV_{1b}, \ldots DV_{Lb-1}, DV_{Lb}\} + OFFSET(N_b).$$

5. The method of claim 1, wherein the first Disturbance Variables ($DV_{1,1}, DV_{1,2}, \ldots DV_{1,N1}$) comprises a first critical dimension (CD) of a first evaluation feature associated with a wafer edge, a second CD of a second evaluation feature associated with a wafer center, a first sidewall angle of the first evaluation feature associated with the wafer edge, a second sidewall angle of the second evaluation feature associated with the wafer center, a soft-mask layer thickness, a layer thickness for at least one of the additional layers an etch rate for the soft-mask layer, etch rates for one or more one of the additional layers, at least one etch chamber parameter, at least one integrated metrology (IM) device parameter, and at least one chamber maintenance parameter.

6. The method as claimed in claim 1, the first MLMS processing sequence further comprising:

transferring a first patterned to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a first hard-mask layer etching procedure, wherein a first hard-mask layer comprises a Silicon-containing Anti-Reflective Coating (ARC) material and the first hard-mask layer etching procedure comprises;

establishing a first chamber pressure in the first etching chamber, wherein the first chamber pressure ranges from approximately 12 mT to approximately 18 mT;

establishing a first edge temperature and a first center temperature for the first multi-zone temperature-controlled wafer holder for a first time during the first hard-mask layer etching procedure, the first center temperature being between approximately 12 degrees Celsius and 20 degrees Celsius, the first edge temperature being between approximately 8 degrees Celsius and 12 degrees Celsius, and wherein a low temperature chiller is coupled to the first multi-zone temperature-controlled wafer holder, the low temperature chiller operating between approximately −20 degrees Celsius and 10 degrees Celsius during the first time;

establishing a first edge backside pressure and a first center backside pressure using a dual backside gas system in the first multi-zone temperature-controlled wafer holder, the first center backside pressure being between approximately 15 Torr and 25 Torr, the first edge backside pressure being between approximately 27 Torr and 33 Torr;

providing a first process gas into the first etching chamber during the first hard-mask layer etching procedure, wherein the first process gas includes $CF_4$ and $CHF_3$, a $CF_4$ flow rate varying between approximately 60 sccm and approximately 100 sccm and a first $CHF_3$ flow rate varying between approximately 40 sccm and approximately 60 sccm, wherein a gas injection system is configured to provide the first process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 450 watts to approximately 550 watts and the second RF power ranging from approximately 10 watts to approximately 100 watts during the first hard-mask layer etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, the first RF power ranging from approximately 450 watts to approximately 550 watts and the lower RF power ranging from approximately 90 watts to approximately 110 watts during the first hard-mask layer etching procedure.

7. The method as claimed in claim 6, further comprising:

creating a first simulation data subset for the first MLMS processing sequence using a first reduced MLMIMO model for the first hard-mask layer etching procedure, wherein the first reduced MLMIMO model includes a first reduced number ($N_{a1}$) of first Controlled Variables ($CV_{1a1}, CV_{2a1}, \ldots CV_{Na1}$), a first reduced number ($M_{a1}$) of first Manipulated Variables ($MV_{1a1}, MV_{2a1}, \ldots MV_{Ma1}$), and a first reduced number ($L_{a1}$) of the first Disturbance Variables ($DV_{1a1}, DV_{2a1}, \ldots DV_{La1}$), wherein ($L_{a1}, M_{a1},$ and $N_{a1}$) are integers greater than one;

obtaining evaluation data for the first hard-mask layer etching procedure;

determining risk data for the first hard-mask layer etching procedure using differences between the first simulation data subset and the evaluation data for the first hard-mask layer etching procedure;

identifying the first hard-mask layer etching procedure as a verified procedure when first risk data is less than a first risk limit; and identifying the first hard-mask layer etching procedure as a non-verified procedure when the first risk data is not less than the first risk limit.

8. The method as claimed in claim 1, the first MLMS processing sequence further comprising:

transferring a first patterned to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Si-ARC layer etching procedure;

performing a first etch-control layer (ECL) etching procedure, wherein the ECL comprises a gate-width control material and the ECL etching procedure comprises;

establishing a first chamber pressure in the first etching chamber, wherein the first chamber pressure ranges from approximately 15 mT to approximately 25 mT;

establishing a first edge temperature and a first center temperature for the first multi-zone temperature-controlled wafer holder during the ECL etching procedure, the first center temperature being between approximately 12 degrees Celsius and 20 degrees Celsius, the first edge temperature being between approximately 8 degrees Celsius and 12 degrees Celsius, and wherein a low temperature chiller is coupled to the first multi-zone temperature-controlled wafer holder, the low temperature chiller operating between approximately −20 degrees Celsius and 10 degrees Celsius;

establishing a first edge backside pressure and a first center backside pressure using a dual backside gas system in the first multi-zone temperature-controlled wafer holder, the first center backside pressure being between approximately 15 Torr and 20 Torr, the first edge backside pressure being between approximately 27 Torr and 33 Torr;

providing a second process gas into the first etching chamber during the ECL etching procedure, wherein the second process gas includes $O_2$, $CO_2$, and HBr, a second $O_2$ flow rate varying between approximately 30 sccm and approximately 50 sccm, a second $CO_2$ flow rate varying between approximately 70 sccm and approximately 90 sccm and a second HBr flow rate varying between approximately 25 sccm and approximately 35 sccm, wherein a gas injection system is configured to provide the second process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 450 watts to approximately 550 watts and the second RF power ranging from approximately 10 watts to approximately 100 watts during the a first hard-mask layer etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 90 watts to approximately 110 watts during the first hard-mask layer etching procedure.

9. The method as claimed in claim 8, further comprising:

creating a first simulation data subset for the first MLMS processing sequence using a first reduced MLMIMO model for the first ECL etching procedure, wherein the first reduced MLMIMO model includes a first reduced number ($N_{a1}$) of first Controlled Variables ($CV_{1a1}$, $CV_{2a1}$, ... $CV_{Na1}$), a first reduced number ($M_{a1}$) of first Manipulated Variables ($MV_{1a1}$, $MV_{2a1}$, ... $MV_{Ma1}$), and a first reduced number ($L_{a1}$) of the first Disturbance Variables ($DV_{1a1}$, $DV_{2a1}$, ... $DV_{La1}$), wherein ($L_{a1}$, $M_{a1}$, and $N_{a1}$) are integers greater than one;

obtaining evaluation data for the first ECL etching procedure;

determining risk data for the first ECL etching procedure using differences between the first simulation data subset and the evaluation data for the first ECL etching procedure;

identifying the first ECL etching procedure as a verified procedure when first risk data is less than a first risk limit; and identifying the first ECL etching procedure as a non-verified procedure when the first risk data is not less than the first risk limit.

10. The method as claimed in claim 1, the second MLMS processing sequence further comprising:

transferring a first patterned to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Si-ARC layer etching procedure, and/or an Etch-Control Layer (ECL) etching procedure;

performing a second hard-mask layer etching procedure, wherein a second hard-mask layer comprises Tetraethyl Orthosilicate (TEOS) material and the second hard-mask layer etching procedure comprises;

establishing a first chamber pressure in the first etching chamber during the second hard-mask layer etching procedure, wherein the first chamber pressure ranges from approximately 35 mT to approximately 45 mT;

establishing a first edge temperature and a first center temperature for the first multi-zone temperature-controlled wafer holder for a first time during a first hard-mask layer etching procedure, the first center temperature being between approximately 25 degrees Celsius and approximately 35 degrees Celsius, the first edge temperature being between approximately 8 degrees Celsius and approximately 12 degrees Celsius, and wherein a low temperature chiller is coupled to the first multi-zone temperature-controlled wafer holder, the low temperature chiller operating between approximately −20 degrees Celsius and 10 degrees Celsius during the first time;

establishing a first edge backside pressure and a first center backside pressure using a dual backside gas system in the first multi-zone temperature-controlled wafer holder, the first center backside pressure being between approximately 15 Torr and 25 Torr, the first edge backside pressure being between approximately 27 Torr and 33 Torr; providing a first process gas into the first etching chamber during the second hard-mask layer etching procedure, wherein the first process gas includes $CF_4$, $CHF_3$, and $O_2$, a first $CF_4$ flow rate varying between approximately 40 sccm and approximately 60 sccm, a first $CHF_3$ flow rate varying between approximately 40 sccm and approximately 60 sccm and a first $O_2$ flow rate varying between approximately 3 sccm and approximately 7 sccm, wherein a gas injection system is configured to provide the first process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 550 watts to approximately 650 watts and the second RF power ranging from approximately 50 watts to approximately 150 watts during the second hard-mask layer etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 90 watts to approximately 110 watts during the second hard-mask layer etching procedure.

11. The method as claimed in claim 10, further comprising:
creating a first simulation data subset for the first MLMS processing sequence using a first reduced MLMIMO model for the second hard-mask layer etching procedure, wherein the first reduced MLMIMO model includes a first reduced number ($N_{a1}$) of first Controlled Variables ($CV_{1a1}$, $CV_{2a1}$, ... $CV_{Na1}$), a first reduced number ($M_{a1}$) of first Manipulated Variables ($MV_{1a1}$, $MV_{2a1}$, ... $MV_{Ma1}$), and a first reduced number ($L_{a1}$) of the first Disturbance Variables ($DV_{1a1}$, $DV_{2a1}$, ... $DV_{La1}$), wherein ($L_{a1}$, $M_{a1}$, and $N_{a1}$) are integers greater than one;

obtaining evaluation data for the second hard-mask layer etching procedure;

determining risk data for the second hard-mask layer etching procedure using differences between the first simulation data subset and the evaluation data for the second hard-mask layer etching procedure;

identifying the second hard-mask layer etching procedure as a verified procedure when first risk data is less than a first risk limit; and identifying the second hard-mask layer etching procedure as a non-verified procedure when the first risk data is not less than the first risk limit.

12. The method as claimed in claim 1, further comprising:
transferring a first patterned to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Si-ARC layer etching procedure, or an Etch-Control Layer (ECL) etching procedure, or a second hard-mask layer etching procedure, or any combination thereof;

performing a TEOS Over-Etch (OE) etching procedure, wherein the TEOS OE etching procedure comprises;

establishing a first chamber pressure in the first etching chamber during the TEOS OE etching procedure, wherein the first chamber pressure ranges from approximately 35 mT to approximately 45 mT;

establishing a first edge temperature and a first center temperature for the first multi-zone temperature-controlled wafer holder for a first time during the during the TEOS OE etching procedure, the first center temperature being between approximately 25 degrees Celsius and approximately 35 degrees Celsius, the first edge temperature being between approximately 8 degrees Celsius and approximately 12 degrees Celsius, and wherein a low temperature chiller is coupled to the first multi-zone temperature-controlled wafer holder, the low temperature chiller operating between approximately −20 degrees Celsius and 10 degrees Celsius during the first time;

establishing a first edge backside pressure and a first center backside pressure using a dual backside gas system in the first multi-zone temperature-controlled wafer holder, the first center backside pressure being between approximately 15 Torr and 25 Torr, the first edge backside pressure being between approximately 27 Torr and 33 Torr;

providing a first process gas into the first etching chamber during the TEOS OE etching procedure, wherein the first process gas includes $CF_4$, $CHF_3$, and $O_2$, a first $CF_4$ flow rate varying between approximately 40 sccm and approximately 60 sccm, a first $CHF_3$ flow rate varying between approximately 40 sccm and approximately 60 sccm and a first $O_2$ flow rate varying between approximately 3 sccm and approximately 7 sccm, wherein a gas injection system is configured to provide the first process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 550 watts to approximately 650 watts and the second RF power ranging from approximately 50 watts to approximately 150 watts during the TEOS OE etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 90 watts to approximately 110 watts during the TEOS OE etching procedure.

13. The method as claimed in claim 12, further comprising:
creating a first simulation data subset for the first MLMS processing sequence using a first reduced MLMIMO model for the TEOS OE etching procedure, wherein the first reduced MLMIMO model includes a first reduced number ($N_{a1}$) of first Controlled Variables ($CV_{1a1}$, $CV_{2a1}$, ... $CV_{Na1}$), a first reduced number ($M_{a1}$) of first Manipulated Variables ($MV_{1a1}$, $MV_{2a1}$, ... $MV_{Ma1}$), and a first reduced number ($L_{a1}$) of the first Disturbance Variables ($DV_{1a1}$, $DV_{2a1}$, ... $DV_{La1}$), wherein ($L_{a1}$, $M_{a1}$, and $N_{a1}$) are integers greater than one;

obtaining evaluation data for the TEOS OE etching procedure;

determining risk data for the TEOS OE etching procedure using differences between the first simulation data subset and the evaluation data for the TEOS OE etching procedure;

identifying the TEOS OE etching procedure as a verified procedure when first risk data is less than a first risk limit; and identifying the TEOS OE etching procedure as a non-verified procedure when the first risk data is not less than the first risk limit.

14. The method as claimed in claim 1, further comprising:
transferring a first patterned to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Si-ARC layer etching procedure, or an Etch-Control Layer (ECL) etching procedure, or a second hard-mask layer etching procedure or an Over-Etch (OE) etching procedure, or any combination thereof;

transferring the first patterned to the first multi-zone temperature-controlled wafer holder in a first ashing chamber using the transfer subsystem coupled to the first ashing chamber;

performing an ashing procedure, wherein the ashing procedure comprises;

establishing a first chamber pressure in the first ashing chamber during the ashing procedure, wherein the first chamber pressure ranges from approximately 125 mT to approximately 175 mT;

establishing a first edge temperature and a first center temperature for the first multi-zone temperature-controlled wafer holder during the during the ashing procedure, the first center temperature being between approximately 70 degrees Celsius and approximately 80 degrees Celsius, the first edge temperature being between approximately 8 degrees Celsius and approximately 12 degrees Celsius, and wherein a low temperature chiller is coupled to the first multi-zone temperature-controlled wafer holder, the low temperature chiller operating between approximately −20 degrees Celsius and 10 degrees Celsius during the ashing procedure;

establishing a first edge backside pressure and a first center backside pressure using a dual backside gas system in the first multi-zone temperature-controlled wafer holder, the first center backside pressure being between approximately 15 Torr and 25 Torr, the first edge backside pressure being between approximately 27 Torr and 33 Torr;

providing a first process gas into the first ashing chamber during the ashing procedure, wherein the first process gas includes $O_2$, a first $O_2$ flow rate varying between approximately 430 sccm and approximately 470 sccm, wherein a gas injection system is configured to provide the first process gas to one or more areas of a processing region;

providing a first radio frequency (RF) power to a center region in the first ashing chamber and providing a second RF power to an edge region in the first ashing chamber using a first power splitter coupled to two upper electrodes in the first ashing chamber, wherein a first RF source is coupled to the first power splitter, the first RF source operating in a first frequency range from approximately 0.1 MHz. to approximately 200 MHz, the first RF power ranging from approximately 350 watts to approximately 450 watts and the second RF power ranging from approximately 10 watts to approximately 100 watts during the ashing procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 20 watts to approximately 30 watts during the ashing procedure.

15. The method as claimed in claim 14, further comprising:
creating a first simulation data subset for the first MLMS processing sequence using a first reduced MLMIMO model for the ashing procedure, wherein the first reduced MLMIMO model includes a first reduced number ($N_{a1}$) of first Controlled Variables ($CV_{1a1}$, $CV_{2a1}$, ... $CV_{Na1}$), a first reduced number ($M_{a1}$) of first Manipulated Variables ($MV_{1a1}$, $MV_{2a1}$, ... $MV_{Ma1}$), and a first reduced number ($L_{a1}$ of the first Disturbance Variables ($DV_{1a1}$, $DV_{2a1}$, ... $DV_{La1}$), wherein ($L_{a1}$, $M_{a1}$, and $N_{a1}$) are greater than one;

obtaining evaluation data for the ashing procedure;

determining risk data for the ashing procedure using differences between the first simulation data subset and the evaluation data for the ashing procedure;

identifying the ashing procedure as a verified procedure when first risk data is less than a first risk limit; and identifying the ashing procedure as a non-verified procedure when the first risk data is not less than the first risk limit.

16. The method as claimed in claim 1, further comprising:
performing a first Multi-Layer-Multi-Step MLMS processing sequence, wherein the second set of patterned wafers is created;

transferring a first one of the second set of patterned wafers to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Break-Through (BT) etching procedure, wherein the BT etching procedure comprises;

establishing a first chamber pressure in the first etching chamber during the BT etching procedure, wherein the first chamber pressure ranges from approximately 8 mT to approximately 12 mT;

establishing a first edge temperature and a first center temperature for the first multi-zone temperature-controlled wafer holder during the during the BT etching procedure, the first center temperature being between approximately 70 degrees Celsius and approximately 80 degrees Celsius, the first edge temperature being between approximately 8 degrees Celsius and approximately 12 degrees Celsius, and wherein a low temperature chiller is coupled to the first multi-zone temperature-controlled wafer holder, the low temperature chiller operating between approximately −20 degrees Celsius and 10 degrees Celsius during the BT etching procedure;

establishing a first edge backside pressure and a first center backside pressure using a dual backside gas system in the first multi-zone temperature-controlled wafer holder, the first center backside pressure being between approximately 8 Torr and 12 Torr, the first edge backside pressure being between approximately 8 Torr and 12 Torr;

providing a first process gas into the first etching chamber during the BT etching procedure, wherein the first process gas includes $CF_4$, a first $CF_4$ flow rate varying between approximately 120 sccm and approximately 150 sccm, wherein a gas injection system is configured to provide the first process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 600 watts to approximately 700 watts and the second RF power ranging from approximately 10 watts to approximately 100 watts during the BT etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 175 watts to approximately 200 watts during the BT etching procedure.

17. The method as claimed in claim 16, further comprising:

creating a second simulation data subset for the second MLMS processing sequence using a second reduced MLMIMO model for the BT etching procedure, wherein the second reduced MLMIMO model includes a second reduced number ($N_{b1}$) of first Controlled Variables ($CV_{1b1}$, $CV_{2b1}$, ... $CV_{Nb1}$), a second reduced number ($M_{b1}$) of second Manipulated Variables ($MV_{1b1}$, $MV_{2b1}$, ... $MV_{Mb1}$), and a second reduced number ($L_{b1}$) of second Disturbance Variables ($DV_{1b1}$, $DV_{2b1}$, ... $DV_{Lb1}$), wherein ($L_{b1}$, $M_{b1}$, and $N_{b1}$) are integers greater than one;

obtaining second evaluation data for the BT etching procedure;

determining second risk data for the BT etching procedure using differences between the second simulation data subset and the second evaluation data for the BT etching procedure;

identifying the BT etching procedure as a verified procedure when second risk data is less than a second risk limit; and identifying the BT etching procedure as a non-verified procedure when the second risk data is not less than the second risk limit.

18. The method as claimed in claim 1, further comprising:

performing a first Multi-Layer-Multi-Step MLMS processing sequence, wherein the second set of patterned wafers is created;

transferring a first one of the second set of patterned wafers to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Break-Through (BT) etching procedure;

performing a Main-Etch (ME) etching procedure, wherein the ME etching procedure comprises;

establishing a first chamber pressure in the first etching chamber during the ME etching procedure, wherein the first chamber pressure ranges from approximately 8 mT to approximately 12 mT;

establishing a first edge temperature and a first center temperature for the first multi-zone temperature-controlled wafer holder during the during the ME etching procedure, the first center temperature being between approximately 70 degrees Celsius and approximately 80 degrees Celsius, the first edge temperature being between approximately 8 degrees Celsius and approximately 12 degrees Celsius, and wherein a low temperature chiller is coupled to the first multi-zone temperature-controlled wafer holder, the low temperature chiller operating between approximately −20 degrees Celsius and 10 degrees Celsius during the ME etching procedure;

establishing a first edge backside pressure and a first center backside pressure using a dual backside gas system in the first multi-zone temperature-controlled wafer holder, the first center backside pressure being between approximately 8 Torr and 12 Torr, the first edge backside pressure being between approximately 8 Torr and 12 Torr;

providing a first process gas into the first etching chamber during the ME etching procedure, wherein the first process gas includes $CF_4$, a first $CF_4$ flow rate varying between approximately 120 sccm and approximately 150 sccm, wherein a gas injection system is configured to provide the first process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 120 watts to approximately 150 watts and the second RF power ranging from approximately 0 watts to approximately 100 watts during the ME etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 0 watts to approximately 10 watts during the ME etching procedure.

19. The method as claimed in claim 18, further comprising:

creating a second simulation data subset for the second MLMS processing sequence using a second reduced MLMIMO model for the ME etching procedure, wherein the second reduced MLMIMO model includes a second reduced number ($N_{b1}$) of first Controlled Variables ($CV_{1b1}$, $CV_{2b1}$, ... $CVN_{Nb1}$), a second reduced number ($M_{b1}$) of second Manipulated Variables ($MV_{1b1}$, $MV_{2b1}$, ... $MV_{Mb1}$), and a second reduced number ($L_{b1}$) of second Disturbance Variables ($DV_{1b1}$, $DV_{2b1}$, ... $DV_{Lb1}$), wherein ($L_{b1}$, $M_{b1}$, and $N_{b1}$) are integers greater than one;

obtaining second evaluation data for the ME etching procedure;

determining second risk data for the ME etching procedure using differences between the second simulation data subset and the second evaluation data for the ME etching procedure;

identifying the ME etching procedure as a verified procedure when second risk data is less than a second risk limit; and identifying the ME etching procedure as a non-verified procedure when the second risk data is not less than the second risk limit.

20. The method as claimed in claim 1, further comprising:

performing a first Multi-Layer-Multi-Step MLMS processing sequence, wherein the second set of patterned wafers is created;

transferring a first one of the second set of patterned wafers to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Break-Through (BT) etching procedure and/or a Main-Etch (ME) etching procedure;

performing an Over-Etch (OE) etching procedure, wherein the OE etching procedure comprises;

establishing a first chamber pressure in the first etching chamber during the OE etching procedure, wherein the first chamber pressure ranges from approximately 8 mT to approximately 12 mT;

establishing a first edge temperature and a first center temperature for the first multi-zone temperature-controlled wafer holder during the during the OE etching procedure, the first center temperature being between approximately 70 degrees Celsius and approximately 80 degrees Celsius, the first edge temperature being between approximately 8 degrees Celsius and approximately 12 degrees Celsius, and wherein a low temperature chiller is coupled to the first multi-zone temperature-controlled wafer holder, the low temperature chiller operating between approximately −20 degrees Celsius and 10 degrees Celsius during the OE etching procedure;

establishing a first edge backside pressure and a first center backside pressure using a dual backside gas system in the first multi-zone temperature-controlled wafer holder, the first center backside pressure being between approximately 8 Torr and 12 Torr, the first edge backside pressure being between approximately 8 Torr and 12 Torr;

providing a first process gas into the first etching chamber during the OE etching procedure, wherein the first process gas includes $O_2$ and HBr, a first $O_2$ flow rate varying between approximately 2 sccm and approximately 6 sccm, a first HBr flow rate varying between approximately 220 sccm and approximately 280 sccm, wherein a gas injection system is configured to provide the first process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 120 watts to approximately 150 watts and the second RF power ranging from approximately 0 watts to approximately 100 watts during the ME etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 20 watts to approximately 40 watts during the OE etching procedure.

21. The method as claimed in claim 20, further comprising:
creating a second simulation data subset for the second MLMS processing sequence using a second reduced MLMIMO model for the OE etching procedure, wherein the second reduced MLMIMO model includes a second reduced number ($N_{b1}$) of first Controlled Variables ($CV_{1b1}$, $CV_{2b1}$, ... $CV_{Nb1}$), a second reduced number ($M_{b1}$) of second Manipulated Variables ($MV_{1b1}$, $MV_{2b1}$, ... $MV_{Mb1}$), and a second reduced number ($L_{b1}$) of second Disturbance Variables ($DV_{1b1}$, $DV_{2b1}$, ... $DV_{Lb1}$), wherein ($L_{b1}$, $M_{b1}$, and $N_{b1}$) are integers greater than one;

obtaining second evaluation data for the OE etching procedure;

determining second risk data for the OE etching procedure using differences between the second simulation data subset and the second evaluation data for the OE etching procedure;

identifying the OE etching procedure as a verified procedure when second risk data is less than a second risk limit; and identifying the OE etching procedure as a non-verified procedure when the second risk data is not less than the second risk limit.

22. The method as claimed in claim 1, further comprising:
performing a first Multi-Layer-Multi-Step MLMS processing sequence, wherein the second set of patterned wafers is created;

transferring a first one of the second set of patterned wafers to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a Break-Through (BT) etching procedure, or a Main-Etch (ME) etching procedure, or an OE etching procedure, or any combination thereof;

performing a Titanium-Nitride (TiN) etching procedure, wherein the TiN etching procedure comprises;

establishing a first chamber pressure in the first etching chamber during the TiN etching procedure, wherein the first chamber pressure ranges from approximately 8 mT to approximately 12 mT;

establishing a first edge temperature and a first center temperature for the first multi-zone temperature-controlled wafer holder during the during the TiN etching procedure, the first center temperature being between approximately 70 degrees Celsius and approximately 80 degrees Celsius, the first edge temperature being between approximately 8 degrees Celsius and approximately 12 degrees Celsius, and wherein a low temperature chiller is coupled to the first multi-zone temperature-controlled wafer holder, the low temperature chiller operating between approximately −20 degrees Celsius and 10 degrees Celsius during the TiN etching procedure;

establishing a first edge backside pressure and a first center backside pressure using a dual backside gas system in the first multi-zone temperature-controlled wafer holder, the first center backside pressure being between approximately 8 Torr and 12 Torr, the first edge backside pressure being between approximately 8 Torr and 12 Torr;

providing a first process gas into the first etching chamber during the TiN etching procedure, wherein the first process gas includes $Cl_2$, a first $Cl_2$ flow rate varying between approximately 12 sccm and approximately 18 sccm, wherein a gas injection system is configured to provide the first process gas to one or more areas of a processing region;

providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 180 watts to approximately 220 watts and the second RF power ranging from approximately 0 watts to approximately 100 watts during the ME etching procedure; and providing a lower radio frequency (RF) power to a lower electrode in the first multi-zone temperature-controlled wafer holder using an RF generator and an impedance match network, the RF generator operating from approximately 0.1 MHz. to approximately 200 MHz, and the lower RF power ranging from approximately 40 watts to approximately 60 watts during the TiN etching procedure.

23. The method as claimed in claim 22, further comprising:

creating a second simulation data subset for the second MLMS processing sequence using a second reduced MLMIMO model for the TiN etching procedure, wherein the second reduced MLMIMO model includes a second reduced number ($N_{b1}$) of first Controlled Variables ($CV_{1b1}, CV_{2b1}, \ldots CV_{Nb1}$), a second reduced number ($M_{b1}$) of second Manipulated Variables ($MV_{1b1}, MV_{2b1}, \ldots MV_{Mb1}$), and a second reduced number ($L_{b1}$) of second Disturbance Variables ($DV_{1b1}, DV_{2b1}, \ldots DV_{Lb1}$), wherein ($L_{b1}, M_{b1},$ and $N_{b1}$) are integers greater than one;

obtaining second evaluation data for the TiN etching procedure;

determining second risk data for the TiN etching procedure using differences between the second simulation data subset and the second evaluation data for the TiN etching procedure;

identifying the TiN etching procedure as a verified procedure when second risk data is less than a second risk limit; and identifying the TiN etching procedure as a non-verified procedure when the second risk data is not less than the second risk limit.

24. The method as claimed in claim 1, further comprising:

performing a first Multi-Layer-Multi-Step MLMS processing sequence, wherein the second set of patterned wafers is created;

performing a Break-Through (BT) etching procedure, or a Main-Etch (ME) etching procedure, or an OE etching procedure, or a Titanium-Nitride (TiN) etching procedure, or any combination thereof;

transferring at least one of the second set of patterned wafers to a first multi-zone temperature-controlled wafer holder in a first etching chamber using a transfer subsystem coupled to the first etching chamber, wherein the transfer subsystem is configured to prevent an oxide layer from forming on the first patterned during the transferring;

performing a High-K (HK) etching procedure, wherein the HK etching procedure comprises;

establishing a first chamber pressure in the first etching chamber during the HK etching procedure, wherein the first chamber pressure ranges from approximately 8 mT to approximately 12 mT;

establishing a first temperature for the first multi-zone temperature-controlled wafer holder during the during the HK etching procedure, the first temperature being between approximately 350 degrees Celsius and approximately 390 degrees Celsius;

providing a first process gas into the first etching chamber during the HK etching procedure, wherein the first process gas includes $BCl_3$, a first $BCl_3$ flow rate varying between approximately 130 sccm and approximately 180 sccm, wherein a gas injection system is configured to provide the first process gas to one or more areas of a processing region; and providing a first radio frequency (RF) power to a center region in the first etching chamber and providing a second RF power to an edge region in the first etching chamber using a first power splitter coupled to two upper electrodes in the first etching chamber, wherein a first RF source is coupled to the first power splitter, the first RF source operating in a first frequency range from approximately 0.1 MHz. to approximately 200 MHz, the first RF power ranging from approximately 550 watts to approximately 650 watts and the second RF power ranging from approximately 0 watts to approximately 100 watts during the HK etching procedure.

25. The method as claimed in claim 24, further comprising:

creating a second simulation data subset for the second MLMS processing sequence using a second reduced MLMIMO model for the HK etching procedure, wherein the second reduced MLMIMO model includes a second reduced number ($N_{b1}$) of first Controlled Variables ($CV_{1b1}, CV_{2b1}, \ldots CV_{Nb1}$), a second reduced number ($M_{b1}$) of second Manipulated Variables ($MV_{1b1}, MV_{2b1}, \ldots MV_{Mb1}$), and a second reduced number ($L_{b1}$) of second Disturbance Variables ($DV_{1b1}, DV_{2b1}, \ldots DV_{Lb1}$), wherein ($L_{b1}, M_{b1},$ and $N_{b1}$) are integers greater than one;

obtaining second evaluation data for the HK etching procedure;

determining second risk data for the HK etching procedure using differences between the second simulation data subset and the second evaluation data for the HK etching procedure;

identifying the HK etching procedure as a verified procedure when second risk data is less than a second risk limit; and identifying the HK etching procedure as a non-verified procedure when the second risk data is not less than the second risk limit.

26. The method as claimed in claim 1, wherein the metal-gate structures, include pFET structures, nFET structures, Tri-gate structures, and FinFET structures.

27. A method for using a Multi-Layer/Multi-Input/Multi-Output (MLMIMO) model to create metal-gate structures on a plurality of wafers, the method comprising:

a) receiving a first set of send-ahead wafers and associated wafer data, the wafer data including real-time and historical data;

b) establishing a first number (la) of disturbance variables DV(La) for a first multi-layer etch sequence and a second number (lb) of disturbance variables DV(Lb) for a second multi-layer etch sequence using real-time integrated metrology (IM) data associated with a patterned photoresist layer on one or more of the send-ahead wafers, wherein the real-time IM data includes critical dimension (CD) data, sidewall angle (SWA) data, thickness data, photoresist data, BARC data, the wafer data, and diffraction signal data from multiple sites in the patterned photoresist layer on each incoming wafer, wherein (La) and (Lb) are integers greater than two;

c) establishing a first number (Ma) of manipulated variables MV(Ma) for the first multi-layer etch sequence and a second number (Mb) of manipulated variables MV(Mb) for a second multi-layer etch sequence, wherein (Ma) and (Mb) are integers greater than two;

d) establishing a first number (Na) of controlled variables for the first multi-layer etch sequence and a second number (Nb) of controlled variables for the second multi-layer etch sequence, wherein (Na) and (Nb) are integer greater than two, wherein CV(Na) is defined as $$CV(Na) = f_{Na}\{MV(1a) \ldots MV(Ma\text{-}1), MV(Ma), DV(1), \ldots DV(La\text{-}1), DV(La)\} + OFFSETS_{Na}$$

and CV(Nb) is defined as $$CV(Nb) = f_{Nb}\{MV(1b) \ldots MV(Mb\text{-}1), MV(Mb), DV(1), \ldots DV(Lb\text{-}1), DV(Lb)\} + OFFSETS_{Nb}$$

e) calculating optimized process settings using a first quadratic objective function, wherein first target deviations t(Na) for the first multi-layer etch sequence are defined as:

$$t(Na) = \{DV(Na) - \text{target } CV(Na)\};$$

f) calculating optimized process settings using a second quadratic objective function, wherein second target deviations t(Nb) for the second multi-layer etch sequence are defined as:

$$t(Nb) = \{DV(Nb) - \text{target } CV(Nb)\};$$

g) defining adjusted process recipes for the first multi-layer etch sequence and/or the second multi-layer etch sequence using one or more calculated manipulated variables established during nonlinear programming;

h) processing one or more of the first set of send-ahead wafers using the adjusted process recipes;

i) obtaining additional measurement data for one or more of the send-ahead wafers, wherein new controlled variable data are obtained and filtered;

j) calculating one or more process errors using differences between the new controlled variable data and predicted controlled variable data;

k) calculating feedback data items, wherein errors are used to update the $OFFSETS_{Na}$ for the first multi-layer etch sequence and/or the $OFFSETS_{Nb}$ for the second multi-layer etch sequence using an exponentially weighted moving average (EWMA) filter;

l) updating the $OFFSETS_{Na}$ for the first multi-layer etch sequence and/or the $OFFSETS_{Nb}$ for the second multi-layer etch sequence in an optimizer unit; and m) repeating steps a)-l) using each wafer in the first set of send-ahead wafers.

28. The method as claimed in claim 27, wherein first manipulated variables are calculated for the first multi-layer etch sequence by performing nonlinear programming using the first quadratic objective function defined as, $$\min_{\substack{MV(1a), MV(2a), \\ MV(Ma-1), MV(Ma)}} \left\{ \left(\frac{t(1a) - }{\frac{CV(1a)}{t(1a)}}\right)^2 w_{1a} + \left(\frac{t(2a) - }{\frac{CV(2a)}{t(2a)}}\right)^2 w_{2a} \ldots + \left(\frac{t(Ma-1) - }{\frac{CV(Ma-1)}{t(Ma-1)}}\right)^2 w_{ja-1} + \left(\frac{t(Ma) - }{\frac{CV(Ma)}{t(Ma)}}\right)^2 w_{ja} \right\}$$

wherein the $w_{ja}$ are weighting factors, and the manipulated variables MV(Ma) have upper and lower threshold values defined as inequality constraints:

lower_threshold_value(Ma) $\leq$ MV(Ma) $\leq$ upper_threshold_value(Ma)

and the lower_threshold_value(Ma) and the upper_threshold_value(Ma) are determined using a plurality of equipment constraints.

29. The method as claimed in claim 28, wherein second manipulated variables are calculated for the second multi-layer etch sequence by performing nonlinear programming using the second quadratic objective function defined as, $$\min_{\substack{MV(1a), MV(2a), \\ MV(Mb-1), MV(Mb)}} \left\{ \left(\frac{t(1b) - }{\frac{CV(1b)}{t(1b)}}\right)^2 w_{1b} + \left(\frac{t(2b) - }{\frac{CV(2b)}{t(2b)}}\right)^2 w_{2b} \ldots + \left(\frac{t(Mb-1) - }{\frac{CV(Mb-1)}{t(Mb-1)}}\right)^2 w_{jb-1} + \left(\frac{t(Mb) - }{\frac{CV(Mb)}{t(Mb)}}\right)^2 w_{jb} \right\}$$

wherein the $w_{ja}$ are the weighting factors, and the manipulated variables MV(ma) have the upper and lower threshold values defined as inequality constraints:

lower_threshold_value(Mb) $\leq$ MV(Mb) $\leq$ upper_threshold_value(Mb)

and the lower_threshold_value(Mb) and the upper_threshold_value(Mb) are determined using the plurality of equipment constraints.

30. The method as claimed in claim 29, wherein the weighting factors $w_{ja}$, $w_{jb}$ are dynamically updated based on one or more feedback errors.

31. The method as claimed in claim 29, wherein one or more controlled variable targets are prioritized when one or more manipulated variables are outside an allowable process window.

32. The method as claimed in claim 29, wherein the adjusted process recipes are defined using process state data and/or chamber state data.

* * * * *